US009860465B2

(12) United States Patent
Ohmaru

(10) Patent No.: US 9,860,465 B2
(45) Date of Patent: Jan. 2, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventor: Takuro Ohmaru, Fukuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/183,885

(22) Filed: Jun. 16, 2016

(65) Prior Publication Data

US 2016/0381266 A1 Dec. 29, 2016

(30) Foreign Application Priority Data

Jun. 23, 2015 (JP) ................................. 2015-125807
May 20, 2016 (JP) ................................. 2016-101319

(51) Int. Cl.
*H04N 5/335* (2011.01)
*H04N 5/369* (2011.01)
(Continued)

(52) U.S. Cl.
CPC ............. *H04N 5/3698* (2013.01); *G06T 7/13* (2017.01); *H01L 27/14605* (2013.01);
(Continued)

(58) Field of Classification Search
CPC ............. H04N 5/3698; H04N 5/23245; H04N 5/3696; H04N 5/374; H04N 5/378; G06T 7/13; H01L 27/14605
(Continued)

(56) References Cited

U.S. PATENT DOCUMENTS 5,705,807 A 1/1998 Throngnumchai
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Usman Khan
(74) *Attorney, Agent, or Firm* — Fish & Richardson P.C.

(57) ABSTRACT

Provided is an imaging device operated at high speed and low power consumption. The imaging device includes a pixel and a first circuit. The pixel includes a first photoelectric conversion element and a second photoelectric conversion element. The first circuit is configured to compare a first signal which is output from the pixel on the basis of imaging data obtained by the first photosensitive conversion element to a second signal which is output from the pixel on the basis of imaging data obtained by the second photosensitive conversion element for determining whether there is a difference between the first signal and the second signal. Thus, edge detection can be performed without a periphery device for edge detection outside the imaging device.

14 Claims, 53 Drawing Sheets

(51) Int. Cl.
    H01L 29/786    (2006.01)
    H01L 27/146    (2006.01)
    H04N 5/374     (2011.01)
    H04N 5/378     (2011.01)
    H04N 5/232     (2006.01)
    G06T 7/13      (2017.01)

(52) U.S. Cl.
    CPC .. *H01L 27/14607* (2013.01); *H01L 27/14612* (2013.01); *H01L 27/14689* (2013.01); *H01L 29/7869* (2013.01); *H04N 5/23245* (2013.01); *H04N 5/3696* (2013.01); *H04N 5/374* (2013.01); *H04N 5/378* (2013.01)

(58) Field of Classification Search
    USPC ......................................................... 348/308
    See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,617,602 B2 | 9/2003 | Kodama et al. |
| 6,727,522 B1 | 4/2004 | Kawasaki et al. |
| 7,046,282 B1 | 5/2006 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,378,391 B2 | 2/2013 | Koyama et al. |
| 8,836,626 B2 | 9/2014 | Ikeda |
| 8,916,869 B2 | 12/2014 | Koyama et al. |
| 9,331,112 B2 | 5/2016 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0039543 A1* | 2/2010 | Muroshima .......... H04N 5/3598 348/300 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0222584 A1 | 8/2013 | Aoki et al. |
| 2015/0332568 A1 | 11/2015 | Kurokawa |
| 2016/0037106 A1 | 2/2016 | Ohmaru |
| 2016/0233252 A1 | 8/2016 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-317916 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2011-119711 A | 6/2011 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. ( Applied Physics Letters ) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. ( Japanese Journal of Applied Physics ) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. ( Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. ( Applied Physics Letters ) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. ( Applied Physics Letters ) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. ( Applied Physics Letters ) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 31A1
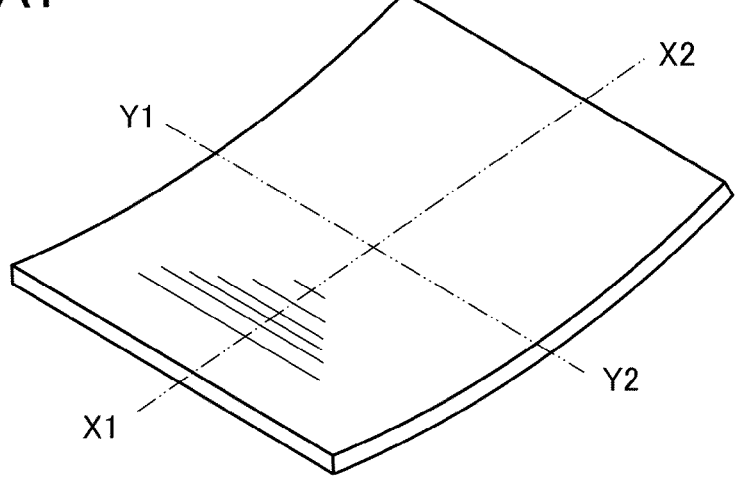
FIG. 31A2
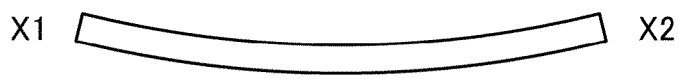
FIG. 31A3
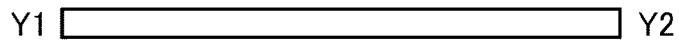
FIG. 31B1
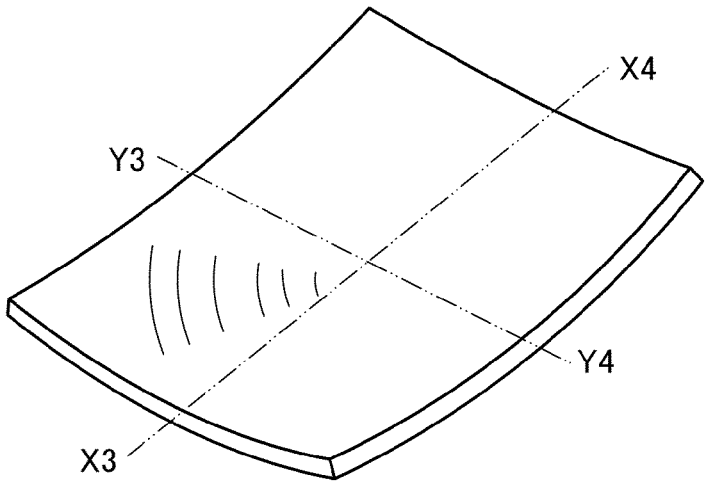
FIG. 31B2
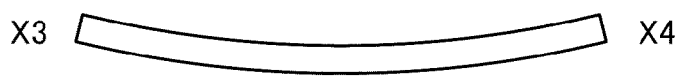
FIG. 31B3

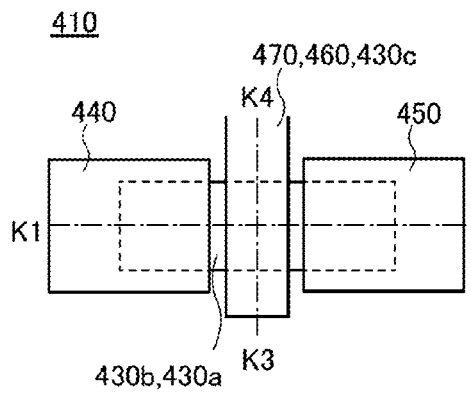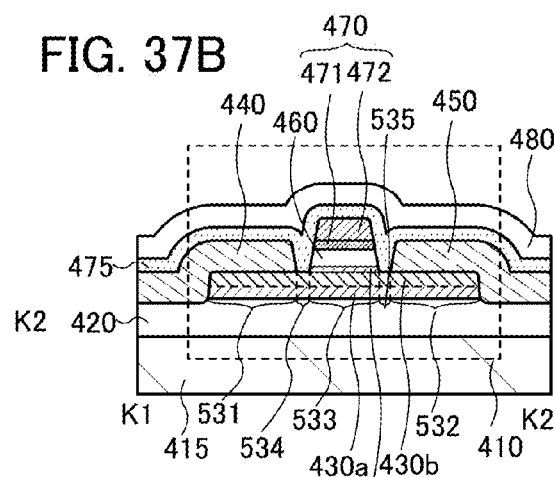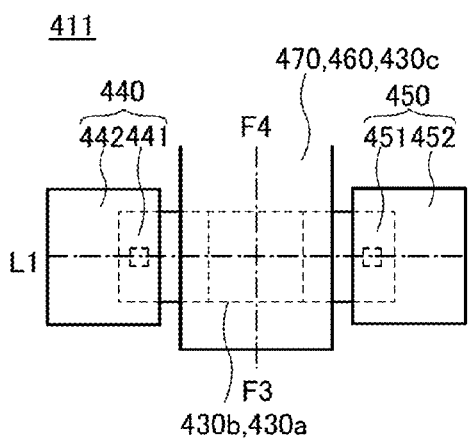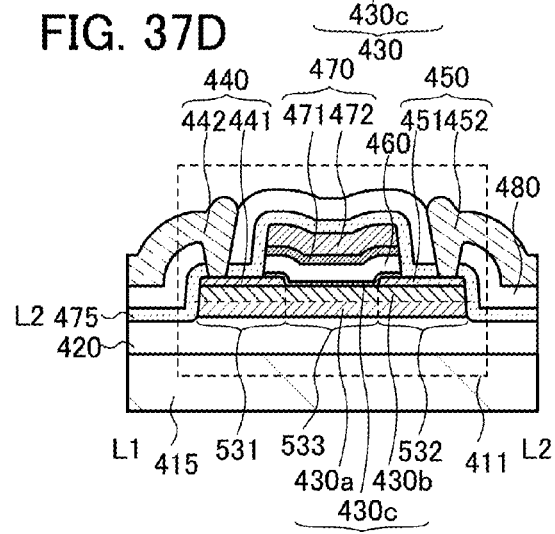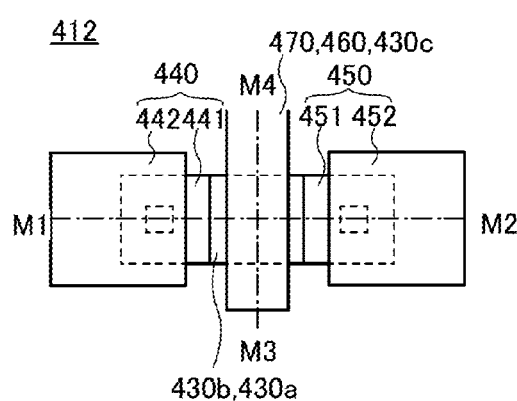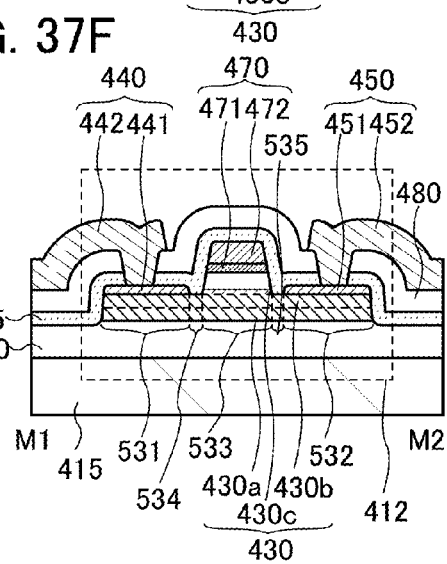

B1  415  473  401  B2

C1  415  473  402  C2

D1  415  473  403  D2

E1  415  473  404  E2

F1  415  473  405  F2

G1  415  473  406  G2

H1 407 415 430a 430b 473 H2
430c
430

I1 408 415 430a 430b 473 I2
430c
430

J1 409 415 430a 430b 473 J2
430c
430

K1 410 415 430a 430b 473 K2
430c
430

L1 411 415 430a 430b 473 L2
430c
430

M1 412 415 430a 430b 473 M2
430c
430

FIG. 41A
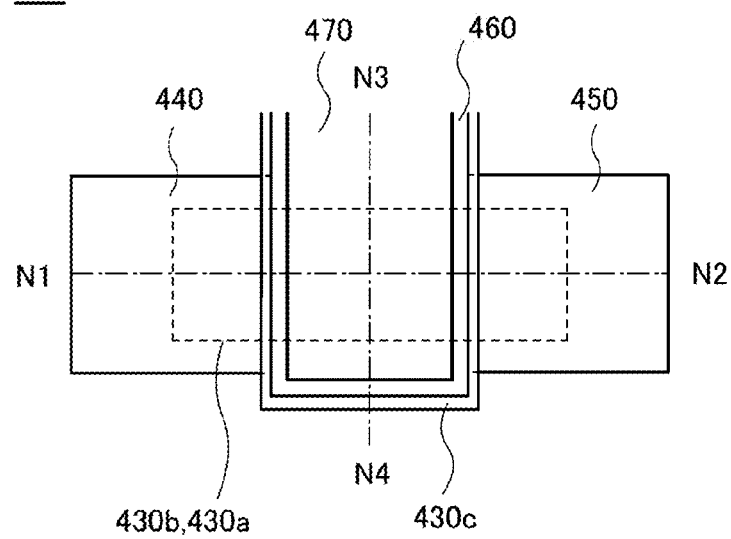
FIG. 41B
FIG. 41C
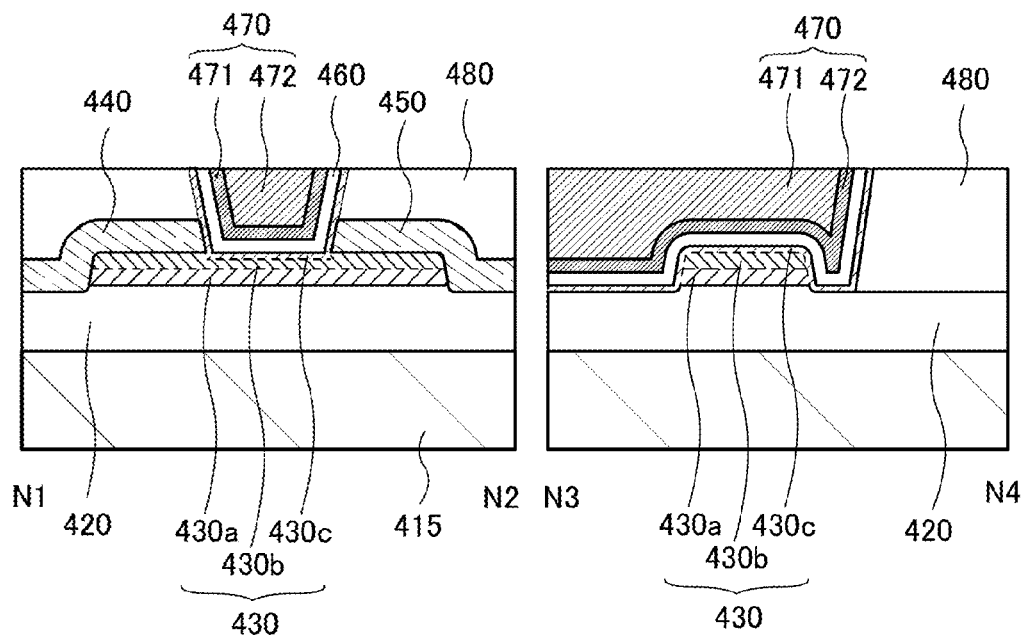

IMAGING DEVICE AND ELECTRONIC DEVICE

BACKGROUND OF THE INVENTION

1. Field of the Invention

One embodiment of the present invention relates to an imaging device and an electronic device.

Note that one embodiment of the present invention should not limited to the technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

An imaging device having an edge detecting function of detecting the outline or the like of an object so that the position of the object can be detected has been disclosed (e.g., Patent Document 1). The edge means a portion of a captured image with a sharp illuminance change.

An imaging device in which an In—Ga—Zn-based oxide semiconductor is included in a transistor of a pixel circuit has been disclosed (e.g., Patent Document 2).

REFERENCE

Patent Document

[Patent Document 1] Japanese Published Patent Application No. 2011-317916
[Patent Document 2] Japanese Published Patent Application No. 2011-119711

SUMMARY OF THE INVENTION

An electronic device including an imaging device is used for a visual authentication system, such as a monitoring device or a robot. The imaging device in the visual authentication system requires a high-speed operation because an operation is determined after the authentication; for example, a high-speed operation of edge detection is required.

An object of one embodiment of the present invention is to provide an imaging device or the like having a novel structure performing edge detection at high speed. Another object of one embodiment of the present invention is to provide an imaging device or the like having a novel structure in which power consumed by the edge detection is reduced. Another object of one embodiment of the present invention is to provide an imaging device or the like having a novel structure with low manufacturing cost. Another object of one embodiment of the present invention is to provide an imaging device or the like having a novel structure capable of capturing imaging data with high imaging sensitivity.

Another object of one embodiment of the present invention is to provide a novel imaging device, a novel electronic device, or the like.

Note that the objects of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is an imaging device including a pixel and a first circuit. The pixel includes a first photoelectric conversion element, a second photoelectric conversion element, a first transistor, a second transistor, a third transistor, a fourth transistor, a fifth transistor, a sixth transistor, and a first capacitor. One terminal of the first photoelectric conversion element is electrically connected to one of a source and a drain of the first transistor. One terminal of the second photoelectric conversion element is electrically connected to one of a source and a drain of the second transistor. The other of the source and the drain of the first transistor is electrically connected to the other of the source and the drain of the second transistor. The other of the source and the drain of the second transistor is electrically connected to one of a source and a drain of the third transistor. The one of the source and the drain of the third transistor is electrically connected to the one terminal of the first capacitor. The other terminal of the first capacitor is electrically connected to one of a source and a drain of the fourth transistor. The one of the source and the drain of the fourth transistor is electrically connected to a gate of the fifth transistor. One of a source and a drain of the fifth transistor is electrically connected to one of a source and a drain of the sixth transistor. The first circuit is configured to compare a first signal which is output from the pixel on the basis of imaging data obtained by the first photoelectric conversion element to a second signal which is output from the pixel on the basis of imaging data obtained by the second photoelectric conversion element for determining whether there is a difference between the first signal and the second signal.

The pixel may include a second capacitor. One terminal of the second capacitor may be electrically connected to one of the source and the drain of the fourth transistor.

Each of the first to fourth transistors may include an oxide semiconductor in an active layer. The oxide semiconductor may include In, Zn, and M (M is Al, Ti, Ga, Sn, Y, Zr, La, Ce, Nd, or Hf).

Each of the first photoelectric conversion element and the second photoelectric conversion element may include a material containing selenium.

The first circuit may include a first comparator and a second comparator. A first potential corresponding to the difference may be applied to one input terminal of the first comparator. A second potential which is a reference potential may be applied to the other input terminal of the first comparator. If the first potential is higher than the second potential, a high potential may be output from an output terminal of the first comparator. The first potential may be applied to one input terminal of the second comparator. A third potential which is a reference potential may be applied to the other input terminal of the second comparator. If the first potential is lower than the third potential, a high potential may be output from the output terminal of the second comparator. The first circuit may be configured to determine that there is a difference when at least one of the first comparator and the second comparator outputs a high potential.

One embodiment of the present invention includes an electronic device including an imaging device of one embodiment of the present invention.

One embodiment of the present invention provides an imaging device or the like having a novel structure performing edge detection at high speed. Another object of one embodiment of the present invention provides an imaging device or the like having a novel structure in which power consumed by the edge detection is reduced. Another object of one embodiment of the present invention provides an imaging device or the like having a novel structure with low manufacturing cost. Another object of one embodiment of the present invention provides an imaging device or the like having a novel structure capable of capturing imaging data with high imaging sensitivity.

One embodiment of the present invention provides a novel imaging device, a novel electronic device, or the like.

Note that the effects of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIGS. 31A1 to 31B3 illustrate bent imaging devices.
FIGS. 37A to 37F are top views and cross-sectional views illustrating transistors.
FIGS. 41A to 41C are a top view and cross-sectional views illustrating a transistor.

DETAILED DESCRIPTION OF THE INVENTION

Figure 1:
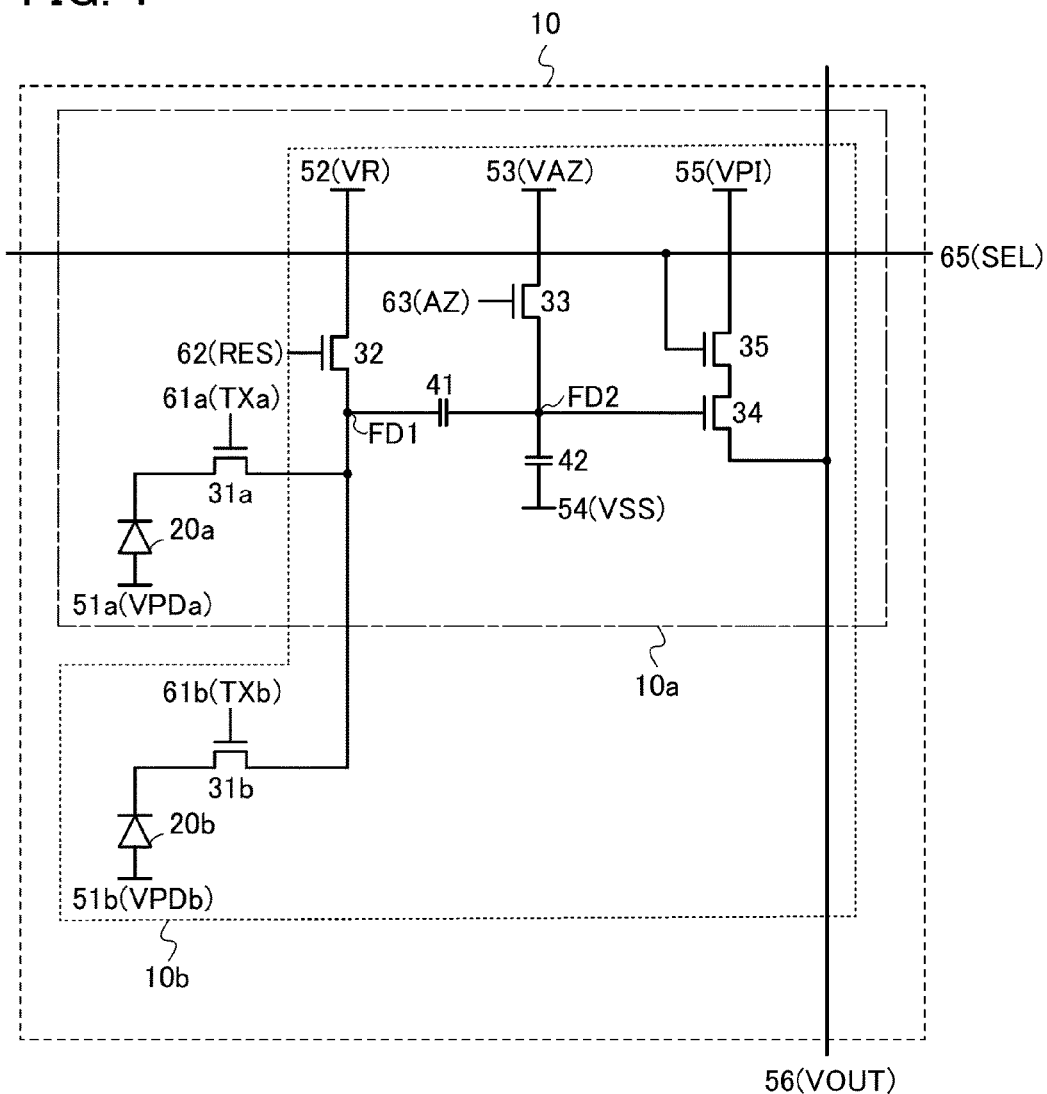
FIG. 1 illustrates a pixel circuit of an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Since the source and the drain of the transistor change depending on the structure, operating conditions, and the like of the transistor, it is difficult to define which is a source or a drain. Thus, the terms "source" and "drain" can be interchanged with each other depending on the case of circumstances.

In this specification, ordinal numbers such as "first," "second," and "third" are used to avoid confusion among components, and thus do not limit the number of the components.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive layer, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal outputted from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring functions as an electrode, one conductive layer functions as the wiring and the electrode. Thus, "electrical connection" in this specification includes in its category such a case where one conductive layer has functions of a plurality of components.

Note that in this specification, terms for explaining arrangement, such as "over" and "under," are used for convenience to describe the positional relationship between components with reference to drawings. The positional relationship between components is changed as appropriate in accordance with a direction in which each component is described. Thus, there is no limitation on terms used in this specification, and description can be made appropriately depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Note that the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Embodiment 1

An imaging device of one embodiment of the present invention is described with reference to drawings.

In this specification and the like, an imaging device refers to any device that has a function of imaging. The imaging device also indicates a circuit having a function of imaging or an entire system including such a circuit.

FIG. 1 is a circuit diagram illustrating a pixel 10a and a pixel 10b of the imaging device, which is one embodiment of the present invention. Note that the pixel 10a and the pixel 10b can be interchanged with each other depending on circumstances or conditions.

The pixel 10a includes a photoelectric conversion element 20a and a transistor 31a. The pixel 10b includes a photoelectric conversion element 20b and a transistor 31b. In addition, the pixel 10a and the pixel 10b include a transistor 32, a transistor 33, a transistor 34, a transistor 35, a capacitor 41, and a capacitor 42. Note that the transistor 31a, the transistor 31b, and the transistors 32 to 35 in FIG. 1 are all n-channel transistors.

In the structure of FIG. 1, the pixel 10a and the pixel 10b can be collectively referred to as a pixel 10.

In the pixel 10a and the pixel 10b in FIG. 1, one terminal of the photoelectric conversion element 20a is electrically connected to one of a source and a drain of the transistor 31a. One terminal of the photoelectric conversion element 20b is electrically connected to one of a source and a drain of the transistor 31b. The other of the source and the drain of the transistor 31a is electrically connected to the other of the source and the drain of the transistor 31b, one of a source and a drain of the transistor 32, and one terminal of the capacitor 41. One of a source and a drain of the transistor 33 is electrically connected to a gate of the transistor 34, the other terminal of the capacitor 41, and one terminal of the capacitor 42. One of a source and a drain of the transistor 34 is electrically connected to one of a source and a drain of the transistor 35.

The other terminal of the photoelectric conversion element 20a is electrically connected to a wiring 51a (VPDa). The other terminal of the photoelectric conversion element 20b is electrically connected to a wiring 51b (VPDb). The other of the source and the drain of the transistor 32 is electrically connected to a wiring 52 (VR). The other of the source and the drain of the transistor 33 is electrically connected to a wiring 53 (VAZ). The other terminal of the capacitor 42 is electrically connected to a wiring 54 (VSS). The other terminal of the transistor 35 is electrically connected to a wiring 55 (VPI). The other of the source and the drain of the transistor 34 is electrically connected to a wiring 56 (VOUT).

A gate of the transistor 31a is electrically connected to a wiring 61a (TXa). A gate of the transistor 31b is electrically connected to a wiring 61b (TXb). A gate electrode of the transistor 32 is electrically connected to a wiring 62 (RES). A gate electrode of the transistor 33 is electrically connected to a wiring 63 (AZ). A gate electrode of the transistor 35 is electrically connected to a wiring 65 (SEL).

The wiring 51a (VPDa), the wiring 51b (VPDb), the wiring 52 (VR), the wiring 53 (VAZ), the wiring 54 (VSS), and the wiring 55 (VPI) can serve as power source lines. In contrast, the wiring 61a (TXa), the wiring 61b (TXb), the wiring 62 (RES), the wiring 63 (AZ), the wiring 65 (SEL) can serve as signal lines. Note that the wiring 51a (VPDa) and the wiring 51b (VPDb), which are separate wirings, may be combined as one wiring.

In the above-described structure, a node to which the other of the source and the drain of the transistor 31a, the other of the source and the drain of the transistor 31b, the one of the source and the drain of the transistor 32, and the one terminal of the capacitor 41 are connected is FD1. A node to which the one of the source and the drain of the transistor 33, the gate of the transistor 34, the other terminal of the capacitor 41, and the one terminal of the capacitor 42 are connected is FD2.

The photoelectric conversion element 20a and the photoelectric conversion element 20b in the pixel 10 are light-receiving elements. The photoelectric conversion element 20a is configured to generate current corresponding to the amount of light that enters the pixel 10a. The photoelectric conversion element 20b is configured to generate current corresponding to the amount of light that enters the pixel 10b. The transistor 31a is configured to control accumulation of charge into the node FD1 and release of charge from the node FD1 by the photoelectric conversion element 20a. The transistor 31b is configured to control accumulation of charge into the node FD1 and release of charge from the node FD1 by the photoelectric conversion element 20b. The transistor 32 is configured to reset the potential of the node FD1. The transistor 33 is configured to reset the potential of the node FD2. The transistor 34 serves as an amplifying transistor configured to output a signal corresponding to the potential of the node FD2. The transistor 35 serves as a selection transistor configured to control selection of the pixel 10 in reading. Imaging data captured by the pixel 10 is output as a signal through the wiring 56 (VOUT).

The imaging device of one embodiment of the present invention is configured to be driven in a normal imaging mode or a difference detection mode. The normal imaging mode is a mode for outputting imaging data captured by the pixel 10 to the outside. For example, in the pixel 10 shown in FIG. 1, imaging data captured by the pixel 10a and imaging data captured by the pixel 10b are output to the outside.

The difference detection mode is a mode for comparing imaging data captured by the pixels in the pixel 10 to perform difference determination and outputting the result of the determination of the presence or absence of a difference. For example, a signal output from the pixel 10a is compared with a signal output from the pixel 10b, thereby determining whether there is a difference between imaging data captured by the pixel 10a and imaging data captured by the pixel 10b.

Conditions of switching from the normal imaging mode to the difference determination mode or from the difference determination mode to the normal imaging mode can be established as appropriate. Examples of the switching conditions include a predetermined time lapse or input of a signal for switching the modes. The mode may be switched to the normal imaging mode by detection of the presence of a difference or by detection of the absence of a difference in the difference detection mode.

Details of the operation of the pixel 10a and the pixel 10b in the normal imaging mode will be described using a timing chart of FIG. 2. In the timing chart in FIG. 2, the potentials of the wiring 61a (TXa), the wiring 61b (TXb), the wiring 62 (RES), the wiring 63 (AZ), the wiring 65 (SEL), the node FD1, and the node FD2 are illustrated.

The potentials of the wirings are as follows: the wirings 51a (VPDa) and 51b (VPDb), L level; the wirings 52 (VR) and 53 (VAZ), H level; the wiring 54 (VSS), L level; and the wiring 55 (VPI), H level. Note that the pixels can be operated by application of other potentials to the wirings.

Here, the H level and L level refer to a high potential and a low potential, respectively. The L level can be a ground potential, for example.

Figure 2:
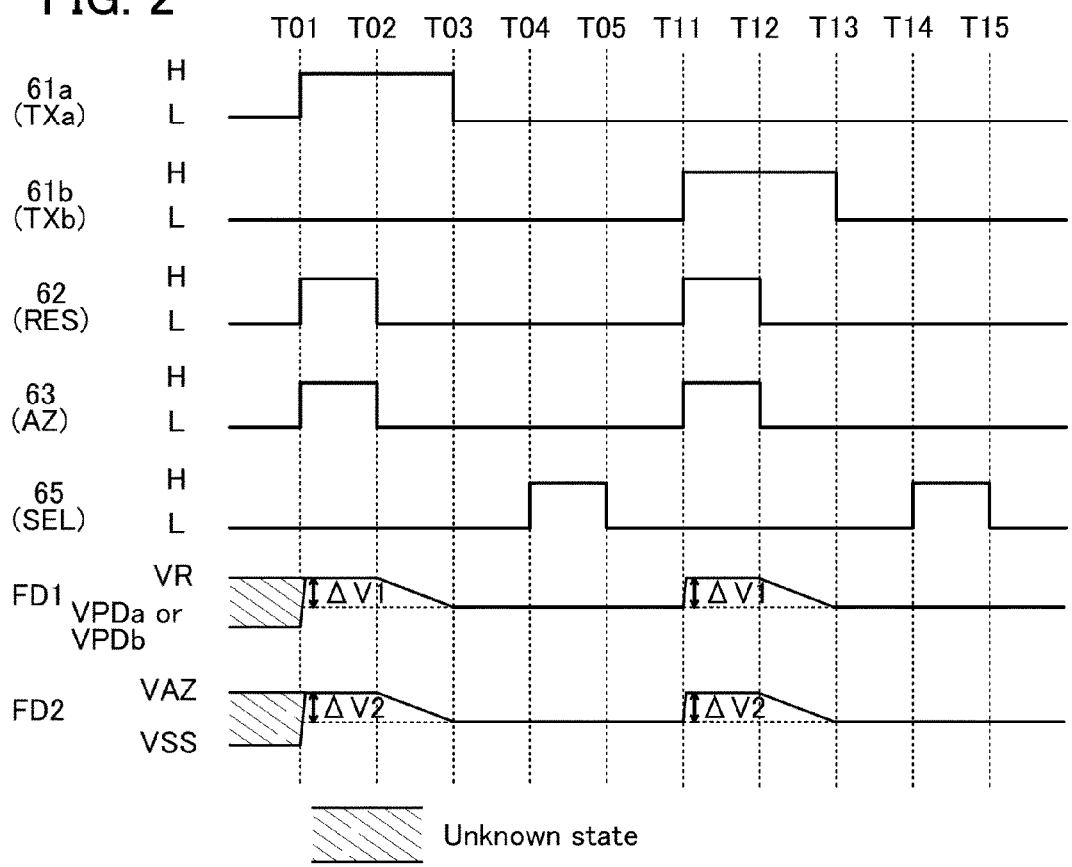
FIG. 2 is a timing chart illustrating imaging operation.

According to the timing chart of FIG. 2, Time T01 to T05 are for capturing imaging data by the pixel 10a and reading the imaging data, and Time T11 to T15 are for capturing imaging data by the pixel 10b and reading the imaging data.

At Time T01, the potentials of the wirings 61a (TXa), 62 (RES), and 63 (AZ) are set at H level, thereby turning the transistors 31a, 32, and 33 on. In addition, the potentials of the wirings 61b (TXb) and 65 (SEL) are set at L level, thereby turning the transistors 31b and 35 off. Accordingly, the potentials of the nodes FD1 and FD2 respectively become equal to those of the wirings 52 (VR) and 53 (VAZ), that is, VR and VAZ.

At Time T02, the potentials of the wirings 62 (RES) and 63 (AZ) are set at L level, thereby turning the transistors 32 and 33 off, and decreasing the potential of the node FD1.

The potential of the node FD1 is expressed as VR−$\Delta$V1 where $\Delta$V1 denotes the decrease in the potential of the node FD1. The potential of the node FD2 also decreases owing to capacitive coupling between the capacitor 41 (capacitance value C1) and the combined capacitance of the capacitor 42 (capacitance value C2) and the gate capacitance of the transistor 34 (capacitance value Cg). When a potential decrease at the node FD2 is represented by $\Delta$V2, $\Delta V2 = \Delta V1 \cdot C1/(C1+C2+Cg) = \Delta V1 \cdot \alpha$, and the potential of the node FD2 is VAZ−$\Delta$V2. Note that $\alpha = C1/(C1+C2+Cg)$.

To make $\Delta$V1 and $\Delta$V2 equal as much as possible, the capacitance of the capacitor 41 is preferably larger than the sum of the capacitance of the capacitor 42 and the gate capacitance of the transistor 34.

As the illuminance of light delivered to the photoelectric conversion element 20a is higher, the amount of decrease in the potential of the node FD1 is larger, and accordingly, the amount of decrease in the potential of the node FD2 is larger.

At Time T03, the potential of the wiring 61a (TXa) is set at L level, thereby turning the transistor 31a off, so that the potentials of the nodes FD1 and FD2 are held. The operation of the pixel 10a for capturing imaging data is as described above.

At Time T04, the potential of the wiring 65 (SEL) is set at H level, thereby turning the transistor 35 on. Accordingly, a signal corresponding to imaging data is output to the wiring 56 (VOUT) in accordance with the potential of the node FD2. Note that the lower the potential of the node FD2 is, the lower the potential of the wiring 56 (VOUT) becomes. In other words, the higher the luminance of light delivered to the photoelectric conversion element 20a is, the lower the potential of the signal output from the wiring 56 (VOUT) becomes.

At Time T05, the potential of the wiring 65 (SEL) is set at L level, thereby turning the transistor 35 off. The operation of reading imaging data is as described above.

The operation from Time T11 to Time T15 is the same as that from Time T01 to Time T05 except that the potential of the wiring 61b (TXb) is set at H level at Time T11 to turn the transistor 31b on, and the potential of the wiring 61b (TXb) is set at L level at Time T13 to turn the transistor 31b off. Note that the potential of the wiring 61a (TXa) from Time T11 to Time T15 is set at L level.

Figure 3:
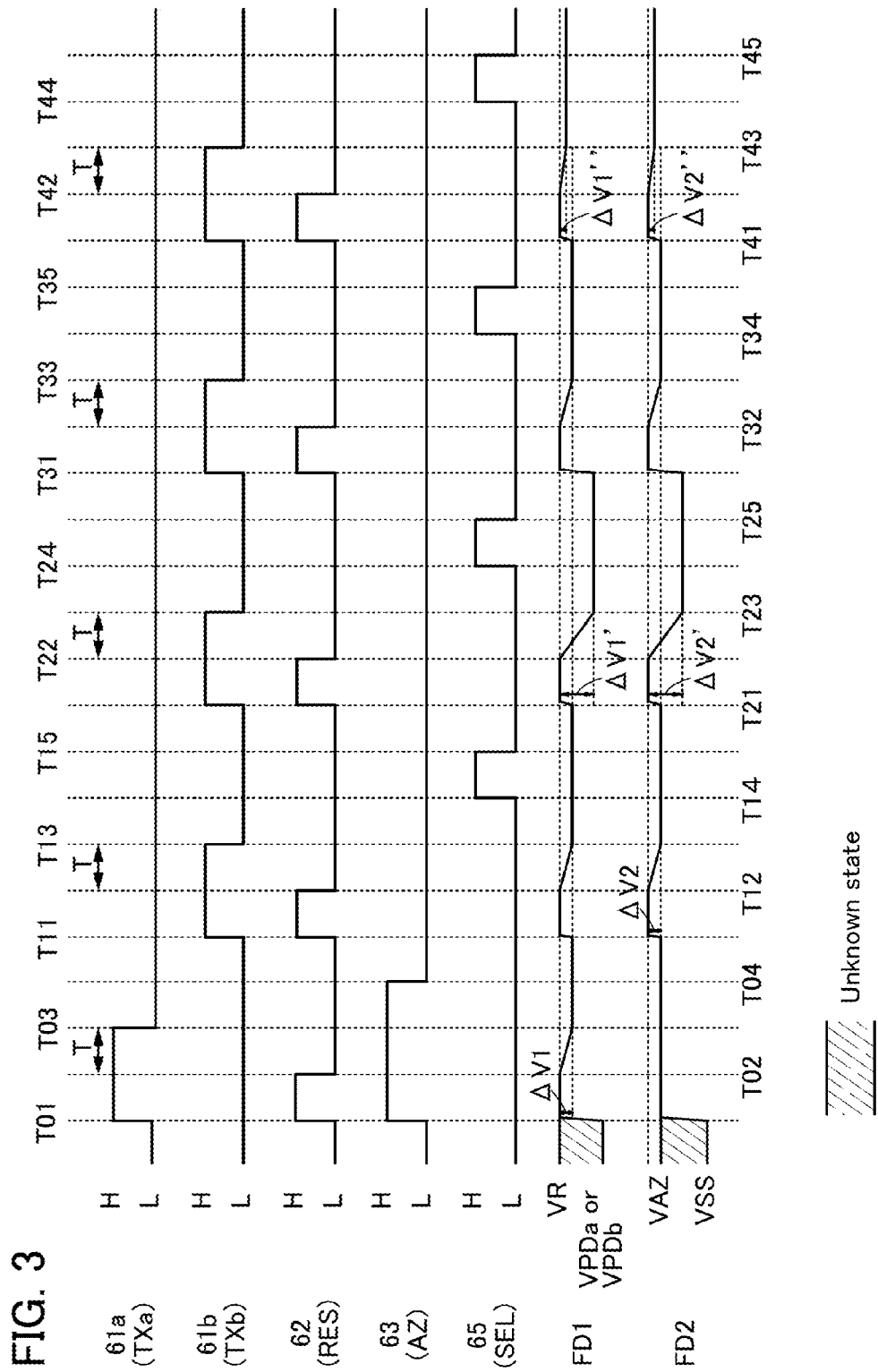
FIG. 3 is a timing chart illustrating imaging operation.

Next, the operation in the difference detection mode is described with reference to FIG. 3. Note that in the difference detection mode in this specification, imaging data captured by the pixel 10a and imaging data captured by the pixel 10b are referred to as reference imaging data and target imaging data, respectively.

Time T01 to Time T04 is a period for capturing reference imaging data. At Time T01, the potentials of the wirings 61a (TXa), 62 (RES), and 63 (AZ) are set at H level, thereby turning the transistors 31a, 32, and 33 on. In addition, the potentials of the wirings 61b (TXb) and 65 (SEL) are set L level, thereby turning the transistors 31b and 35 off. Accordingly, the potentials of the nodes FD1 and FD2 respectively become equal to those of the wirings 52 (VR) and 53 (VAZ), that is, VR and VAZ.

At Time T02, the potential of the wiring 62 (RES) is set at L level, thereby turning the transistor 32 off, and decreasing the potential of the node FD1. The potential of the node FD1 is expressed as VR−ΔV1 where ΔV1 denotes the decrease in the potential of the node FD1. Note that as the illuminance of light delivered to the photoelectric conversion element 20a is higher, the amount of decrease in the potential of the node FD1 is larger. The potential of the node FD2 is not changed.

At time T03, the potential of the wiring 61a (TXa) is set at L level, thereby turning the transistor 31 off and retaining the potential of the node FD1. Note that the length of the period between Time T02 and Time T03 is denoted as T.

At Time T04, the potential of the wiring 63 (AZ) is set at L level, thereby turning the transistor 33 off. In this manner, reference imaging data is captured.

Time T11 to Time T15 is a period in which data for difference determination is obtained by capture and output of reference imaging data if there is no difference between reference imaging data and target imaging data. The case where there is no difference therebetween corresponds to the case where the illuminance of light delivered to the photoelectric conversion element 20b in a period between Time T12 and Time T13 described later is the same as that in the period between Time T02 and Time T03.

At Time T11, the potentials of the wirings 61b (TXb) and 62 (RES) are set at H level, thereby turning the transistors 31b and 32 on. As a result, the potential of the node FD1 is changed from VR−ΔV1 to VR, which means that the potential is increased by ΔV1 denoting the potential decrease in the period between Time T02 and Time T03. In addition, the potential of the node FD2 is increased. When the potential increase at the node FD2 is denoted as ΔV2, ΔV2=ΔV1·α. In other words, the potential of the node FD2 is changed from VAZ to VAZ+ΔV2.

At time T12, the potential of the wiring 62 (RES) is set at L level, so that the transistor 32 is turned off and the potential of the node FD1 is decreased and the potential of the node FD2 is accordingly decreased.

At time T13, the potential of the wiring 61b (TXb) is set at L level, thereby turning the transistor 31b off and holding the potentials of the nodes FD1 and FD2.

The length of the period between Time T12 and Time T13 is denoted as T. The potential decrease at the node FD1 is equal to the potential decrease ΔV1 from Time T02 to Time T03 because the photoelectric conversion element 20b is irradiated with light with the same illuminance as that from Time T02 to Time T03. That is, the potential decrease at the node FD1 from Time T12 to Time T13 is equal to the potential increase at the node FD1 at Time T11. The potential decrease at the node FD2 is equal to the potential increase ΔV2 at Time T11; thus, the potential of the node FD2 becomes VAZ, which is the same as that of the wiring 53 (VAZ).

At Time T14, the potential of the wiring 65 (SEL) is set at H level, thereby turning the transistor 35 on. Thus, a signal corresponding to imaging data is output to the wiring 56 (VOUT) in accordance with the potential of the node FD2.

At time T15, the potential of the wiring 65 (SEL) is set at L level, thereby turning the transistor 35 off. Target imaging data is captured in this manner.

Time T21 to Time T25 corresponds to a period during which data for difference determination is obtained by capture and output of reference imaging data if there is a difference between reference imaging data and target imaging data. The case where there is a difference corresponds to the case where light irradiating the photoelectric conversion element 20b has higher illuminance from Time T22 to Time T23 described later than from Time T12 to Time T13.

The operations of the transistors 31b, 32, 33, and 35 from Time T21 to Time T25 are similar to those from Time T11 to Time T15.

The potential of the node FD1 at Time T21 is VR. Accordingly, the potential is increased by ΔV1, which is the potential decrease from Time T12 to Time T13. Meanwhile, the potential of the node FD2 is increased by ΔV2, which is the potential decrease from Time T12 to Time T13. That is, the potential of the node FD2 becomes VAZ+ΔV2.

At Time T22, the potentials of the nodes FD1 and FD2 are decreased.

The potentials of the nodes FD1 and FD2 are retained at Time T23. When the length of the period between Time T22 and Time T23 is assumed to be T, the potential decrease ΔV1' at the node FD1 from Time T22 to Time T23 is larger than the potential decrease ΔV1 from Time T12 to Time T13 (ΔV1'>ΔV1) because the illuminance of light with which the photoelectric conversion element 20b is irradiated is higher than the illuminance of light with which the photoelectric conversion element 20b is irradiated from Time T12 to Time T13. Furthermore, the potential decrease ΔV2'=ΔV1'·α at the node FD2 is larger than the potential decrease ΔV2 from Time T12 to Time T13 (ΔV2'>ΔV2). Thus, the potential VAZ+ΔV2−ΔV2' of the node FD2 is lower than the potential VAZ of the wiring 53 (VAZ).

At Time T24, a signal that corresponds to imaging data is output to the wiring 56 (VOUT) in accordance with the potential of the node FD2. Note that the higher the illuminance of light with which the photoelectric conversion element 20b is irradiated from Time T22 to Time T23 is, the lower the potential of the wiring 56 (VOUT) is, therefore making the potential of the output signal lower than the potential of an output signal from Time T14 to Time T15.

Similarly to the period between Time T11 and Time T15, a period between Time T31 and Time T35 corresponds to a period during which data for difference determination is obtained by capture and output of the target imaging data if there is no difference between the reference imaging data and the target imaging data.

The operations of the transistors 31b, 32, 33, and 35 from Time T31 to Time T35 are similar to those from Time T11 to Time T15.

The potential of the node FD1 from Time T31 to Time T32 is VR. Accordingly, the potential is increased by ΔV1', which is the potential decrease from Time T22 to Time T23.

Meanwhile, the potential of the node FD2 is increased by ΔV2', which is the potential decrease from Time T22 to Time T23. That is, the potential of the node FD2 becomes VAZ+ ΔV2.

When the length of the period between Time T32 and Time T33 is assumed to be T, the potential decrease at the node FD1 is equal to the potential decrease ΔV1 from Time T12 to Time T13 because the photoelectric conversion element 20b is irradiated with light with the same illuminance as that from Time T12 to Time T13. The potential decrease at the node FD2 is equal to the potential decrease ΔV2 from Time T12 to Time T13. Thus, the potential of the node FD2 becomes VAZ, which is equal to the potential of the wiring 53 (VAZ).

A period between Time T41 and Time T45 corresponds to a period during which data for difference determination is obtained by capture and output of the target imaging data if there is a difference between the reference imaging data and the target imaging data. The case where there is a difference therebetween corresponds to the case where light with which the photoelectric conversion element 20b is irradiated has lower illuminance in a period between Time T42 and Time T43 described later than that in the period between Time T32 and Time T33.

The operations of the transistors 31b, 32, 33, and 35 from Time T41 to Time T45 are similar to those from Time T31 to Time T35.

The potential of the node FD1 at Time T41 is VR. Accordingly, the potential is increased by ΔV1, which is the potential decrease from Time T32 to Time T33. Meanwhile, the potential of the node FD2 is increased by ΔV2, which is the potential decrease from Time T32 to Time T33. That is, the potential of the node FD2 becomes VAZ+ΔV2.

At Time T42, the potentials of the nodes FD1 and FD2 are decreased.

The potentials of the nodes FD1 and FD2 are retained at Time T43. When the length of the period between Time T42 and Time T43 is assumed to be T, the potential decrease ΔV1" at the node FD1 from Time T42 to Time T43 is smaller than the potential decrease ΔV1 from Time T32 to Time T33 (ΔV1"<ΔV1) because the illuminance of light with which the photoelectric conversion element 20b is irradiated is lower than the illuminance of light with which the photoelectric conversion element 20b is irradiated from Time T32 to Time T33. Furthermore, the potential decrease ΔV2"=ΔV1"·α at the node FD2 is smaller than the potential decrease ΔV2 from Time T32 to Time T33 (ΔV2"<ΔV2). Thus, the potential VAZ+ΔV2−ΔV2" of the node FD2 is higher than the potential VAZ of the wiring 53 (VAZ).

At Time T44, a signal that corresponds to imaging data is output to the wiring 56 (VOUT) in accordance with the potential of the node FD2. Note that the lower the illuminance of light with which the photoelectric conversion element 20b is irradiated from Time T42 to Time T43 is, the higher the potential of the wiring 56 (VOUT) is, therefore making the potential of the output signal higher than the potential of an output signal from Time T34 to Time T35.

The pixels 10a and 10b having the configuration described in this embodiment can capture and output imaging data by image capturing and can hold and output data for difference detection between reference imaging data and target imaging data.

Figure 4:
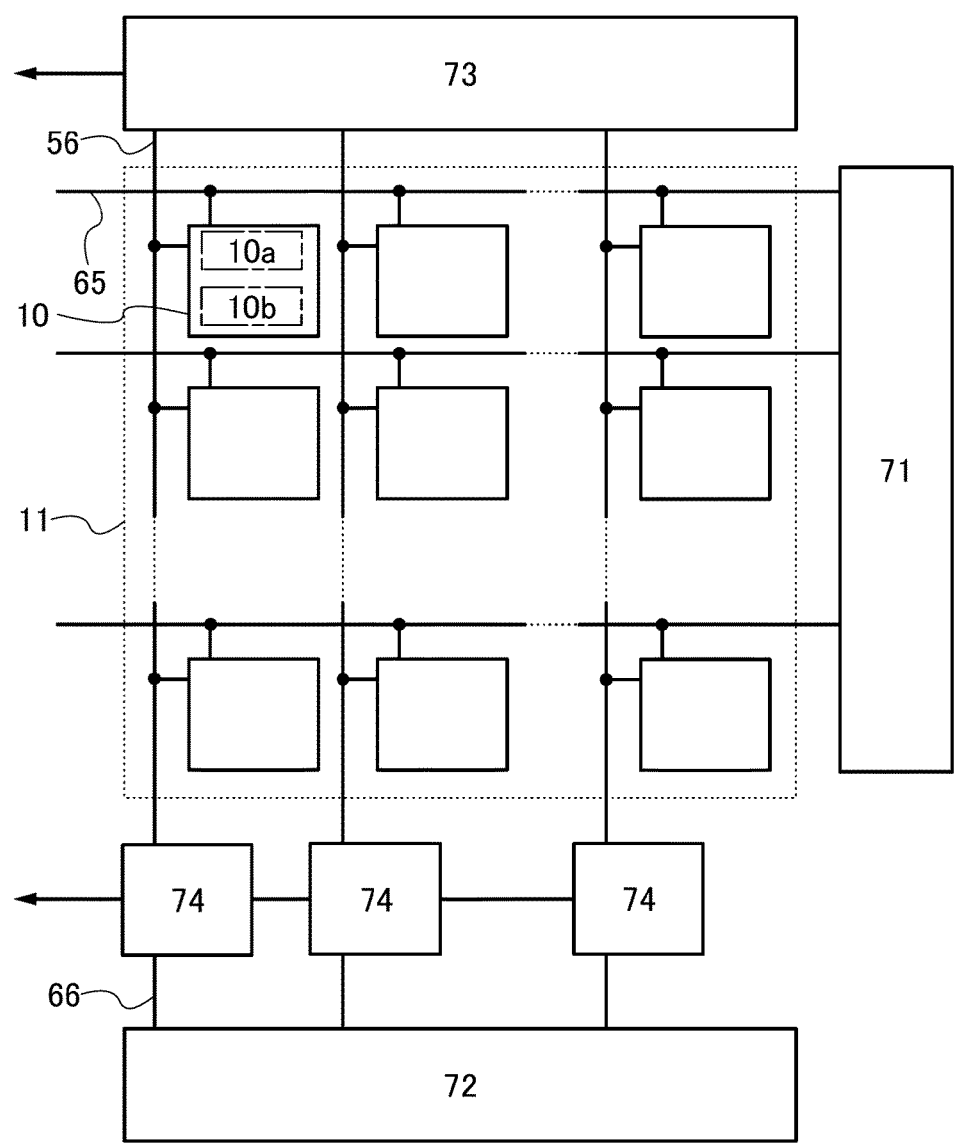
FIG. 4 is a block diagram illustrating an imaging device.

FIG. 4 is a block diagram illustrating the imaging device of one embodiment of the present invention. The imaging device includes the pixels 10, a circuit 71, a circuit 72, a circuit 73, and circuits 74. The pixels 10 each include the pixel 10a and the pixel 10b as shown in FIG. 1. The pixels 10 are arranged in matrix to form a pixel array 11. Note that the circuit 74 is provided in each column of the pixel array 11.

Each of the pixels 10 is electrically connected to the circuit 71 through the wiring 65 and to the circuits 73 and 74 through the wiring 56. The circuit 72 is electrically connected to the circuit 74 through the wiring 66.

Note that both the pixels 10a and 10b are not necessarily included in every pixel 10 of the pixel array 11. For example, some pixels 10 may include not the pixel 10b but only the pixel 10a.

The circuit 71 serves as a row driver for selecting a row of the pixel array 11. The circuit 72 serves as a column driver for selecting a column of the pixel array 11. The circuit 73 serves as an A/D conversion circuit.

The circuit 74 can perform data processing on analog imaging data output from each pixel 10.

A variety of circuits, such as a decoder and a shift register, are used for the circuit 71 and the circuit 72

As described above, the imaging device of one embodiment of the present invention can be operated in the normal imaging mode or the difference detection mode.

In the normal imaging mode, imaging data is captured in all the pixels 10. The captured data are sequentially converted to digital data in the circuit 73 and output to the outside.

In the difference detection mode, the pixel 10a captures reference imaging data, then the pixel 10b captures target imaging data, and then the circuit 74 compares the target imaging data to the reference imaging data and outputs the result of difference determination to the outside. Note that the pixels 10a and 10b are included in the pixel 10.

Figure 5:
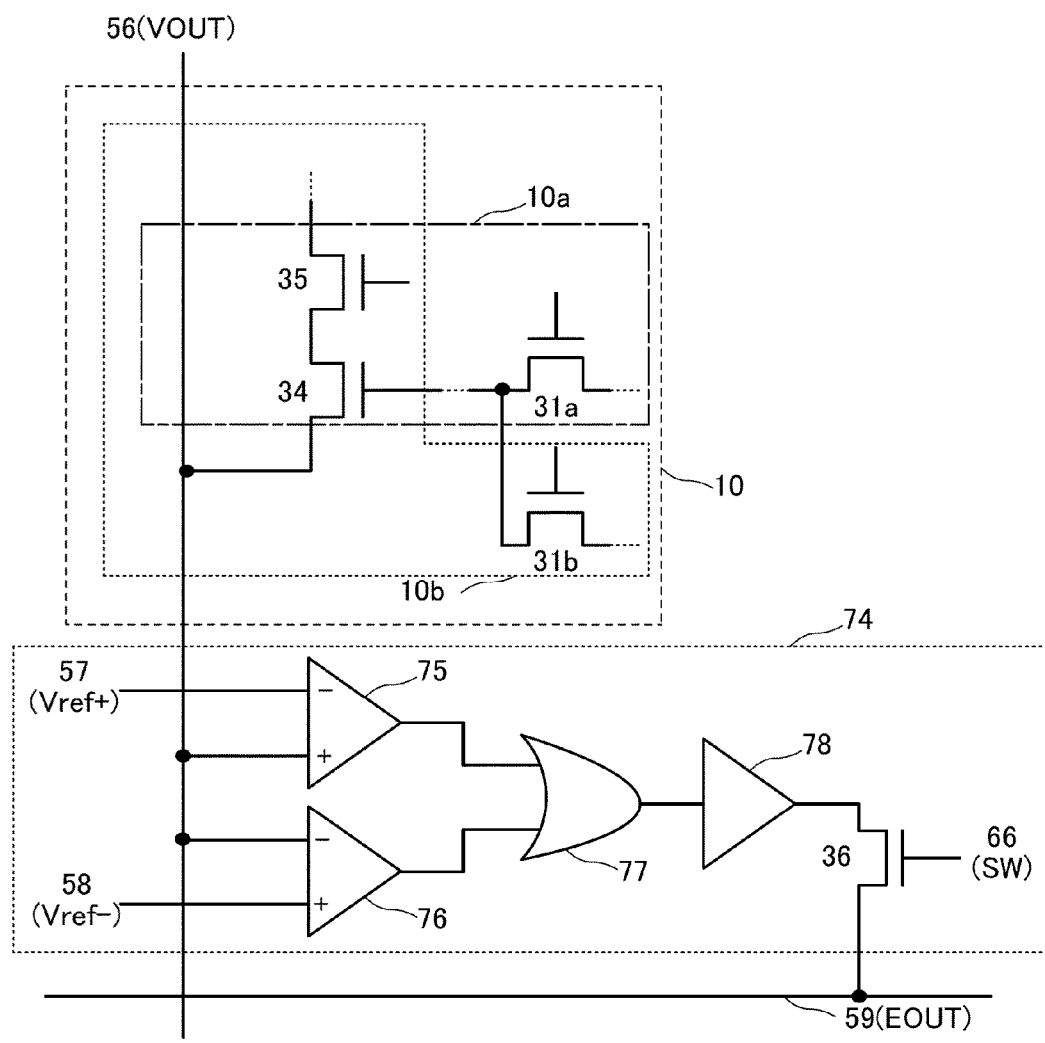
FIG. 5 illustrates a pixel circuit and a difference detection circuit.

FIG. 5 is an example of a circuit diagram illustrating the configuration of the circuit 74 and a connection relationship between the circuit 74 and the pixel 10. The circuit 74 includes a comparator 75, a comparator 76, an OR circuit 77, a buffer 78, and a transistor 36.

Note that the transistor 36, which is an n-channel transistor in FIG. 5, may be a p-channel transistor depending on circumstances or conditions. Any element other than a transistor may be used for the transistor 36 as long as the element has switching characteristics.

In the circuit 74 shown in FIG. 5, a non-inverting input terminal of the comparator 75 and an inverting input terminal of the comparator 76 are electrically connected to the other of the source and the drain of the transistor 34 through the wiring 56 (VOUT). An output terminal of the comparator 75 is electrically connected to a first input terminal of the OR circuit 77. An output terminal of the comparator 76 is electrically connected to a second input terminal of the OR circuit 77. An output terminal of the OR circuit 77 is electrically connected to an input terminal of the buffer 78. An output terminal of the buffer 78 is electrically connected to one of a source and a drain of the transistor 36.

The non-inverting input terminal of the comparator 75 is electrically connected to a wiring 57 (Vref$^+$). The non-inverting input terminal of the comparator 76 is electrically connected to a wiring 58 (Vref$^-$). The other of the source and the drain of the transistor 36 is electrically connected to a wiring 59 (EOUT). A gate of the transistor 36 is electrically connected to the wiring 66 (SW).

Although not illustrated, the wiring 66 (SW) is electrically connected to the circuit 72 which is shown in FIG. 4.

A potential Vref$^+$ and a potential Vref$^-$ are applied to the wiring 57 (Vref$^+$) and the wiring 58 (Vref$^-$), respectively. Note that the potential Vref$^+$ and the potential Vref$^-$ can be referred to as reference potentials. In the difference detection mode, a potential VOUT, which corresponds to a difference between the pixel 10a and the pixel 10b, is applied to the wiring 56 (VOUT). If VOUT is higher than Vref+ a difference is detected, whereby the comparator 75 outputs an H-level difference determination signal. If VOUT is lower than Vref+, no difference is detected, whereby the comparator 75 outputs an L-level difference determination signal. If VOUT is lower than Vref−, a difference is detected, whereby the comparator 76 outputs an H-level difference determination signal. If VOUT is higher than Vref−, no difference is detected, whereby the comparator 76 outputs an L-level difference determination signal. If at least one of the comparators 75 and 76 outputs the H-level difference determination signal, the OR circuit 77 outputs the H-level difference determination signal. If both of them output the L-level difference determination signal, the OR circuit 77 outputs the L-level difference determination signal.

In other words, if VOUT>Vref+ or VOUT<Vref−, a difference is detected, whereas, if Vref−<VOUT<Vref+, no difference is detected.

Note that if Vref−<VOUT<Vref+, a difference is detected, whereas, if VOUT>Vref+ or VOUT<Vref−, no difference is detected.

The buffer 78 corrects the logic value of the difference determination signal output from the OR circuit 77 in order to avoid misdetection. When the difference determination signal is output to the outside, the potential of the wiring 66 (SW) is set at H level (or L level if the transistor 36 is a p-channel transistor), thereby turning the transistor 36 on. In this manner, the result of the difference determination is output through the wiring 59 (EOUT).

Note that the difference determination signal corresponds to 1-bit output.

The logic of a difference determination signal which is output from the OR circuit 77 can be reversed as appropriate. A logic circuit, such as a NOR circuit, an AND circuit, or a NAND circuit, can be used as the OR circuit 77 as appropriate.

The buffer 78 or the OR circuit 77 is not necessarily included in the circuit 74.

Since the pixels 10a and 10b are adjacent to each other in one embodiment of the present invention, a region where the illuminance of imaging data is changed can be detected by difference determination between reference imaging data and target imaging data. In other words, edge detection can be performed without a periphery device for edge detection outside the imaging device. Thus, the speed of edge detection can be increased and power consumed by edge detection can be reduced. Moreover, cost can be reduced because the number of periphery devices is reduced.

This embodiment can be implemented in an appropriate combination with any of the structures described in the other embodiments.

Embodiment 2

In this embodiment, a variation example of the pixel 10 of the imaging device of one embodiment is described with reference to drawings.

Figure 6:
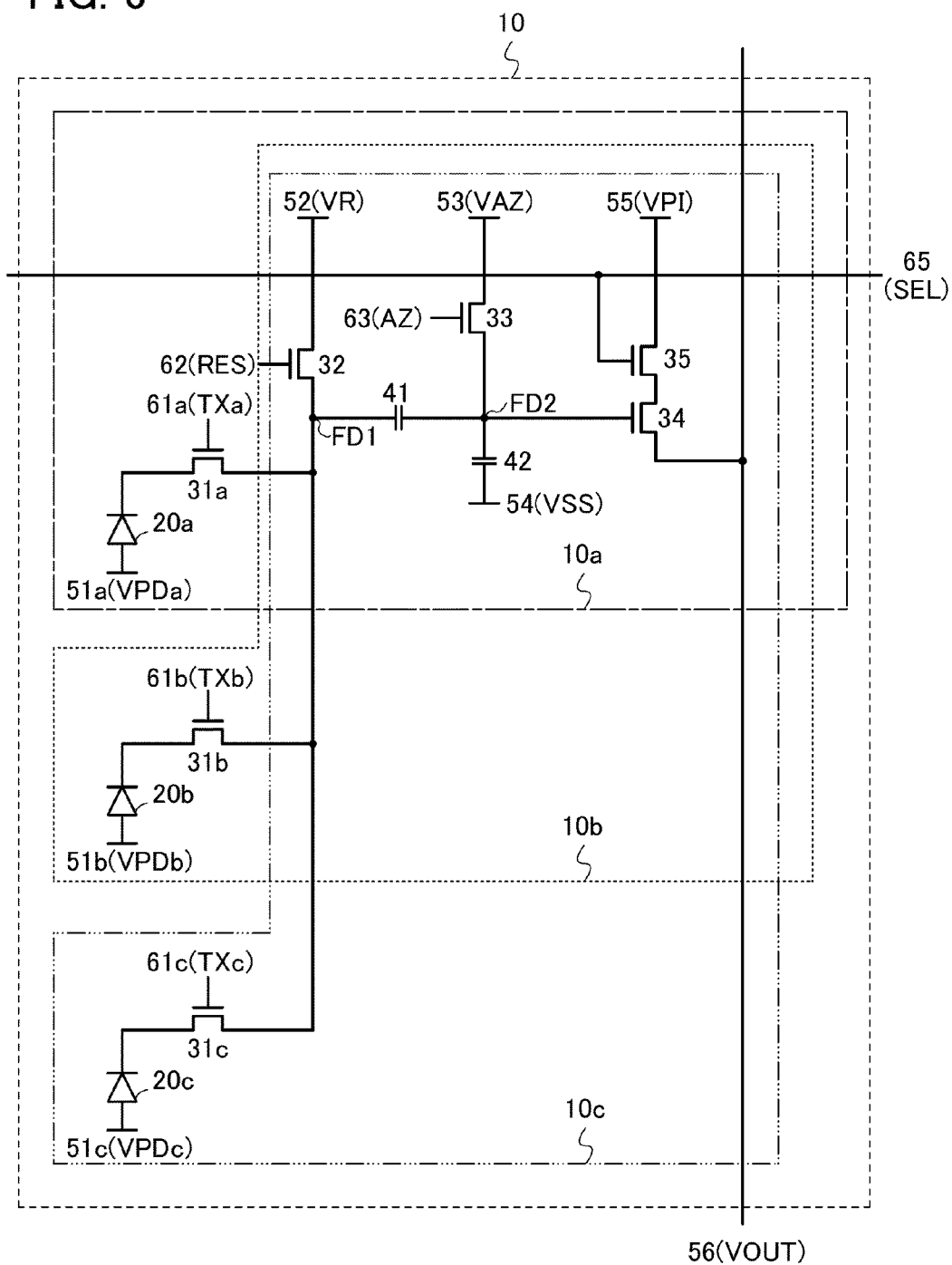
FIG. 6 illustrates a pixel circuit of an imaging device.

Although two pixels, the pixels 10a and 10b, share the transistors 32 to 35 and the capacitors 41 and 42 in Embodiment 1, three pixels, the pixel 10a, the pixel 10b and a pixel 10c may share the transistors 32 to 35 and the capacitors 41 and 42 as shown in FIG. 6. Alternatively, four or more pixels may share the transistors 32 to 35 and the capacitors 41 and 42.

Note that in the structure shown in FIG. 6, the pixel 10a, the pixel 10b, and the pixel 10c are sometimes collectively referred to as the pixel 10.

The pixel 10c includes a photoelectric conversion element 20c and a transistor 31c. One terminal of the photoelectric conversion element 20c is electrically connected to one of a source and a drain of the transistor 31c. The other of the source and the drain of the transistor 31c is electrically connected to the other of the source and the drain of the transistor 31a, the other of the source and the drain of the transistor 31b, the one of the source and the drain of the transistor 32, and the one terminal of the capacitor 41.

The other terminal of the photoelectric conversion element 20c is electrically connected to a wiring 51c (VPDc). A gate of the transistor 31c is electrically connected to a wiring 61c (TXc). Note that the wirings 51a (VPDa), 51b (VPDb), and 51c (VPDc), which are separate wirings, may be combined as one wiring, or two of the wirings 51a to 51c may be combined as one wiring.

In the difference detection mode, difference determination may be performed as follows: imaging data captured by the pixel 10a is compared to imaging data captured by the pixel 10b for difference determination, and then, imaging data captured by the pixel 10a is compared to imaging data captured by the pixel 10c for difference determination. Alternatively, difference determination may be performed as follows: imaging data captured by the pixel 10a is compared to imaging data captured by the pixel 10b for difference determination, and then, imaging data captured by the pixel 10b is compared to imaging data captured by the pixel 10c for difference determination.

The structure shown in FIG. 6 includes more photoelectric conversion elements in the pixel 10 than the structure shown in FIG. 1 and thus can be improved in imaging sensitivity.

Figure 7:
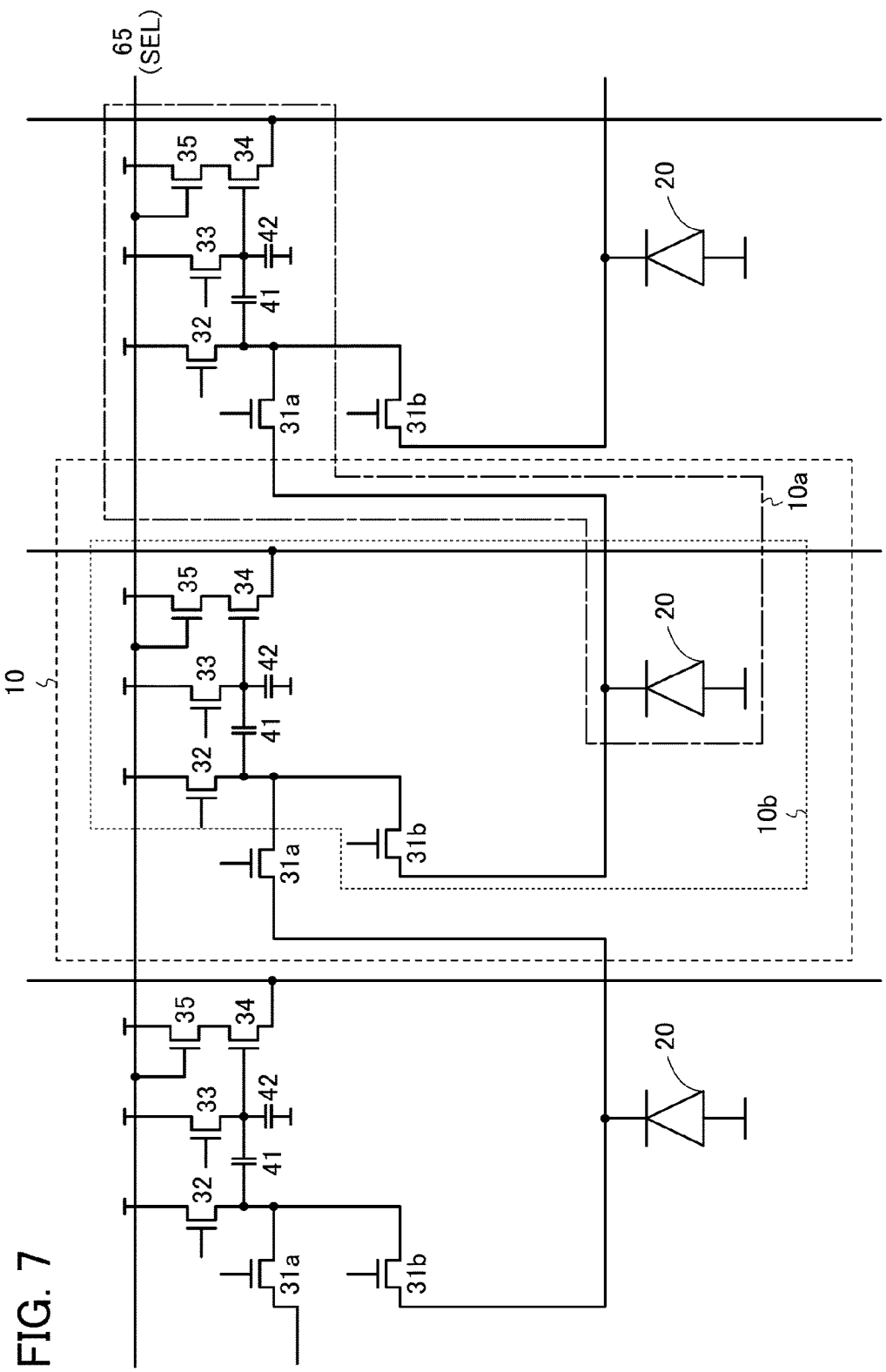
FIG. 7 illustrates a pixel circuit of an imaging device.
Figure 8:
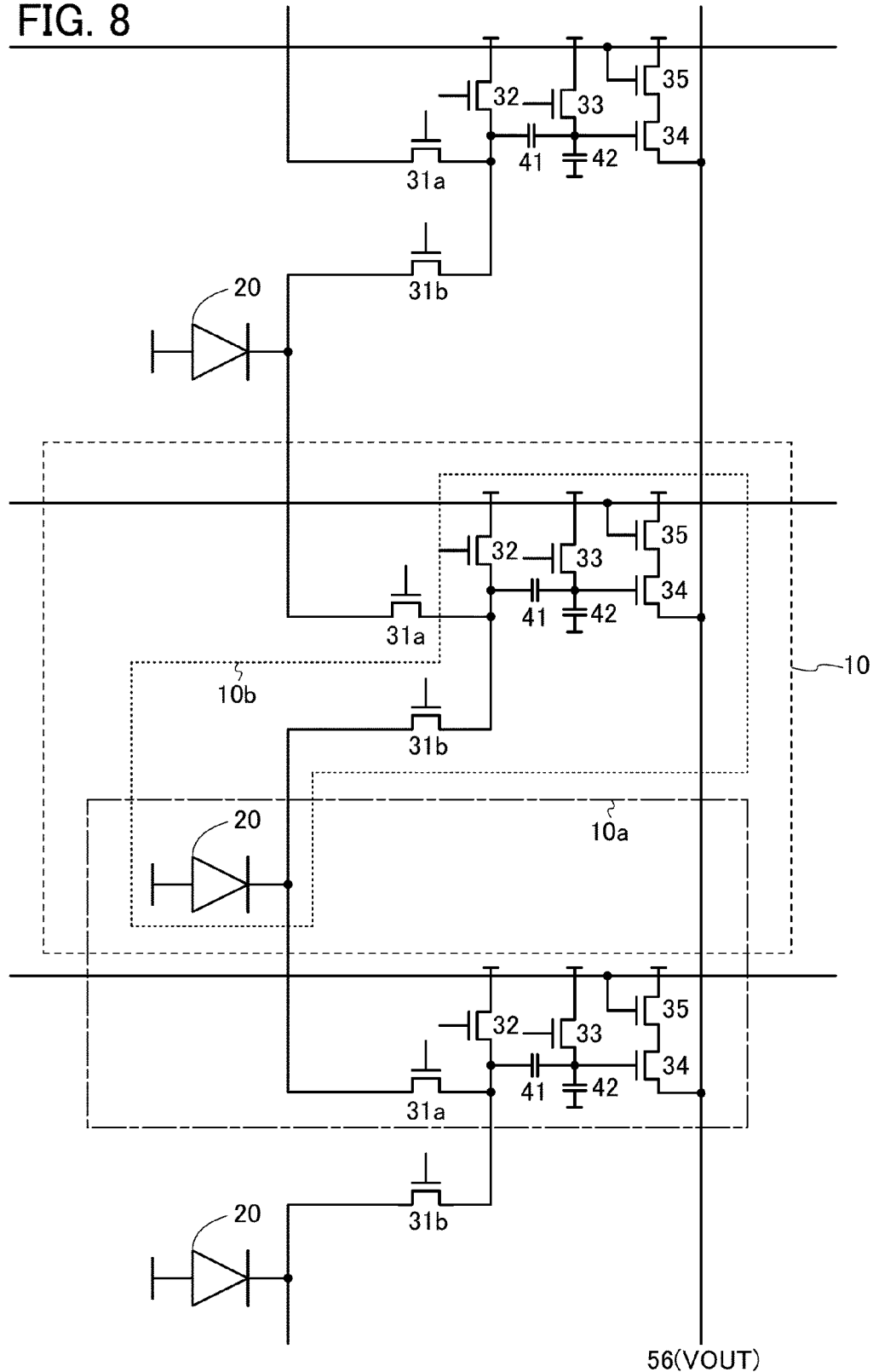
FIG. 8 illustrates a pixel circuit of an imaging device.

The photoelectric conversion elements 20a and 20b can be shared as a photoelectric conversion element 20 by the pixels 10 in adjacent rows or columns in the pixel array 11. FIG. 7 shows that the photoelectric conversion element 20 is shared by the pixels 10 in adjacent columns. FIG. 8 shows that the photoelectric conversion element 20 is shared by the pixels 10 in adjacent rows.

The structures shown in FIG. 7 and FIG. 8 allow the area per pixel to be reduced in the imaging device of one embodiment of the present invention, which leads to higher definition of the imaging device.

Figure 9:
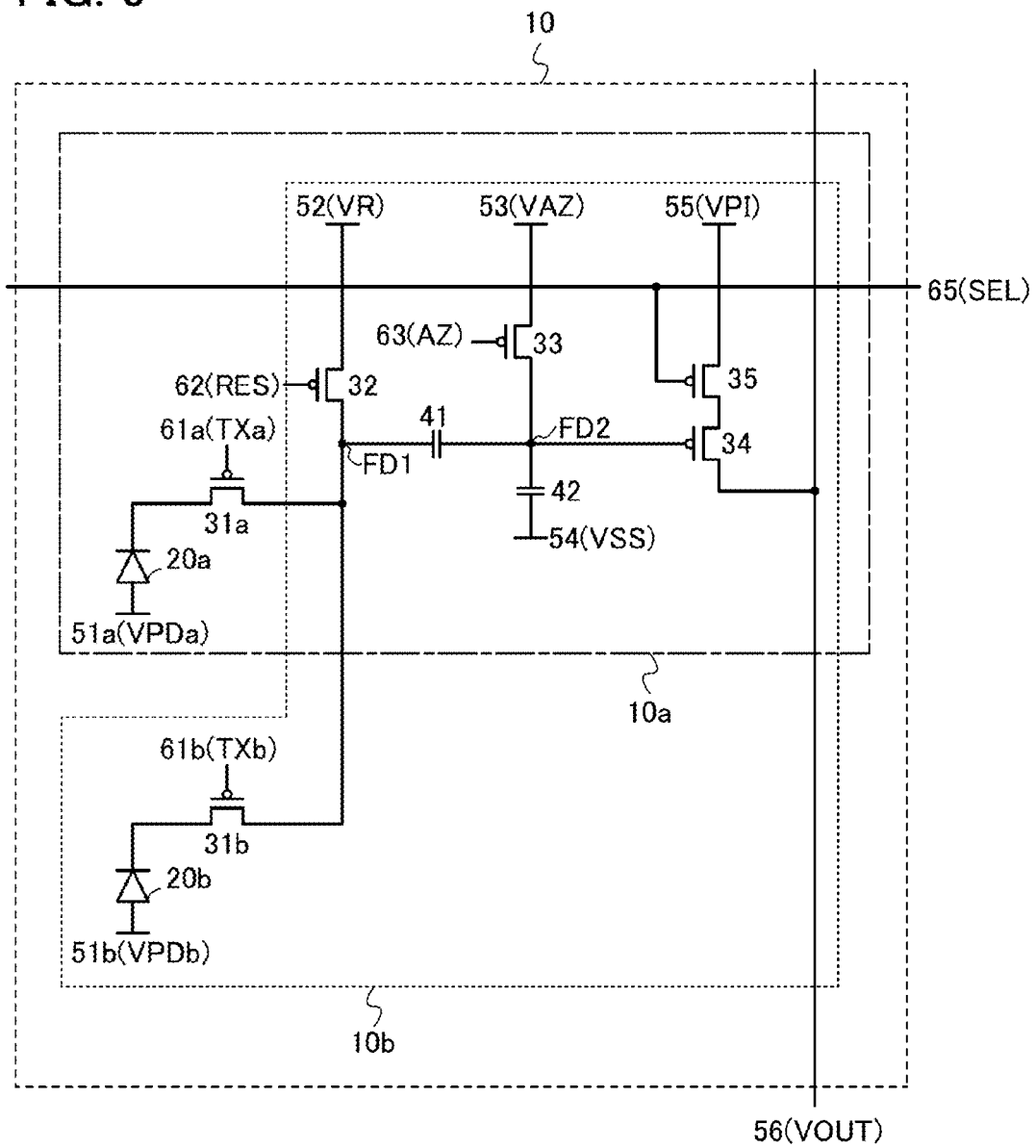
FIG. 9 illustrates a pixel circuit of an imaging device.

The pixel 10 included in the imaging device of one embodiment of the present invention can have a configuration illustrated in FIG. 9 as well as the configuration illustrated in FIG. 1. FIG. 9 is different from FIG. 1 in that the transistors 31a, 31b, and 32 to 35 are all p-channel transistors. When the magnitude relationships of the potentials are reversed as appropriate, for example, FIG. 2 and FIG. 3 can be referred to for the operations in the normal imaging mode and in the difference detection mode, respectively. Note that some of the transistors 31a, 31b, and 32 to 35 may be p-channel transistors. Alternatively, a CMOS structure may be employed.

Figure 10:
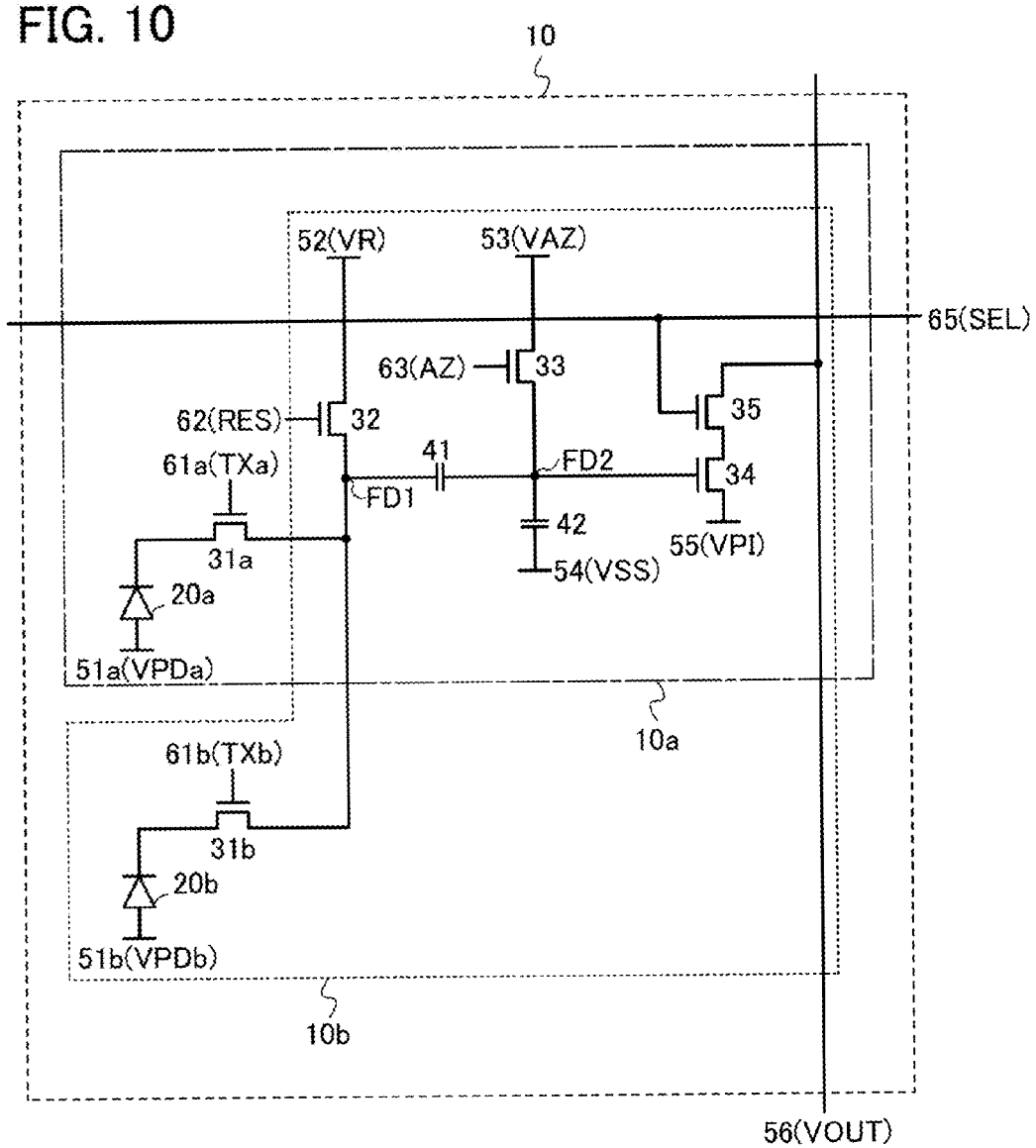
FIG. 10 illustrates a pixel circuit of an imaging device.

Although the transistor 35 lies between the transistor 34 and the wiring 55 (VPI) in FIG. 1, the transistor 34 may lie between the transistor 35 and the wiring 55 (VPI) as shown in FIG. 10.

Figure 11:
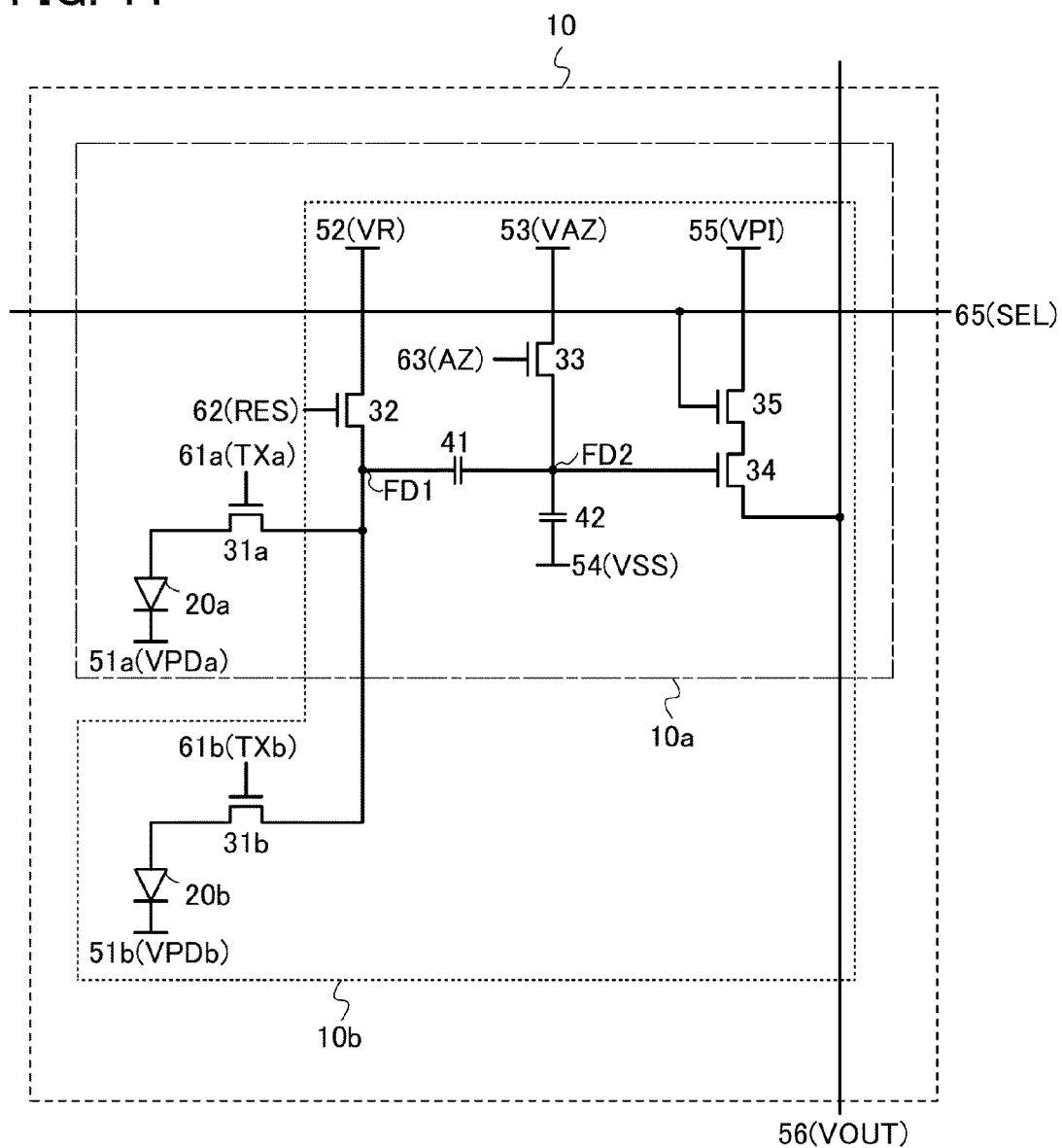
FIG. 11 illustrates a pixel circuit of an imaging device.

The pixels 10 of the imaging device, which is one embodiment of the present invention, may have a structure in FIG. 11. FIG. 11 illustrates a configuration in which the connection orientation of the photoelectric conversion elements 20a and 20b in the pixel 10 is opposite to that in FIG.

1. In this case, the wiring 51a (VPDa) is set at H and the wiring 52 (VR) is set at L. FIG. 2 and FIG. 3 can be referred to for the operations in the normal imaging mode and in the difference detection mode, respectively; in this case however, the higher the illuminance of light irradiating the photoelectric conversion elements 20a and/or 20b is, the higher the potentials of the nodes FD1 and FD2 are. Thus, in the circuit configuration illustrated in FIG. 11, the higher the illuminance of light irradiating the photoelectric conversion elements 20a and/or 20b is, the higher the potential of the output signal from the wiring 56 (VOUT) is.

Figure 12A:
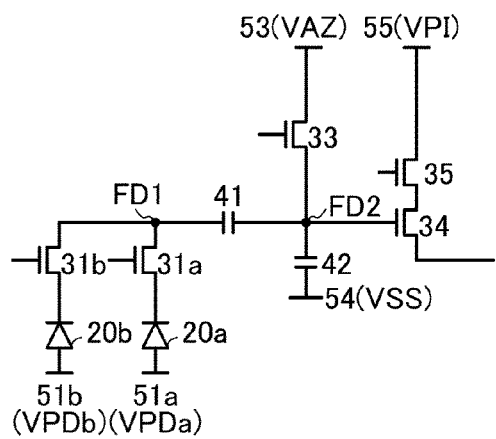
FIGS. 12A to 12C each illustrate a pixel circuit of an imaging device.

FIG. 12A illustrates a configuration in which the transistor 32 is excluded from the pixel 10 illustrated in FIG. 1. In this case, the wirings 51a (VPDa) and 51b (VPDb) are configured to be able to switch between L and H. The reset operation of the node FD1 can be performed as follows: the wiring 51a (VPDa) is set at H in the state where the transistor 31a is ON, or the wiring 51b (VPDb) is set at H in the state where the transistor 31b is ON. In a predetermined period, when the wiring 51a (VPDa) or 51b (VPDb) is set at H, a forward bias is applied to the photoelectric conversion element 20a or 20b. Thus, the potential of the node FD1 can be set at the potential VPDa of the wiring 51a (VPDb) or at the potential VPDb of the wiring 51b (VPDb).

In the case of capturing imaging data, the potential of the wiring 51a (VPDa) is set at L level if the transistor 31a is turned on, whereas the potential of the wiring 51b (VPDb) is set at L level if the transistor 31b is turned on. A reverse bias voltage is applied to the photoelectric conversion elements 20a and 20b when the potentials of the wirings 51a (VPDa) and 51b (VPDb) are set at L level, so that electric charge can be released to the wirings 51a (VPDa) and 51b (VPDb) from the node FD1 in accordance with the illuminance of light. In that case, the higher the illuminance of light with which the photoelectric conversion elements 20a and/or 20b is irradiated is, the lower the potentials of the nodes FD1 and FD2 are. Therefore, in the circuit configurations in FIG. 12A, as the illuminance of light delivered to the photoelectric conversion elements 20a and/or 20b becomes higher, a signal output from the wiring 56 (VOUT) becomes lower.

Figure 12B:
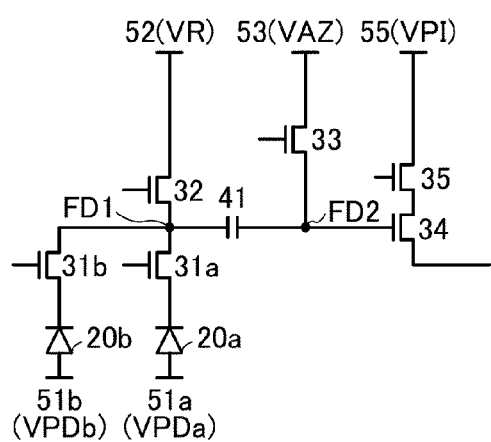

The pixel 10 included in the imaging device of one embodiment of the present invention is not necessarily include the capacitor 42 as shown in FIG. 12B, in which case electric charge is accumulated in the node FD2 using the gate capacitance of the transistor 34, the parasitic capacitance of wirings electrically connected to the node FD2, or the like.

The structures shown in FIGS. 12A and 12B allow the area per pixel to be reduced in the imaging device of one embodiment of the present invention, which leads to higher definition of the imaging device.

Figure 12C:
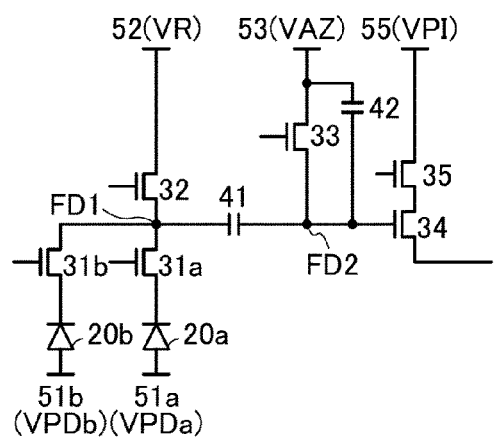

Alternatively, a structure shown in FIG. 12C may be used in which one terminal of the capacitor 42 is electrically connected to one of the source and the drain of the transistor 33, the gate of the transistor 34, and the other terminal of the capacitor 41, and the other terminal of the capacitor 42 is electrically connected to the other of the source and the drain of the transistor 33.

Note that some wirings are not illustrated in FIGS. 12A to 12C.

Figure 13A:
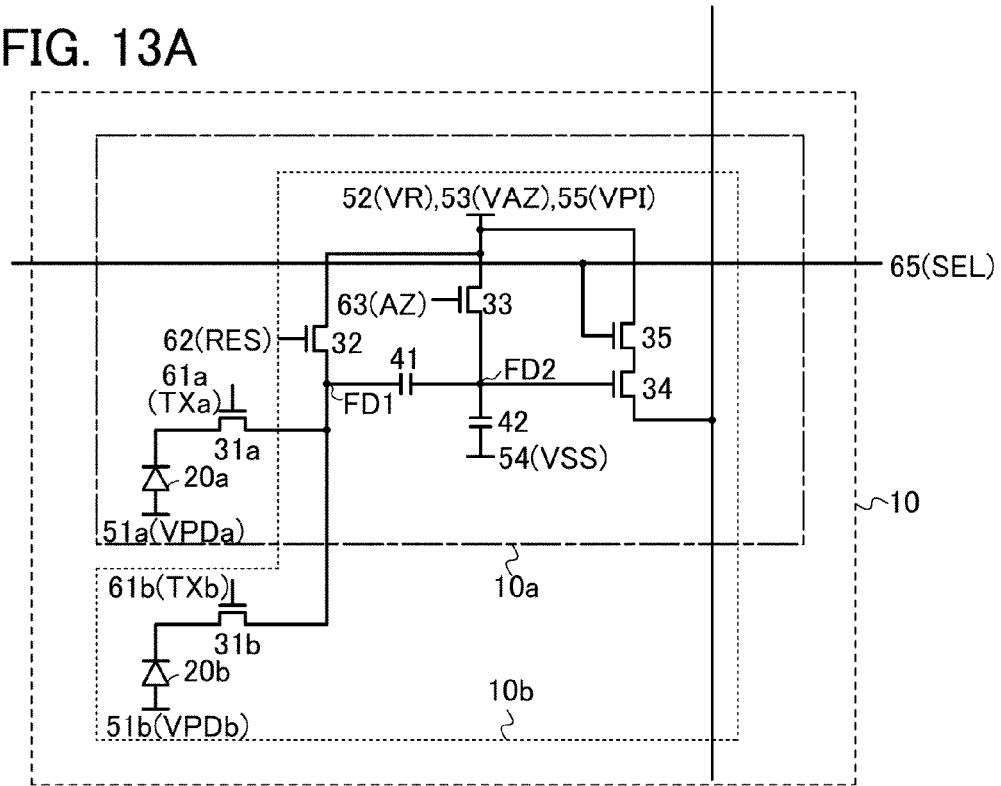
FIGS. 13A and 13B each illustrate a pixel circuit of an imaging device.
Figure 13B:
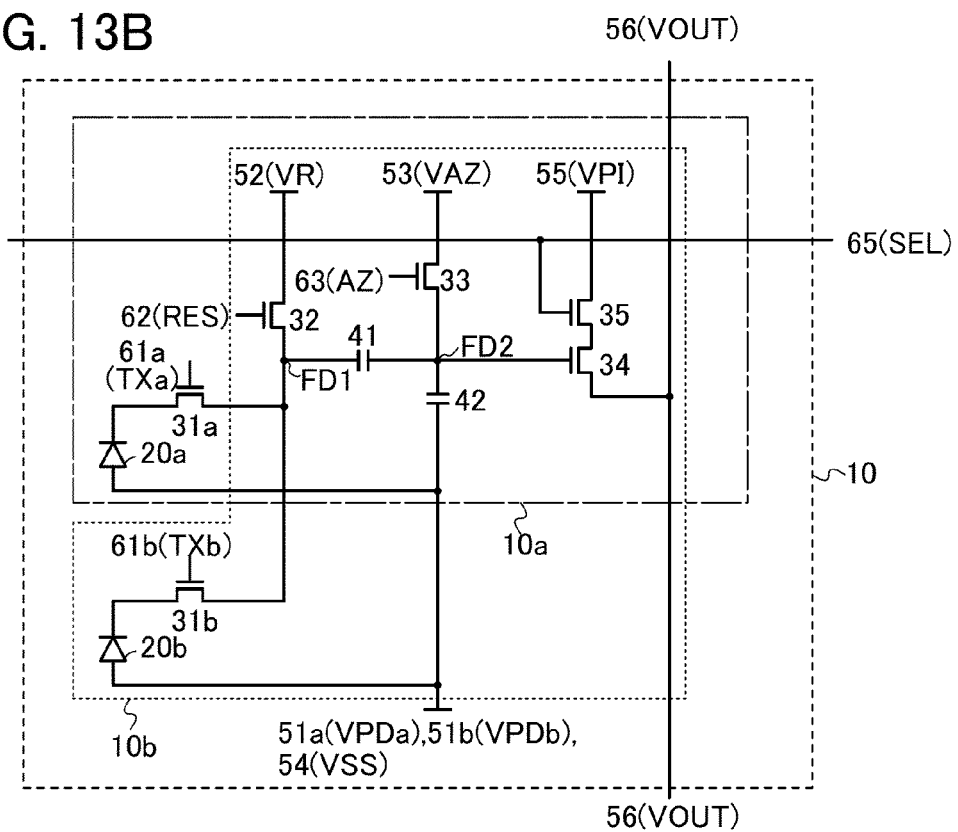

Although FIG. 1 illustrates wirings supplying the same potential as different wirings, one wiring may serve as those wirings. For example, as in the pixel 10 illustrated in FIG. 13A, the wiring 52 (VR), the wiring 53 (VAZ), and the wiring 55 (VPI) to which H is applied may be the same wiring. Alternatively, as in the pixel 10 illustrated in FIG. 13B, the wiring 51a (VPDa), the wiring 51b (VPDb), and the wiring 54 (VSS) to which L is applied may be the same wiring.

The transistors 31a, 31b, and 32 to 35 included in the pixel 10 in FIG. 1 may be transistors whose active layers or active regions contain oxide semiconductors (hereinafter referred to as OS transistors).

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, the off-state current of a transistor is lower than or equal to I means that there is $V_{gs}$ with which the off-state current of a transistor becomes lower than or equal to I in some cases. Furthermore, the off-state current of a transistor may refer to the off-state current in an off state at predetermined $V_{gs}$, the off-state current in an off state at $V_{gs}$ in a predetermined range, the off-state current in an off state at $V_{gs}$ with which sufficiently reduced off-state current is obtained, or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability of a semiconductor device including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state where the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is I or lower at a certain $V_{gs}$.

In this specification, the term leakage current sometimes expresses the same meaning as off-state current.

In this specification, the off-state current sometimes refers to a current that flows between a source and a drain when a transistor is off, for example.

The use of the OS transistor in the pixel 10 can broaden the dynamic range of imaging. In the circuit configuration in FIG. 1, the potential of the node FD1 is decreased when light with high illuminance enters the photoelectric conversion elements 20a and/or 20b and thus the potential of the node FD2 is also decreased. Since the OS transistor has extremely low off-state current, a current based on a gate potential can be accurately outputted even when the potential of the node FD2 (gate potential of the transistor 34) is extremely low. Accordingly, it is possible to widen the detection range of illuminance, i.e., the dynamic range.

A period during which charge can be held in the node FD1 and the node FD2 can be extremely long owing to the low off-state current of the transistor. Therefore, when imaging in the normal imaging mode by the pixel 10a and that by the pixel 10b are performed at the same time, a global shutter system in which imaging data is captured in all the pixels at the same time can be used without complicated circuit configurations and operation methods.

Figure 14A:
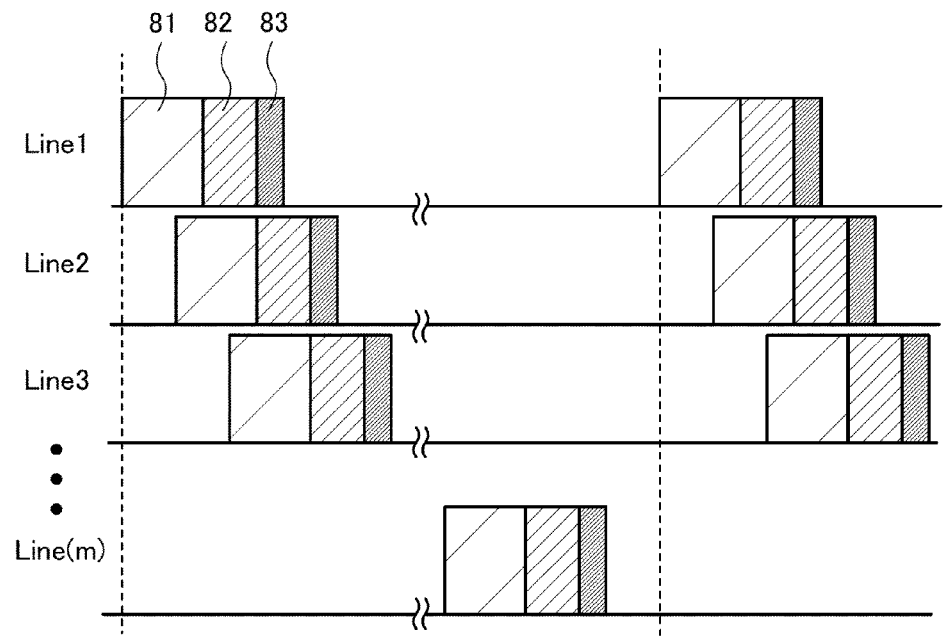
FIGS. 14A and 14B illustrate the operation of a global shutter system and a rolling shutter system.

In a general imaging device where pixels are arranged in a matrix, a rolling shutter system is employed in which an imaging operation 81, a data retention operation 82, and a read operation 83 are performed row by row as illustrated in FIG. 14A. In the case of employing the rolling shutter system, simultaneousness of imaging is lost. Therefore, when an object moves, an image is distorted.

Figure 14B:
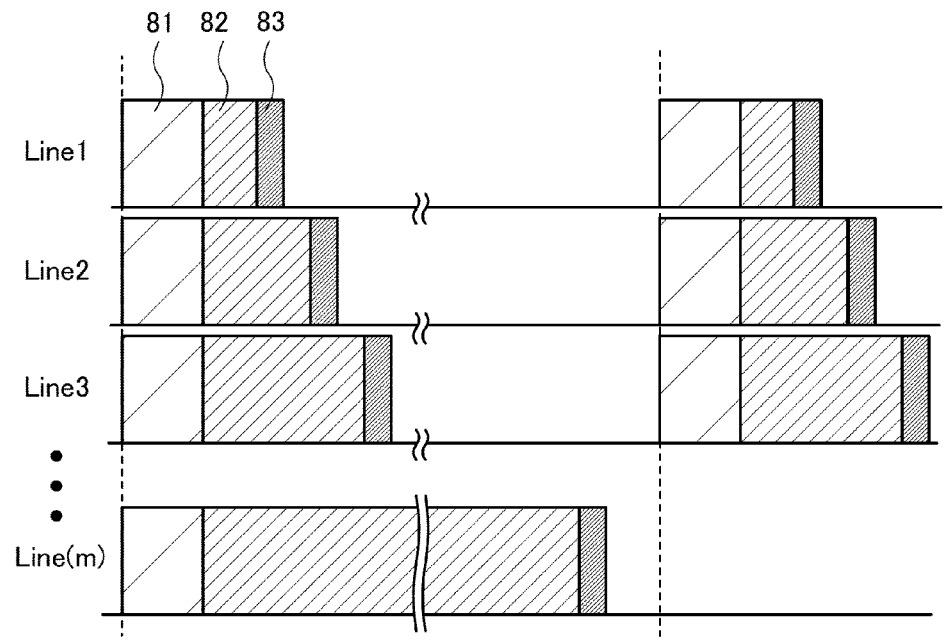

For this reason, when imaging in the normal imaging mode by the pixel 10a and that by the pixel 10b are performed at the same time, it is preferable to employ a global shutter system in which the imaging operation 81 can be performed simultaneously in all the rows and the read operation 83 can be sequentially performed row by row as illustrated in FIG. 14B. By employing the global shutter system, simultaneousness of imaging in all the pixels in the imaging device can be ensured, and an image with little distortion can be easily obtained even when an object moves.

In addition, the OS transistor has lower temperature dependence of change in electrical characteristics than a transistor whose active layer or active region contains silicon (hereinafter, such a transistor is referred to as a Si transistor), and thus can be used in an extremely wide range of temperatures. Therefore, an imaging device and a semiconductor device that include OS transistors are suitable for use in automobiles, aircrafts, and spacecrafts.

A transistor connected to either the node FD1 or the node FD2 needs to be a transistor with low noise. The channel of a transistor including two or three oxide semiconductor layers to be described later is a buried channel, which has significantly high resistance to noise. Thus, the use of the transistor leads to an image with low noise.

Because OS transistors are used as the transistors 31a, 31b, and 32 to 35, the pixel can be composed of OS transistors and a photoelectric conversion element formed using silicon. Such a configuration facilitates an increase in the effective area of the photoelectric conversion element because a Si transistor need not be formed in the pixel. Thus, the imaging sensitivity can be improved Not only the pixel 10 but also peripheral circuits such as the circuit 71, the circuit 72, the circuit 73, and the circuit 74 may include OS transistors. A configuration in which the peripheral circuits are composed only of OS transistors requires no process of forming a Si transistor, and thus is effective in reducing cost of the imaging device. A configuration in which the peripheral circuits are composed only of OS transistors and p-channel Si transistors requires no process of forming an n-channel Si transistor, and thus is effective in reducing cost of the imaging device. Moreover, the peripheral circuits can be CMOS circuits, resulting in lower power consumption of the peripheral circuits, that is, lower power consumption of the imaging device.

In another example, OS transistors are used as the transistors 31a, 31b, 32, and 33, and Si transistors are used as the transistors 34 and 35.

The Si transistor has a characteristic of excellent field-effect mobility as compared to the OS transistor. Thus, the amount of current flowing in a transistor functioning as an amplifier transistor or a selection transistor can be increased. For example, in FIG. 1, the amount of current flowing in the transistors 34 and 35 can be increased depending on charge accumulated in the node FD2.

Figure 15A:
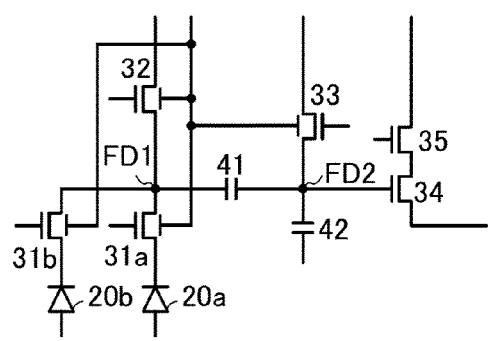
FIGS. 15A to 15F each illustrate a pixel circuit of an imaging device.
Figure 15B:
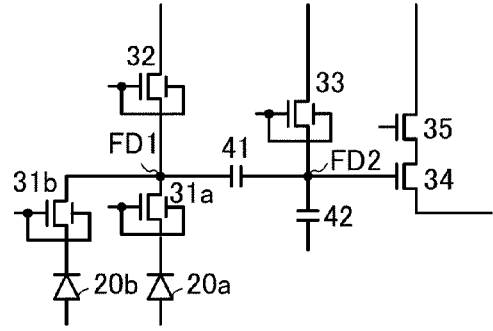
Figure 15C:
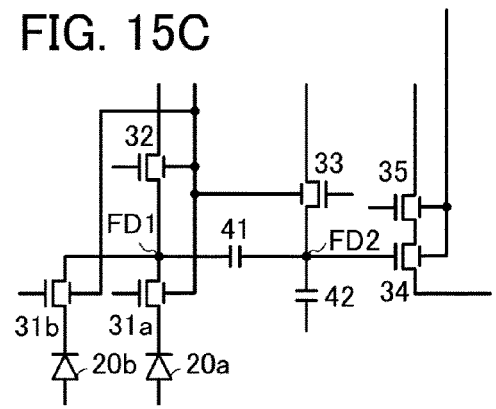
Figure 15D:
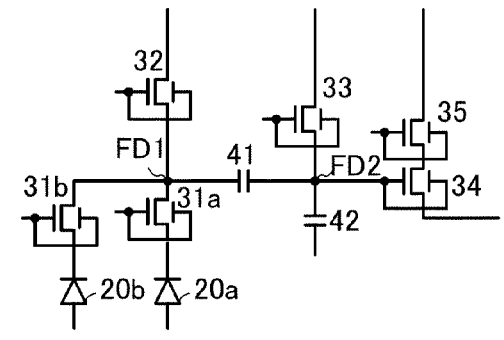

The transistors 31a, 31b, 32, and 33 in the pixels 10 may each include a back gate as illustrated in FIGS. 15A and 15B. FIG. 15A illustrates a configuration in which a constant potential is applied to the back gates, which enables control of the threshold voltages. FIG. 15B illustrates a configuration in which the same potential is applied to the back gates and front gates, which enables an increase in on-state current. The transistors 31a, 31b, and 32 to 35 may each have a back gate as illustrated in FIGS. 15C and 15D.

Figure 15E:
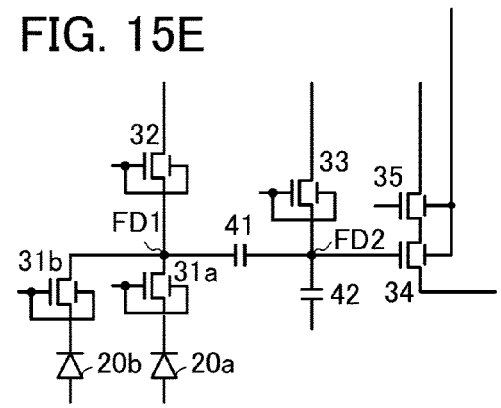
Figure 15F:
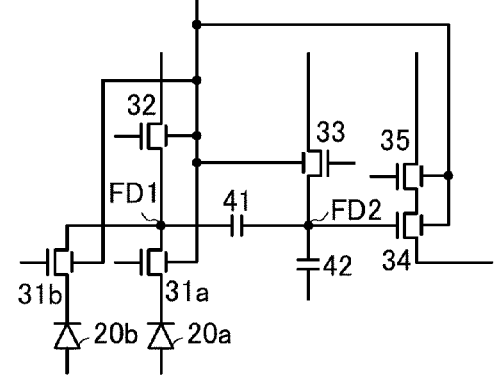

Moreover, as illustrated in FIG. 15E, a configuration in which the same potential is applied to a front gate and a back gate and a configuration in which a constant potential is applied to a back gate may be arbitrarily combined as necessary for the transistors in one pixel. Furthermore, a circuit configuration in which a back gate is not provided may be arbitrarily combined with any of the above configurations. As the configuration in which a constant potential is applied to a back gate, for example, a configuration in which the same potential is applied to all the back gates can be employed as illustrated in FIG. 15F, for example.

Note that some wirings are not illustrated in FIGS. 15A to 15F.

Since an OS transistor has lower on-state current than a Si transistor, it is particularly preferable that the OS transistor have a back gate. For example, in the case where the transistors 31a, 31b, and 32 to 35 are OS transistors, the transistors 31a, 31b, and 32 to 35 preferably have back gates. In the case where the transistors 31a, 31b, 32, and 33 are OS transistors, for example, the transistors 31a, 31b, 32, and 33 preferably have back gates.

Note that any of the configurations in FIG. 1, FIG. 6 to FIGS. 13A and 13B, and FIGS. 15A to 15F can be optionally combined with one another.

This embodiment can be implemented in an appropriate combination with any of the structures described in the other embodiments.

Embodiment 3

In this embodiment, specific structure examples of the imaging device of one embodiment of the present invention will be described below with reference to drawings.

Figure 16A:
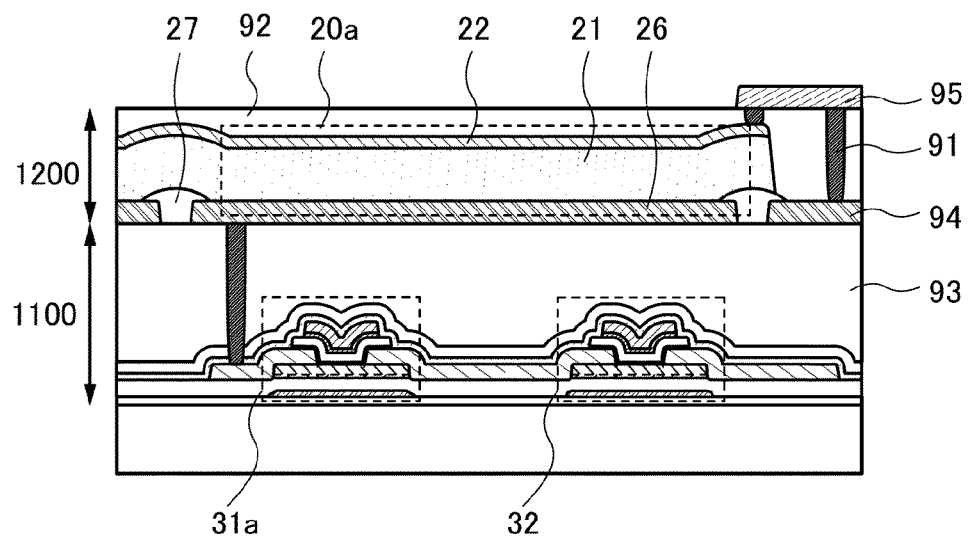
FIGS. 16A to 16C are cross-sectional views each illustrating the structure of an imaging device.

FIG. 16A illustrates an example of a cross-sectional view of the imaging device of one embodiment of the present invention and illustrates a specific connection between the photoelectric conversion element 20a, the transistor 31a, and the transistor 32 which are included in each of the pixels 10 in FIG. 1. Note that the photoelectric conversion element 20b and the transistors 31b and 33 to 35 are not illustrated in FIG. 16A. The imaging device includes a tier 1100 including the transistors 31a, 31b, and 32 to 35 and a tier 1200 including the photoelectric conversion elements 20a and 20b.

Although the wirings, electrodes, and conductors 91 are illustrated as independent components in cross-sectional views in this embodiment, some of them are provided as one component in some cases when they are electrically connected to each other. In addition, a structure in which a gate, a source, or a drain of the transistor is connected to the wirings through a conductor 91 is only an example. The gate, the source, and the drain of the transistor might each function as a wiring.

Over the components, an insulating layer 92, an insulating layer 93, and the like that can function as protective films, interlayer insulating layers, or planarization films are provided. For example, an inorganic insulating film such as a silicon oxide film or a silicon oxynitride film can be used as each of the insulating layers 92 and 93 and the like. Alternatively, an organic insulating film such as an acrylic resin film or a polyimide resin film may be used. Top surfaces of the insulating layers 92 and 93 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In some cases, a layer that is not illustrated in the drawing is included in the stacked-layer structure. One or more of the layers illustrated in the drawing are not included in some cases.

Figure 16B:
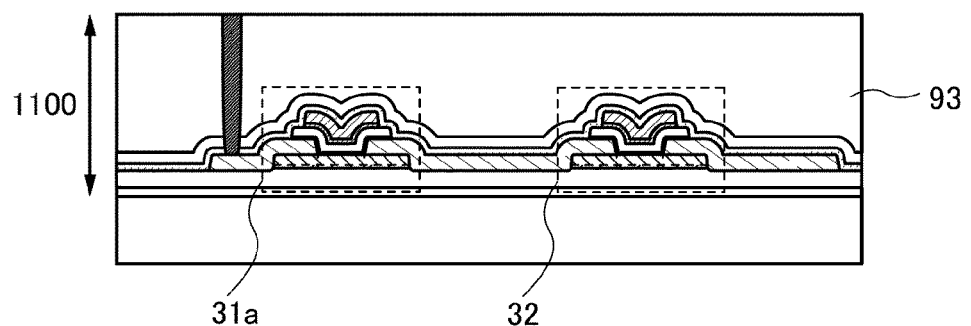
Figure 16C:
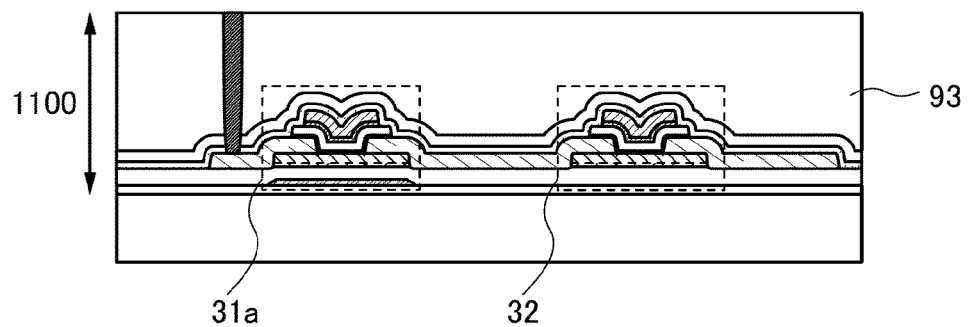

Note that although each transistor includes a back gate in FIG. 16A, each transistor does not necessarily include a back gate as illustrated in FIG. 16B. Alternatively, one or more transistors, for example, only the transistor 31a, as illustrated in FIG. 16C, may include a back gate. The back gate might be electrically connected to the transistor's front gate which faces the back gate. Note that different fixed potentials might be supplied to the back gate and the front gate. The presence or absence of the back gate can also be applied to another imaging device described in this embodiment.

Any of a variety of elements can be used as the photoelectric conversion elements 20a and 20b provided in the tier 1200. FIG. 16A illustrates the photoelectric conversion element 20a containing a selenium-based material in a photoelectric conversion layer 21. The photoelectric conversion elements 20a and 20b containing a selenium-based material have high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 21 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

The photoelectric conversion layer 21 may be a layer containing a compound of copper, indium, and selenium (CIS). Alternatively, a layer containing a compound of copper, indium, gallium, and selenium (CIGS) may be used. With the CIS or CIGS, a photoelectric conversion element that can utilize an avalanche phenomenon as in the case of using a single layer of selenium can be formed.

In the photoelectric conversion elements 20a and 20b containing the selenium-based material, for example, the photoelectric conversion layer 21 can be provided between a light-transmitting conductive layer 22 and an electrode 26 formed using a metal material or the like. Since CIS and CIGS are p-type semiconductors, an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, the combination of the OS transistor having high drain breakdown voltage and the photoelectric conversion element containing the selenium-based material in the photoelectric conversion layer can provide a highly sensitive and highly reliable imaging device.

Figure 17A:
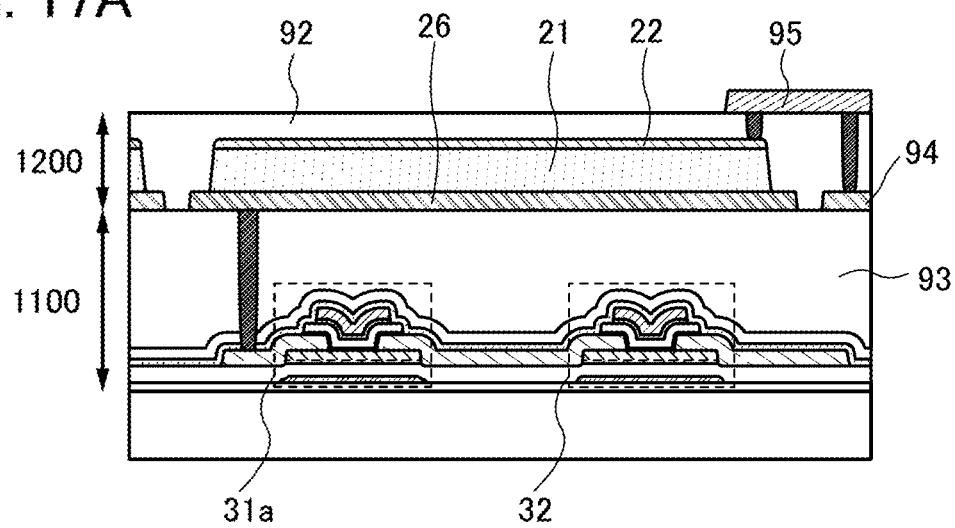
FIGS. 17A to 17C are cross-sectional views each illustrating the structure of an imaging device.
Figure 17B:
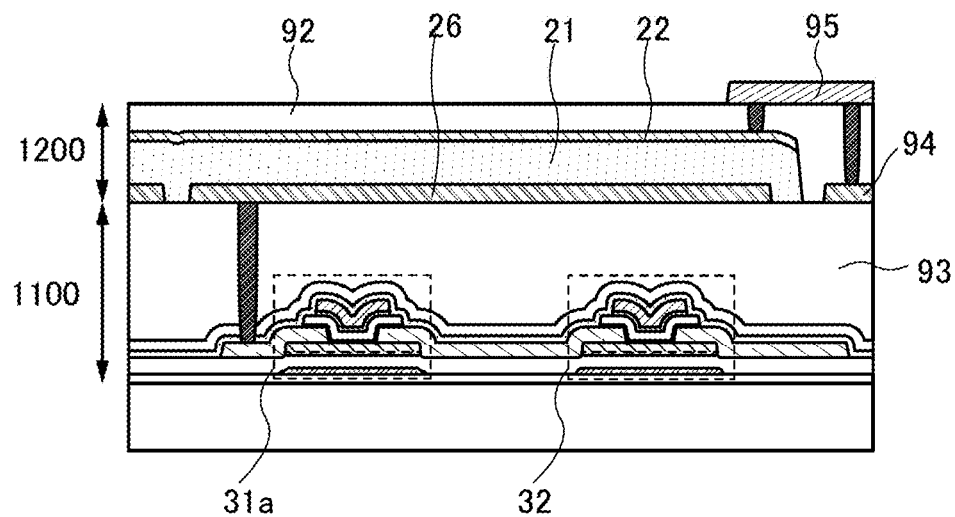
Figure 17C:
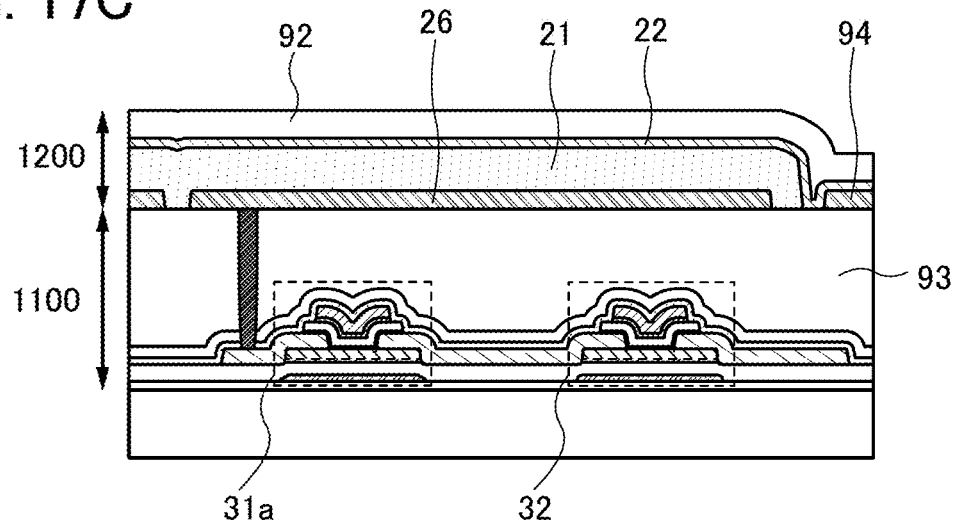
Figure 18A:
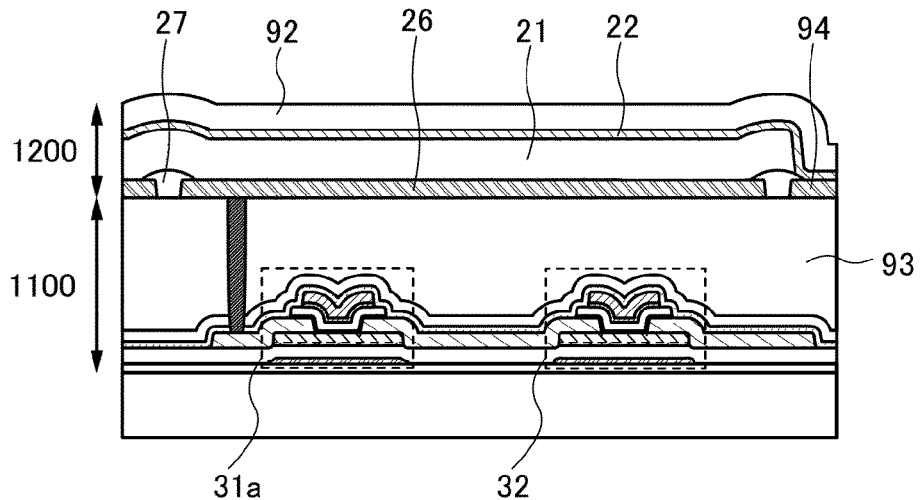
FIGS. 18A to 18C are cross-sectional views each illustrating the structure of an imaging device.

Although the photoelectric conversion layer 21 and the light-transmitting conductive layer 22 are not divided between pixels in FIG. 16A, they may be divided between circuits as illustrated in FIG. 17A. In a region between pixels where the electrode 26 is not provided, a partition wall 27 formed of an insulator is preferably provided, thereby preventing generation of a crack in the photoelectric conversion layer 21 and the light-transmitting conductive layer 22. However, the partition wall 27 is not necessarily provided as illustrated in FIG. 17B. Although the light-transmitting conductive layer 22 and a wiring 94 are connected to each other through a wiring 95 and a conductor 91 in FIG. 16A, the light-transmitting conductive layer 22 and the wiring 94 may be in direct contact with each other as in FIG. 17C and FIG. 18A.

Figure 18B:
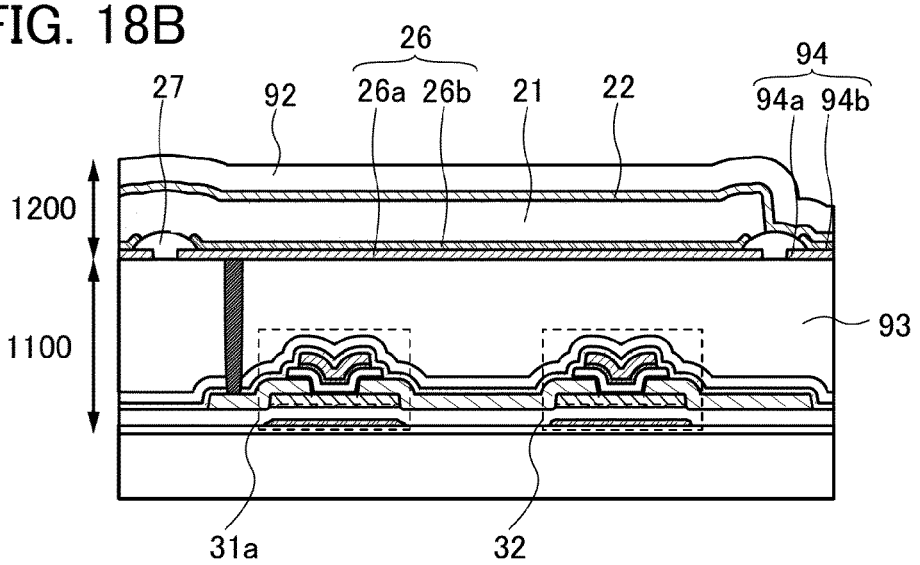

The electrode 26, the wiring 94, and the like may each be a multilayer. For example, as illustrated in FIG. 18B, the electrode 26 can include two conductive layers 26a and 26b and the wiring 94 can include two conductive layers 94a and 94b. In the structure in FIG. 18B, for example, the conductive layers 26a and 94a may be made of a low-resistance metal or the like, and the conductive layer 26b may be made of a metal or the like that exhibits an excellent contact property with the photoelectric conversion layer 21. Such a structure can improve the electrical characteristics of the photoelectric conversion element. Furthermore, even when the conductive layer 94a contains a metal that causes electrolytic corrosion by being in contact with the light-transmitting conductive layer 22, the electrolytic corrosion can be prevented because the conductive layer 94b is between the conductive layer 94a and the light-transmitting conductive layer 22.

The conductive layers 26a and 94a can be formed using, for example, aluminum, titanium, or a stack of titanium, aluminum, and titanium that are layered in this order. The conductive layers 26b and 94b can be formed using, for example, molybdenum, tungsten, or the like.

Figure 18C:
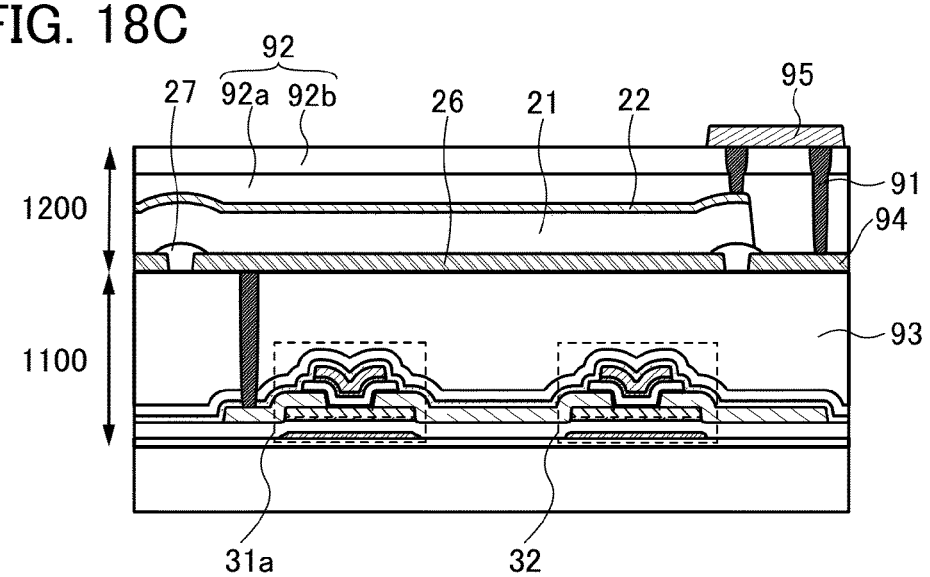

The insulating layer 92 and the like may each be a multilayer. In the case where the insulating layer 92 includes insulating layers 92a and 92b that have different etching rates as illustrated in FIG. 18C, for example, the conductor 91 has a difference in level. In the case where another insulating layer used as an interlayer insulating layer or a planarization film is a multilayer, the conductor 91 also has a difference in level. Although the insulating layer 92 is formed using two layers here, the insulating layer 92 and another insulating layer may each be formed using three or more layers.

Note that the partition wall 27 can be formed using an inorganic insulator, an insulating organic resin, or the like. The partition wall 27 may be colored black or the like in order to shield the transistors and the like from light and/or to determine the area of a light-receiving portion in each pixel.

As the photoelectric conversion elements 20a and 20b, a PIN diode element formed using an amorphous silicon film, a microcrystalline silicon film, or the like may be used.

Figure 19:
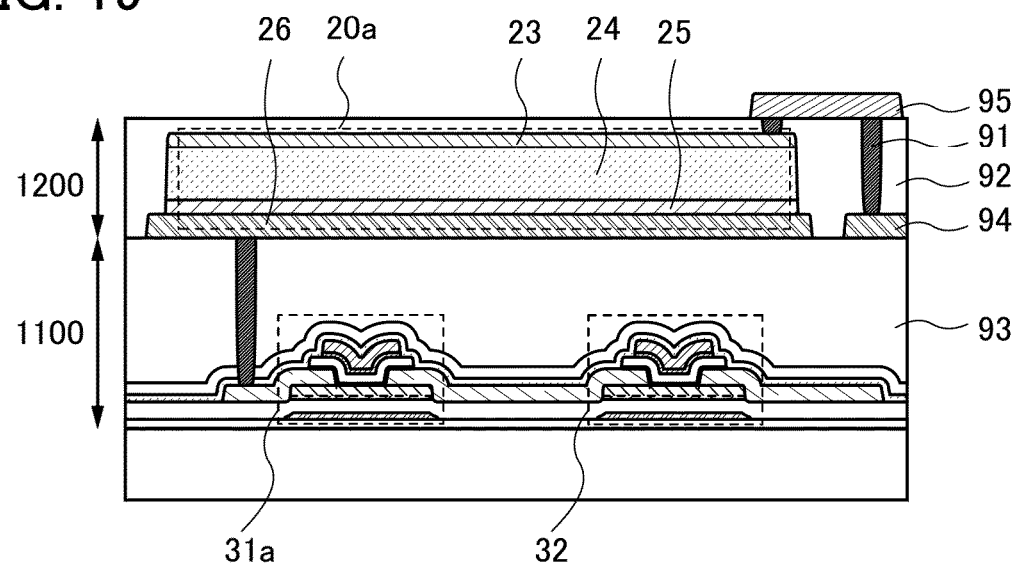
FIG. 19 is a cross-sectional view illustrating the structure of an imaging device.

FIG. 19 illustrates an example in which a thin film PIN photodiode is used as the photoelectric conversion element 20a. In the photodiode, a p-type semiconductor layer 25, an i-type semiconductor layer 24, and an n-type semiconductor layer 23 are stacked in this order. The i-type semiconductor layer 24 is preferably formed using amorphous silicon. The n-type semiconductor layer 23 and the p-type semiconductor layer 25 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

In the photoelectric conversion element 20a illustrated in FIG. 19, the p-type semiconductor layer 25 is electrically connected to the electrode 26. Furthermore, the n-type semiconductor layer 23 is electrically connected to the wiring 94 through the conductor 91.

FIGS. 20A to 20F show other examples of the structure of the photoelectric conversion element 20a having a configuration of a PIN thin film photodiode and the connection between the photoelectric conversion element 20a and the wirings. Note that the structure of the photoelectric conversion element 20a and the connection between the photoelectric conversion element 20a and the wirings are not limited thereto, and other configurations may be applied.

Figure 20A:
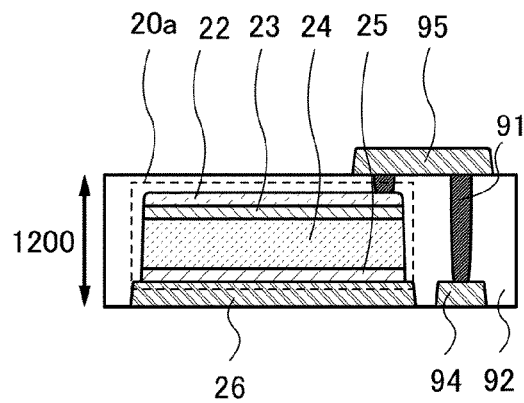
FIGS. 20A to 20F are cross-sectional views illustrating the structure of an imaging device.

FIG. 20A illustrates a structure of the photoelectric conversion element 20a that includes the light-transmitting conductive layer 22 in contact with the n-type semiconductor layer 23. The light-transmitting conductive layer 22 serves as an electrode and can increase the output current of the photoelectric conversion element 20a.

For the light-transmitting conductive layer 22, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 22 is not limited to a single layer, and may be a stacked layer of different films.

Figure 20B:
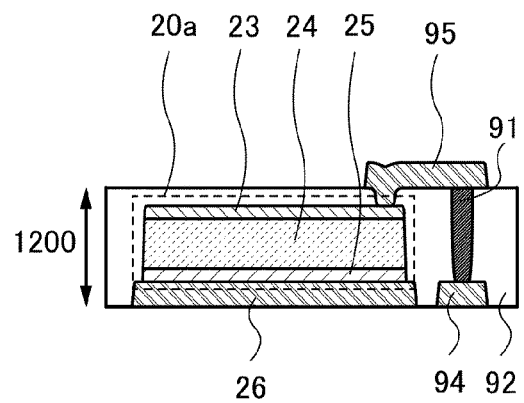

FIG. 20B illustrates a structure in which the n-type semiconductor layer 23 of the photoelectric conversion element 20a is directly connected to the wiring 95.

Figure 20C:
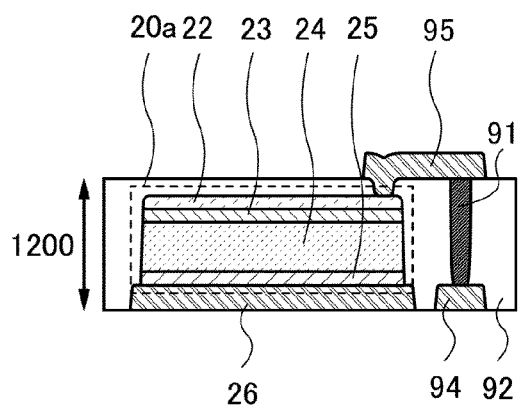

FIG. 20C illustrates a structure of the photoelectric conversion element 20a in which the light-transmitting conductive layer 22 is in contact with the n-type semiconductor layer 23 and the wiring 95 is electrically connected to the light-transmitting conductive layer 22.

Figure 20D:
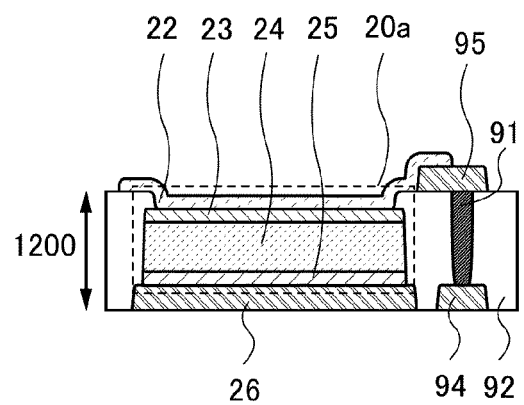

FIG. 20D illustrates a structure in which an opening exposing the n-type semiconductor layer 23 is provided in an insulating layer covering the photoelectric conversion element 20a, and the light-transmitting conductive layer 22 that covers the opening is electrically connected to the wiring 95.

Figure 20E:
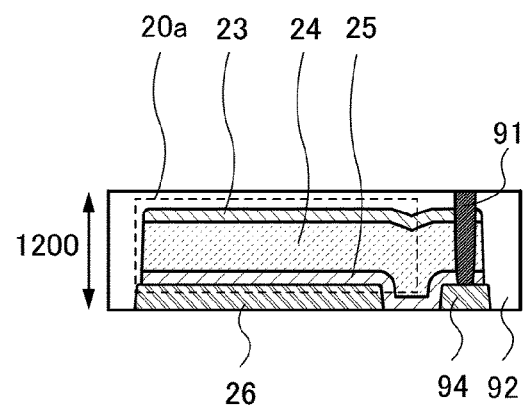

FIG. 20E illustrates a structure including the conductor 91 which penetrates the photoelectric conversion element 20a. In the structure, the wiring 94 is electrically connected to the n-type semiconductor layer 23 through the conductor 91. Note that in the drawing, the wiring 94 appears to be electrically connected to the electrode 26 through the p-type semiconductor layer 25. However, because of a high electric resistance in the lateral direction of the p-type semiconductor layer 25, the resistance between the wiring 94 and the electrode 26 is extremely high when there is an appropriate distance therebetween. Thus, the photoelectric conversion element 20a can have diode characteristics without a short circuit between the anode and the cathode. Note that two or more conductors 91 that are electrically connected to the n-type semiconductor layer 23 may be provided.

Figure 20F:
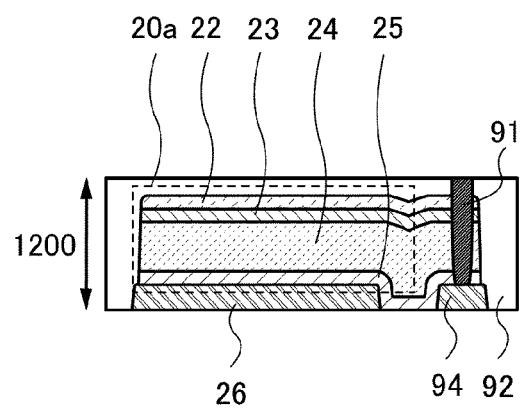

FIG. 20F illustrates a structure in which the photoelectric conversion element 20a in FIG. 20E is provided with the light-transmitting conductive layer 22 in contact with the n-type semiconductor layer 23.

Note that each of the photoelectric conversion elements 20a illustrated in FIGS. 20D to 20F has an advantage of having a large light-receiving area because wirings and the like do not overlap with a light-receiving region.

Figure 21:
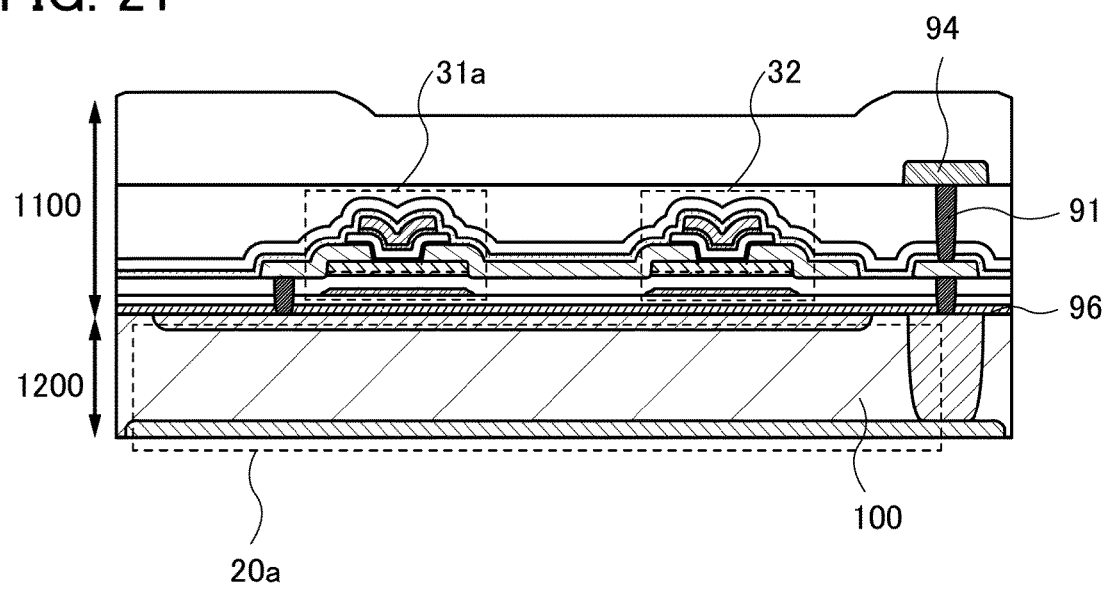
FIG. 21 is a cross-sectional view illustrating the structure of an imaging device.

Alternatively, as illustrated in FIG. 21, the photoelectric conversion element 20a may be a photodiode including a silicon substrate 100 as a photoelectric conversion layer.

The photoelectric conversion element 20b formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 21 does not need to be divided between circuits as illustrated in FIG. 16A. Therefore, the imaging device of one embodiment of the present invention can be manufactured with a high yield at low cost. In contrast, a photodiode including the silicon substrate 100 as the photoelectric conversion layer requires difficult processes such as a polishing process and a bonding process.

Figure 22A:
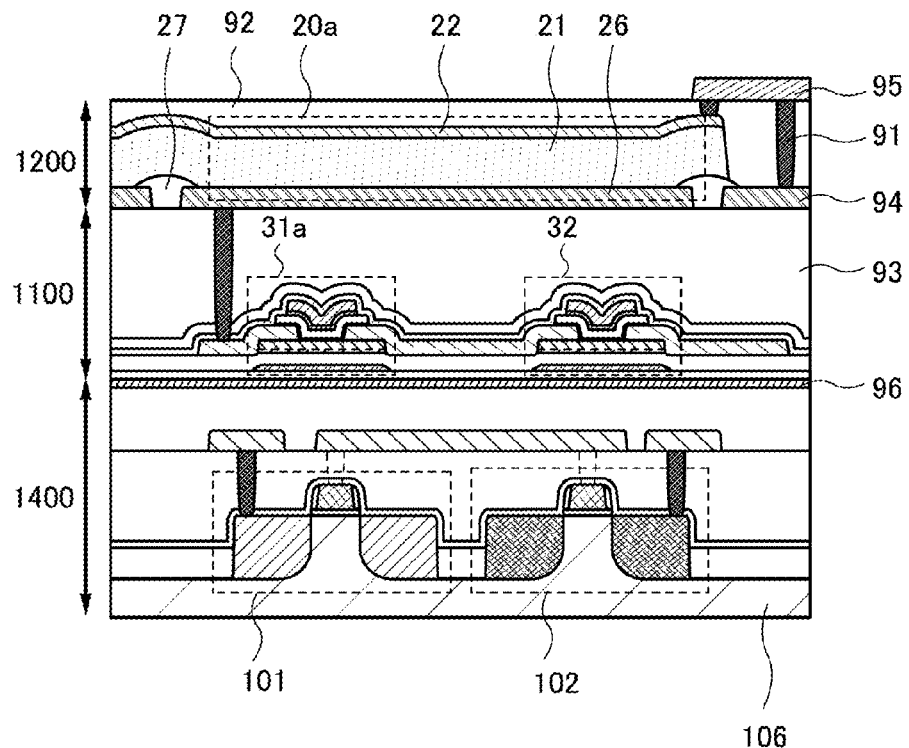
FIGS. 22A to 22C are cross-sectional views and a circuit diagram illustrating the structure of an imaging device.
Figure 22B:
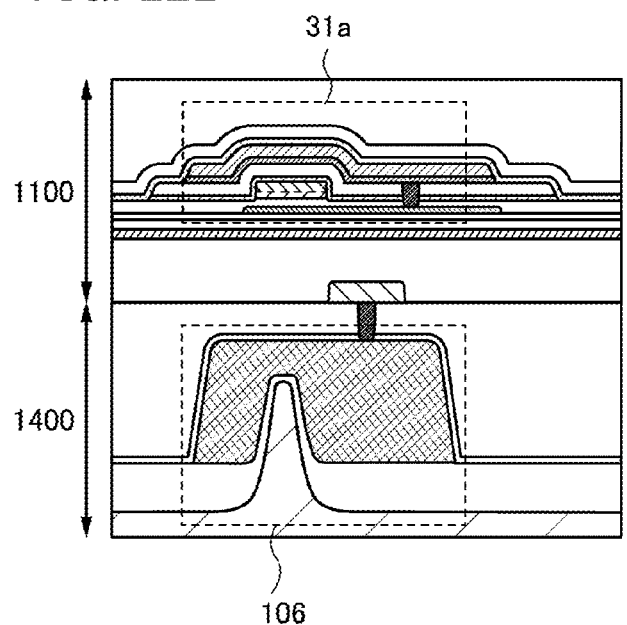

Furthermore, in the imaging device of one embodiment of the present invention, a silicon substrate 106 in which a circuit is formed may be used. For example, as illustrated in FIG. 22A, the pixel circuit may overlap with a tier 1400 that includes a transistor 101 and a transistor 102 whose active regions are formed in the silicon substrate 106. FIG. 22B is a cross-sectional view illustrating the transistors in the channel width direction.

Figure 22C:
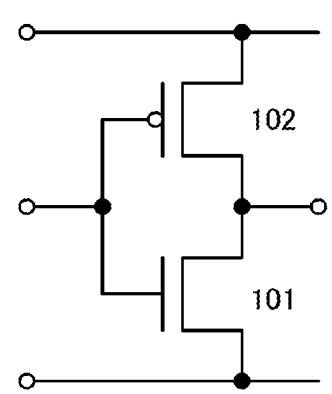

The circuit formed in the silicon substrate 106 is capable of reading a signal outputted from the pixel circuit and converting the signal, for example. The circuit may include, for example, a CMOS inverter as illustrated in the circuit diagram in FIG. 22C. A gate of the transistor 101 (n-channel transistor) is electrically connected to a gate of the transistor 102 (p-channel transistor). One of a source and a drain of one of the transistors 101 and 102 is electrically connected to one of a source and a drain of the other transistor. The other of the source and the drain of the one transistor and the other of the source and the drain of the other transistor are electrically connected to different wirings.

Each of the silicon substrate 100 and the silicon substrate 106 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 21 and FIG. 22A, an insulating layer 96 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers provided in the vicinity of the oxide semiconductor layer that is the active layer of the transistor 31a or the like causes generation of carriers in the oxide semiconductor layer, and thus may reduce the reliability of the transistor 31a or the like. For this reason, the insulating layer 96 that has a function of preventing diffusion of hydrogen is preferably provided between one layer including the Si transistor and another layer stacked thereover that includes the OS transistor. Hydrogen is confined in the one layer owing to the insulating layer 96, so that the reliability of the transistors 101 and 102 can be improved. Furthermore, diffusion of hydrogen from the one layer to the other layer is inhibited, leading to an improvement in the reliability of the transistor 31a or the like.

The insulating layer 96 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 22A, a circuit (e.g., a driver circuit) formed in the silicon substrate 106, the transistor 31a or the like, and the photoelectric conversion element 20a or the like can overlap with each other; thus, the integration degree of pixels can be increased. In other words, the resolution of the imaging device can be increased. Such a structure is suitable for an imaging device with, for example, 4K2K, 8K4K, or 16K8K pixels. Note that since the 8K4K imaging device includes thirty-three million pixels, it can also be referred to as "33M." Furthermore, for example, a structure may be employed in which Si transistors are formed as the transistors 34 and 35 included in the pixel 10 and there is a region where the transistors 34 and 35 overlap with the transistors 31a, 31b, 32, and 33 and the photoelectric conversion element 20a. In that case, the transistors 31a, 31b, 32, and 33 are OS transistors.

In the imaging device in FIG. 22A, the photoelectric conversion element 20a is not provided on the silicon substrate 106. Therefore, an optical path for the photoelectric conversion element 20a can be ensured without being influenced by the transistors or wirings, and a pixel with a high aperture ratio can be formed.

Figure 23A:
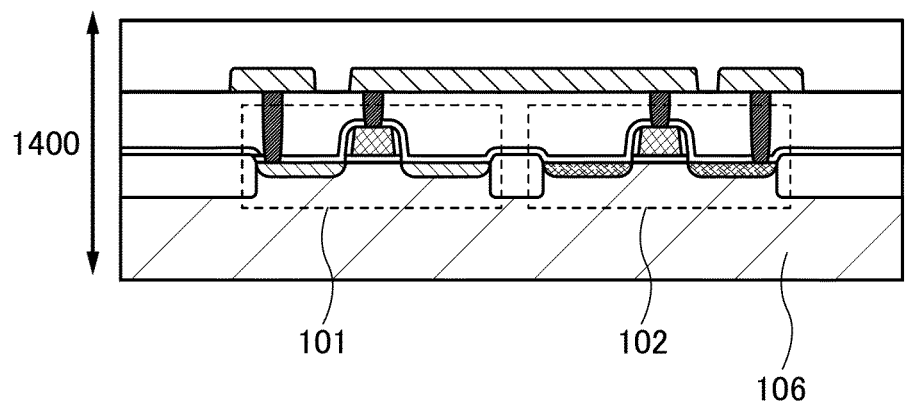
FIGS. 23A and 23B are cross-sectional views illustrating the structure of an imaging device.
Figure 23B:
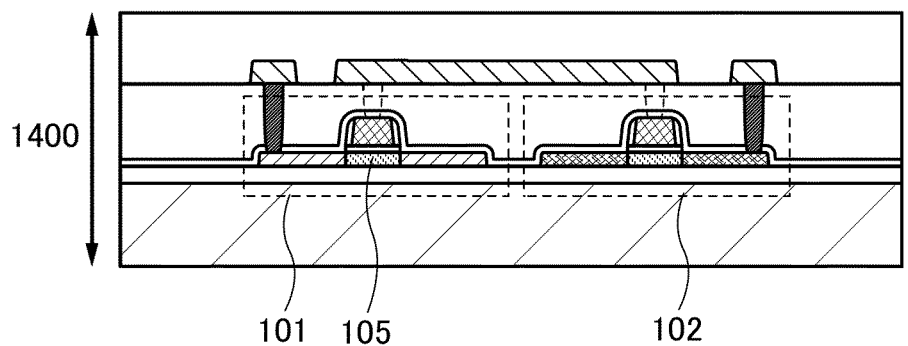

Although FIGS. 22A and 22B show fin type Si transistors, planar type transistors may be used as illustrated in FIG. 23A. Alternatively, as illustrated in FIG. 23B, transistors each including an active layer 105 formed using a silicon thin film may be used. The active layer 105 can be formed using polycrystalline silicon or single crystal silicon of a silicon-on-insulator (SOI) structure.

Figure 24:
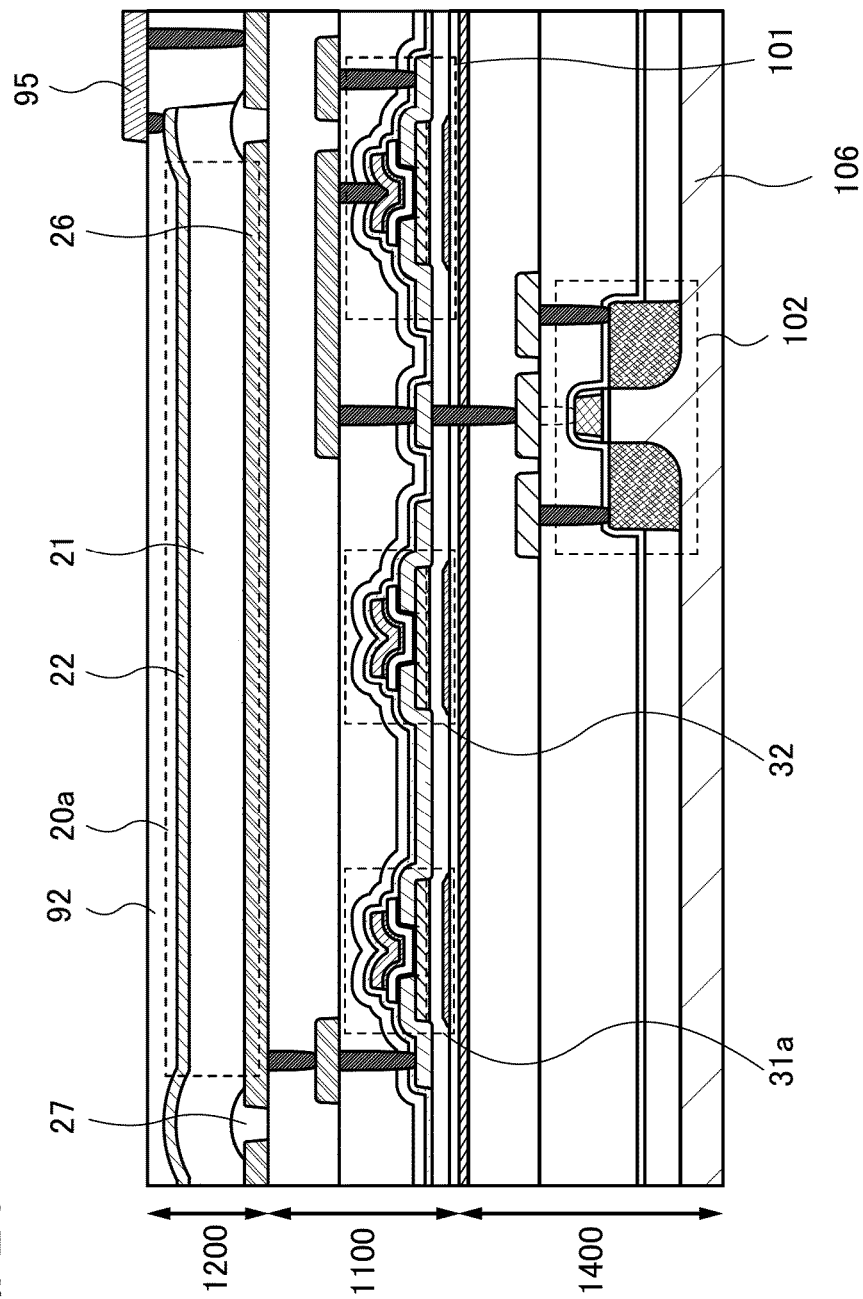
FIG. 24 is a cross-sectional view illustrating the structure of an imaging device.

The imaging device of one embodiment of the present invention can also have a structure in FIG. 24.

An imaging device in FIG. 24 is a modification example of the imaging device in FIG. 22A. A CMOS inverter is formed using an OS transistor and a Si transistor.

Here, the transistor 102 provided in the tier 1400 is a p-channel Si transistor, and the transistor 101 provided in the tier 1100 is an n-channel OS transistor. When only the p-channel transistor is provided in the silicon substrate 106, a step of forming a well, an n-type impurity layer, or the like can be omitted.

Although selenium or the like is used for the photoelectric conversion element 20a in the imaging device in FIG. 24, a thin film PIN photodiode may be used as in FIG. 19.

In the imaging device in FIG. 24, the transistor 101 can be formed through the same process as the transistors 31a, 31b, and 32 formed in the tier 1100. Thus, the manufacturing process of the imaging device can be simplified.

Figure 25:
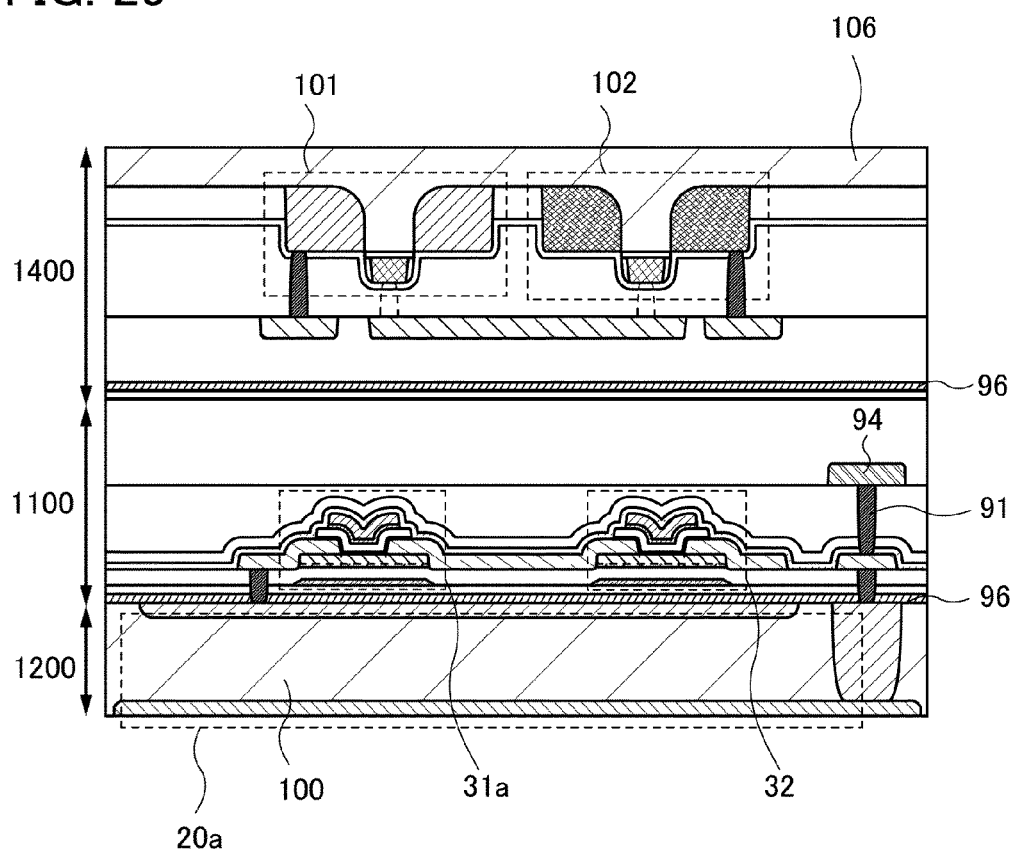
FIG. 25 is a cross-sectional view illustrating the structure of an imaging device.

As illustrated in FIG. 25, the imaging device of one embodiment of the present invention may have a structure where a pixel and the silicon substrate 106 in which a circuit is formed are attached to each other. Note that the pixel includes a photodiode formed in the silicon substrate 100 and OS transistors formed over the photodiode. Such a structure facilitates an increase in the effective area of the photodiode formed in the silicon substrate 100. Furthermore, when the integration degree of the circuit formed in the silicon substrate 106 is improved using miniaturized Si transistors, a high-performance semiconductor device can be provided.

Note that the structure, the connection relationship, or the like of the photoelectric conversion element 20a and the transistor 31a shown in FIGS. 16A to 16C to FIG. 25 can be employed to those of the photoelectric conversion element 20b and the transistor 31b.

Figure 26A:
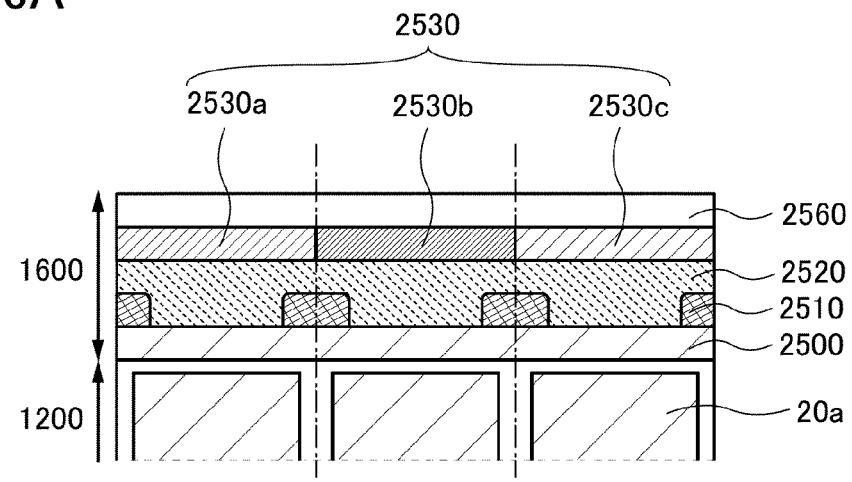
FIGS. 26A to 26C are cross-sectional views illustrating the structure of an imaging device.

FIG. 26A is a cross-sectional view of an example of a mode in which a color filter and the like are added to the imaging device. The cross-sectional view illustrates part of a region including pixel circuits of three pixels. An insulating layer 2500 is formed over the tier 1200 where the photoelectric conversion elements 20a and 20b are formed. As the insulating layer 2500, a silicon oxide film or the like with a high visible-light transmitting property can be used. A silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film that functions as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530*b*, and the color filter 2530*c* each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 26B:
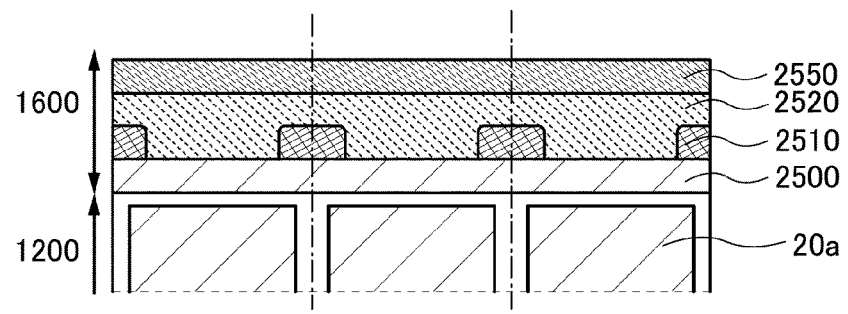

As illustrated in FIG. 26B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

When a scintillator is used for the optical conversion layer 2550, an imaging device that takes an image visualizing the intensity of radiation, which is used for an X-ray imaging device or the like, can be obtained. Radiation such as X-rays that passes through a subject to enter a scintillator is converted into light (fluorescence) such as visible light or ultraviolet light owing to a phenomenon known as photoluminescence. Then, the photoelectric conversion elements 20*a* and 20*b* detect the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. Materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known, for example.

In the photoelectric conversion elements 20*a* and 20*b* containing a selenium-based material, radiation such as X-rays can be directly converted into charge; thus, the scintillator is unnecessary.

A microlens array 2540 may be provided over the color filters 2530*a*, 2530*b*, and 2530*c*. Light transmitting lenses included in the microlens array 2540 passes through the color filters positioned thereunder and enters the photoelectric conversion element 20*a* and the photoelectric conversion element 20*b*. Note that a region other than the tier 1200 in FIGS. 26A to 26C is referred to as a layer 1600.

Figure 26C:
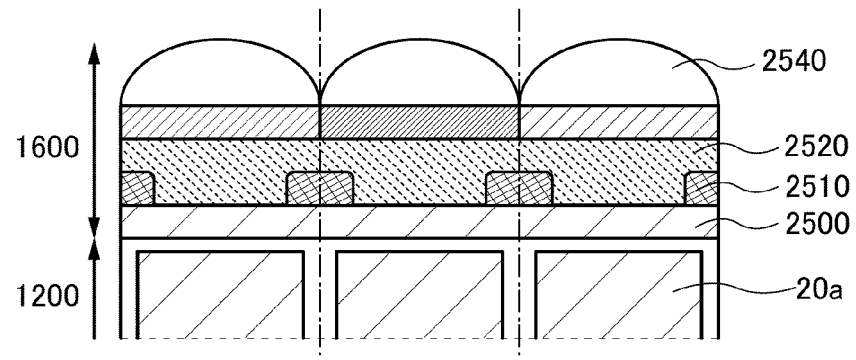
Figure 27:
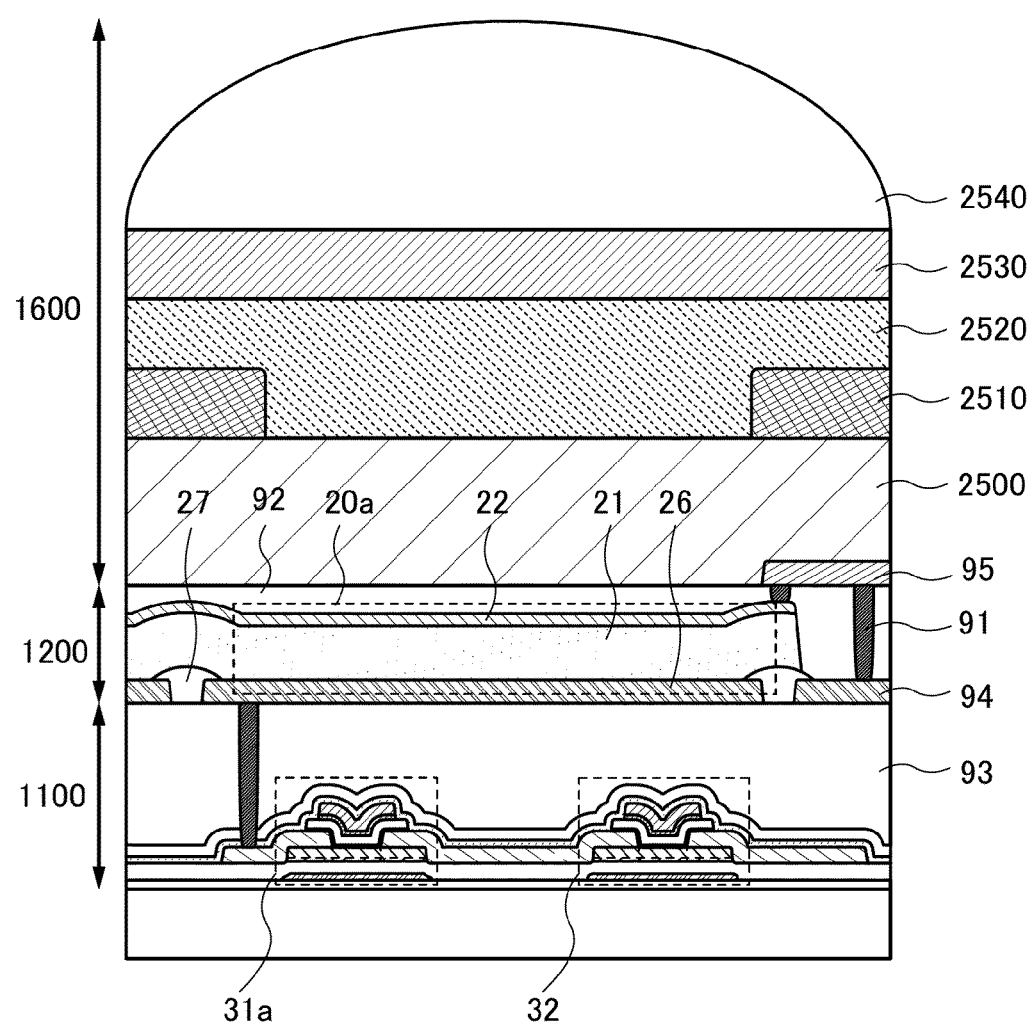
FIG. 27 is a cross-sectional view illustrating the structure of an imaging device.
Figure 28:
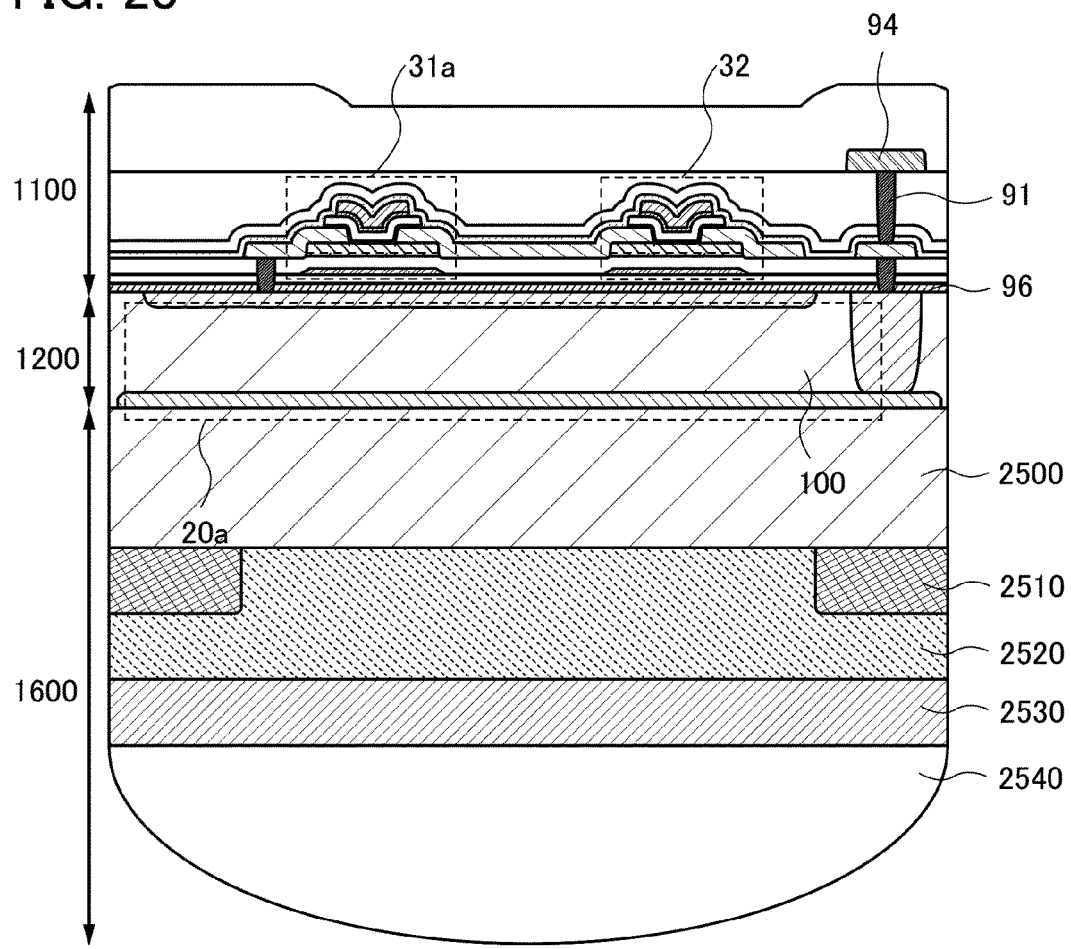
FIG. 28 is a cross-sectional view illustrating the structure of an imaging device.

The specific structure of the imaging device in FIG. 26C is illustrated in FIG. 27 by taking an example of the imaging device in FIG. 16A. In addition, the specific structure of the imaging device in FIG. 26C is illustrated in FIG. 28 by taking an example of the imaging device in FIG. 21.

Figure 29:
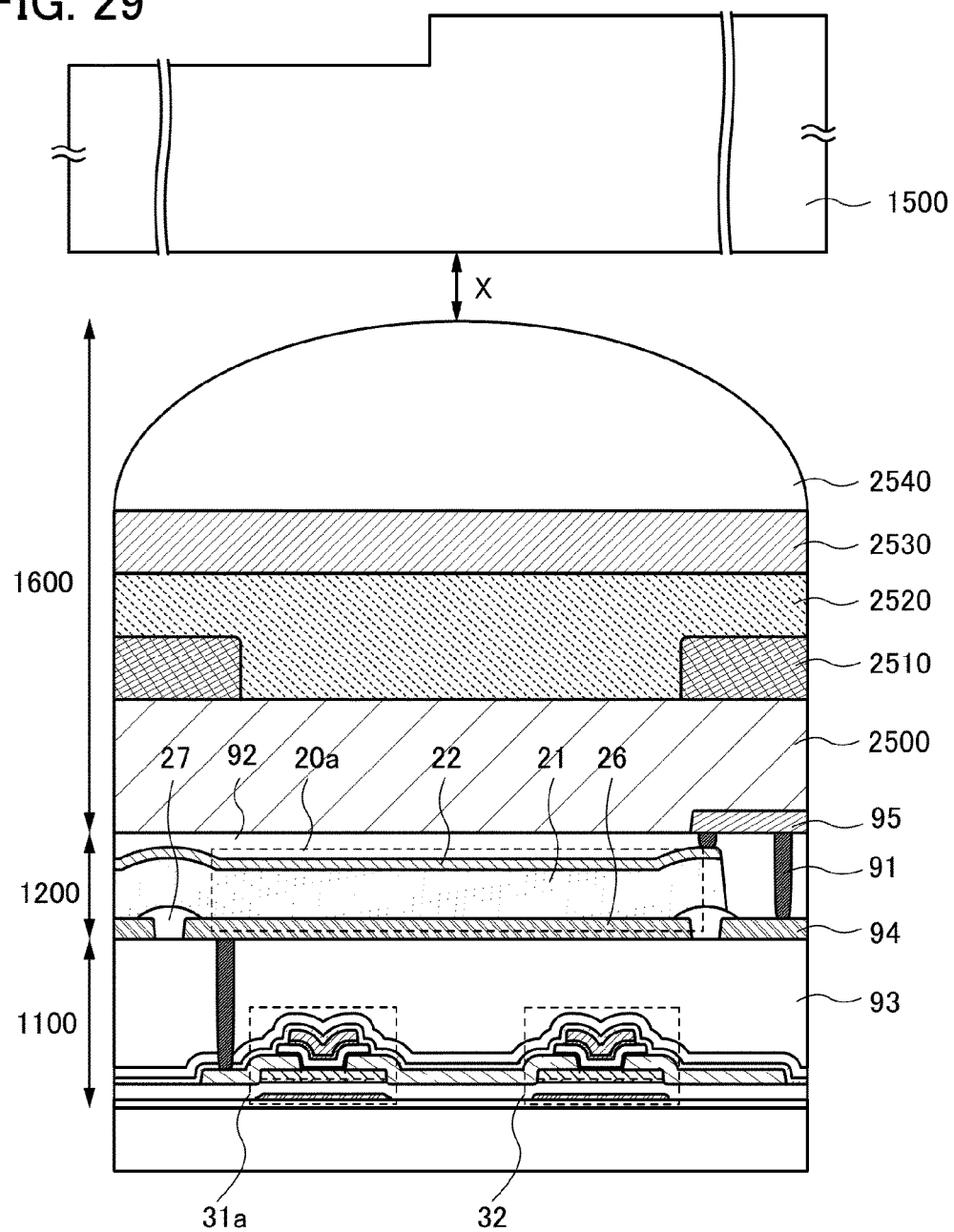
FIG. 29 is a cross-sectional view illustrating the structure of an imaging device.
Figure 30:
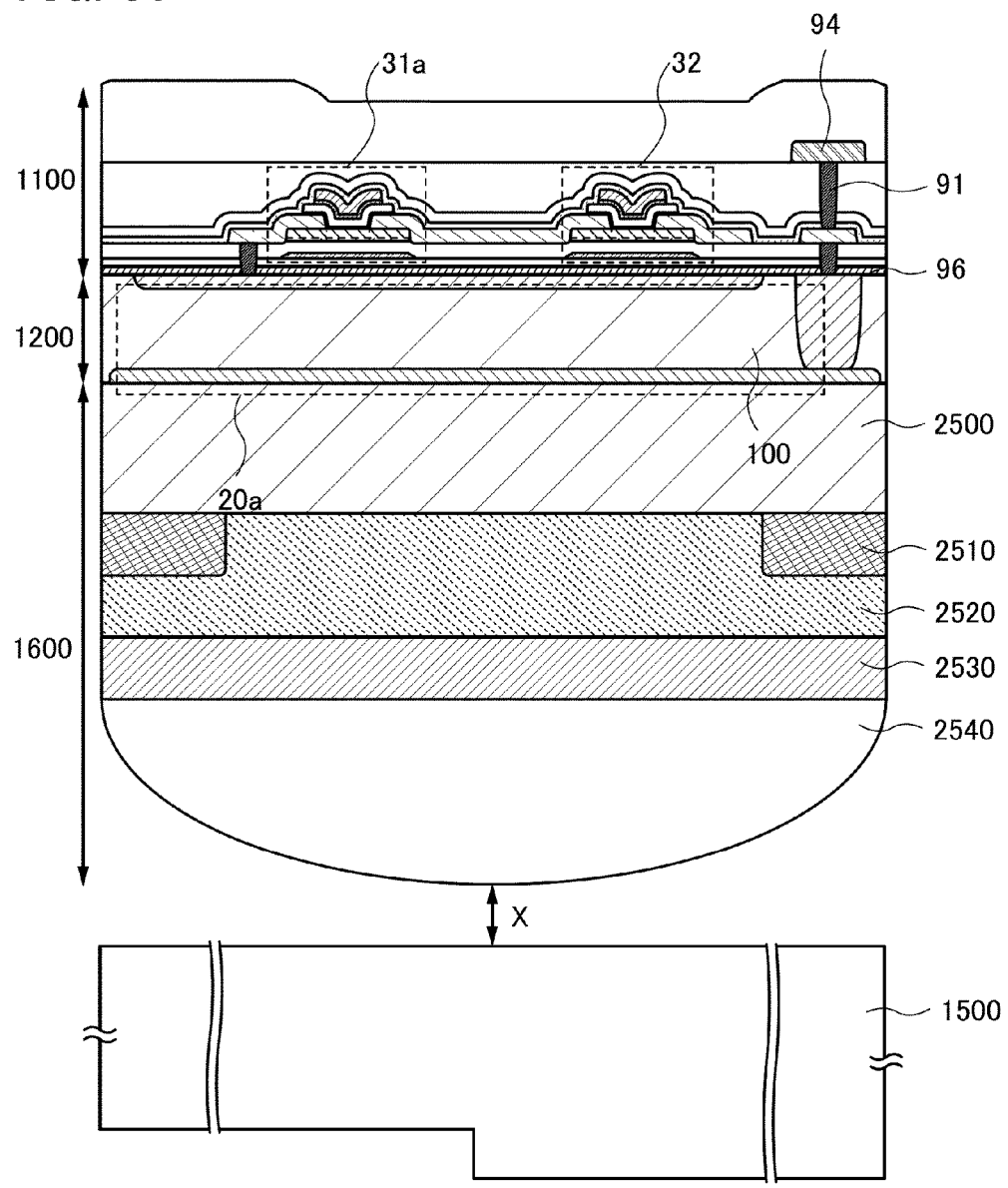
FIG. 30 is a cross-sectional view illustrating the structure of an imaging device.

The imaging device of one embodiment of the present invention may be combined with a diffraction grating 1500 as illustrated in FIG. 29 and FIG. 30. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Further alternatively, a stack including the inorganic insulating film and the organic insulating film may be used.

The diffraction grating 1500 can be formed by a lithography process using a photosensitive resin or the like. Alternatively, the diffraction grating 1500 can be formed by a lithography process and an etching process. Further alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, and preferably less than or equal to 100 µm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Further alternatively, a liquid such as silicone oil may be provided. Even in the case where the microlens array 2540 is not provided, the space X may be provided between the color filter 2530 and the diffraction grating 1500.

As illustrated in FIG. 31A1 and FIG. 31B1, the imaging device of one embodiment of the present invention may be bent. FIG. 31A1 illustrates a state in which the imaging device is bent in the direction of dashed-two dotted line X1-X2. FIG. 31A2 is a cross-sectional view illustrating a portion indicated by dashed-two dotted line X1-X2 in FIG. 31A1. FIG. 31A3 is a cross-sectional view illustrating a portion indicated by dashed-two dotted line Y1-Y2 in FIG. 31A1.

FIG. 31B1 illustrates a state where the imaging device is bent in the direction of dashed-two dotted line X3-X4 and the direction of dashed-two dotted line Y3-Y4. FIG. 31B2 is a cross-sectional view illustrating a portion indicated by dashed-two dotted line X3-X4 in FIG. 31B1. FIG. 31B3 is a cross-sectional view illustrating a portion indicated by dashed-two dotted line Y3-Y4 in FIG. 31B1.

Bending the imaging device can reduce field curvature and astigmatism. Thus, the optical design of a lens or the like, which is used in combination of the imaging device, can be facilitated. For example, the number of lenses used for aberration correction can be reduced; accordingly, the size or weight of semiconductor device or the like including the imaging device can be easily reduced. In addition, the quality of a captured image can be improved.

This embodiment can be implemented in appropriate combination with any of the structures described in the other embodiments.

Embodiment 4

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 32A:
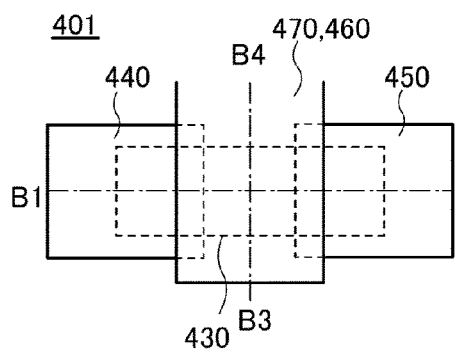
FIGS. 32A to 32F are top views and cross-sectional views illustrating transistors.
Figure 32B:
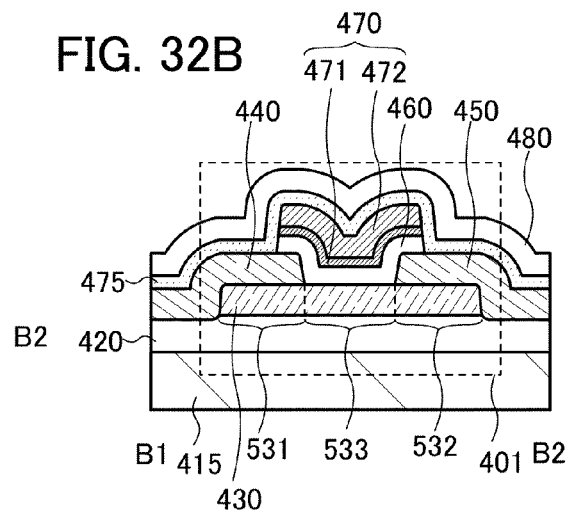
Figure 34A:
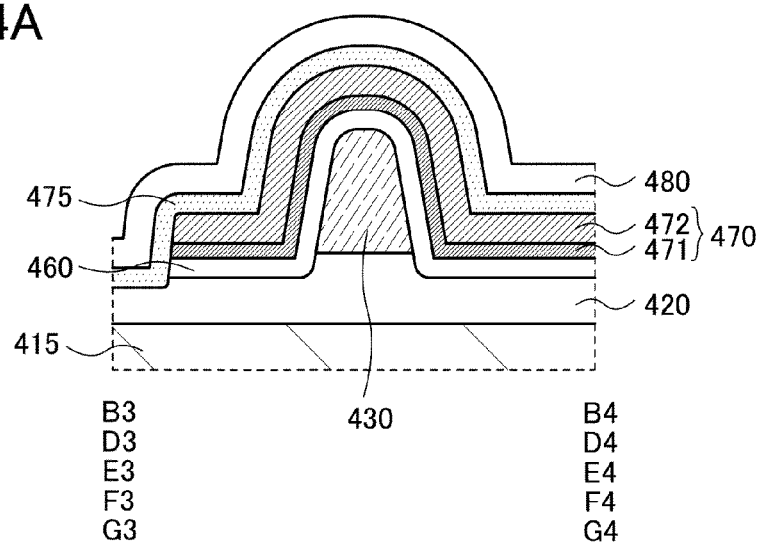
FIGS. 34A to 34D each illustrate a cross section of a transistor in a channel width direction.

FIG. 32A is a top view illustrating a transistor 401 in one embodiment of the present invention. A cross section in the direction of dashed-dotted line B1-B2 in FIG. 32A is illustrated in FIG. 32B. A cross section in the direction of dashed-dotted line B3-B4 in FIG. 32A is illustrated in FIG. 34A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating layer 420, an oxide semiconductor layer 430, a conductive layer 440, a conductive layer 450, an insulating layer 460, a conductive layer 470, an insulating layer 475, and an insulating layer 480.

The insulating layer 420 is in contact with the substrate 415. The oxide semiconductor layer 430 is in contact with the insulating layer 420. The conductive layer 440 and the conductive layer 450 are in contact with the insulating layer 420 and the oxide semiconductor layer 430. The insulating layer 460 is in contact with the insulating layer 420, the oxide semiconductor layer 430, the conductive layer 440, and the conductive layer 450. The conductive layer 470 is in contact with the insulating layer 460. The insulating layer 475 is in contact with the insulating layer 420, the conductive layer 440, the conductive layer 450, and the conductive layer 470. The insulating layer 480 is in contact with the insulating layer 475.

Here, in the oxide semiconductor layer 430, a region overlapping with the conductive layer 440, a region overlapping with the conductive layer 450, and a region overlapping with the insulating layer 460 are referred to as a region 531, a region 532, and a region 533, respectively.

Furthermore, the conductive layers 440 and 450 are electrically connected to the oxide semiconductor layer 430.

The conductive layer 440 can function as one of a source and a drain. The conductive layer 450 functions as the other of the source and the drain. The insulating layer 460 functions as a gate insulating layer. The conductive layer 470 functions as a gate.

The region 531, the region 532, and the region 533 which are illustrated in FIG. 32B functions as one of a source region and a drain region, the other of the source region and the drain region, and a channel formation region, respectively.

Each of the conductive layers 440 and 450 is a single layer in the drawing, but also may be a stack of two or more layers. The conductive layer 470 includes two layers, a conductive layer 471 and a conductive layer 472, in the drawing, but also may be a single layer or a stack of three or more layers. The same applies to other transistors described in this embodiment.

The insulating layer 480 may function as a planarization film as necessary.

Figure 32C:
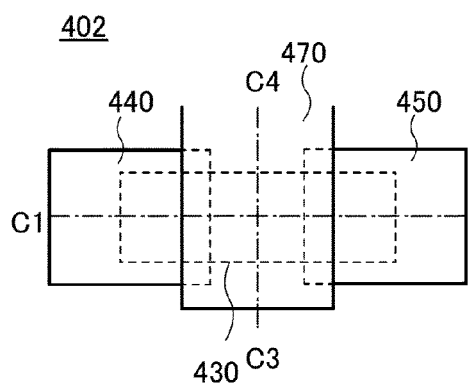
Figure 32D:
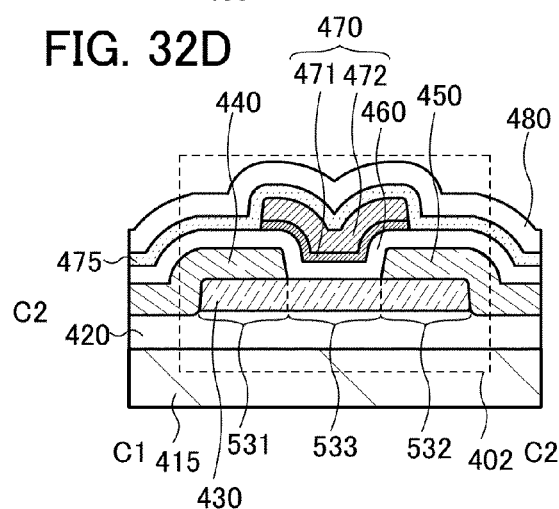
Figure 34B:
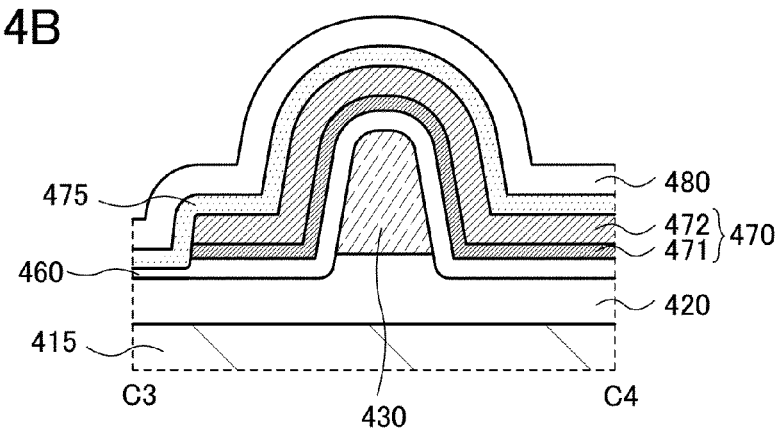

The transistor in one embodiment of the present invention may have a structure illustrated in FIGS. 32C and 32D. FIG. 32C is a top view of a transistor 402. A cross section in the direction of dashed-dotted line C1-C2 in FIG. 32C is illustrated in FIG. 32D. A cross section in the direction of dashed-dotted line C3-C4 in FIG. 32C is illustrated in FIG. 34B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating layer 460 is not aligned with an end portion of the conductive layer 470. In the transistor 402, wide areas of the conductive layers 440 and 450 are covered with the insulating layer 460 and accordingly the electric resistance between the conductive layer 470 and the conductive layers 440 and 450 is high; therefore, the transistor 402 has a feature of low gate leakage current.

The transistors 401 and 402 each have a top-gate structure including regions where the conductive layer 470 overlaps with the conductive layers 440 and 450. To reduce parasitic capacitance, the width of each of the regions in the channel length direction is preferably greater than or equal to 3 nm and less than 300 nm. Since an offset region is not formed in the oxide semiconductor layer 430 in this structure, a transistor with a high on-state current can be easily formed.

Figure 32E:
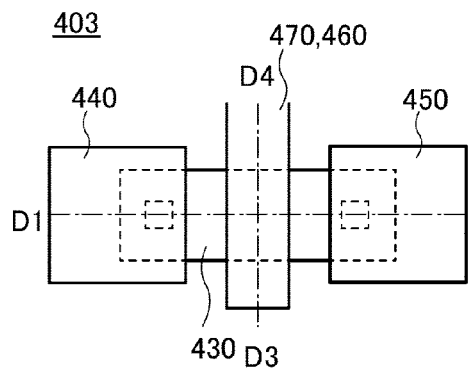
Figure 32F:
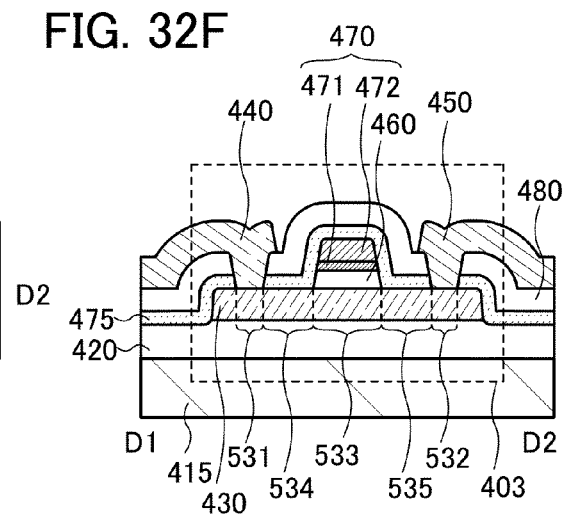

The transistor in one embodiment of the present invention may have a structure illustrated in FIGS. 32E and 32F. FIG. 32E is a top view of a transistor 403. A cross section in the direction of dashed-dotted line D1-D2 in FIG. 32E is illustrated in FIG. 32F. A cross section in the direction of dashed-dotted line D3-D4 in FIG. 32E is illustrated in FIG. 34A. The direction of dashed-dotted line D1-D2 is referred to as a channel length direction, and the direction of dashed-dotted line D3-D4 is referred to as a channel width direction.

In the transistor 403, the insulating layer 420 is in contact with the substrate 415; the oxide semiconductor layer 430 is in contact with the insulating layer 420; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, and the conductive layer 470; the insulating layer 480 is in contact with the insulating layer 475; and the conductive layer 440 and the conductive layer 450 are in contact with the oxide semiconductor layer 430 and the insulating layer 480.

Openings are formed in the insulating layers 475 and 480, and the conductive layers 440 and 450 are electrically connected to the oxide semiconductor layer 430 through the openings.

The transistor 403 may further include, for example, an insulating layer (planarization film) in contact with the conductive layers 440 and 450 and the insulating layer 480 as necessary.

In the oxide semiconductor layer 430, a region that overlaps with the insulating layer 475 and is sandwiched between the region 531 and the region 533 is referred to as a region 534, and a region that overlaps with the insulating layer 475 and is sandwiched between the region 532 and the region 533 is referred to as a region 535.

Figure 33A:
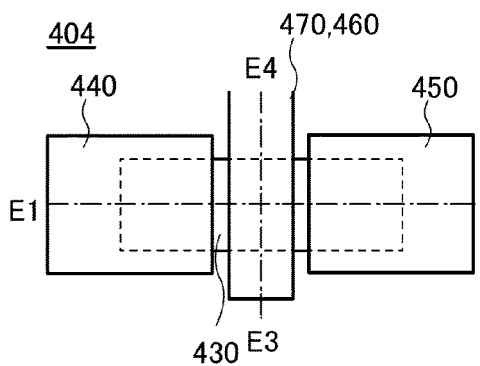
FIGS. 33A to 33F are top views and cross-sectional views illustrating transistors.
Figure 33B:
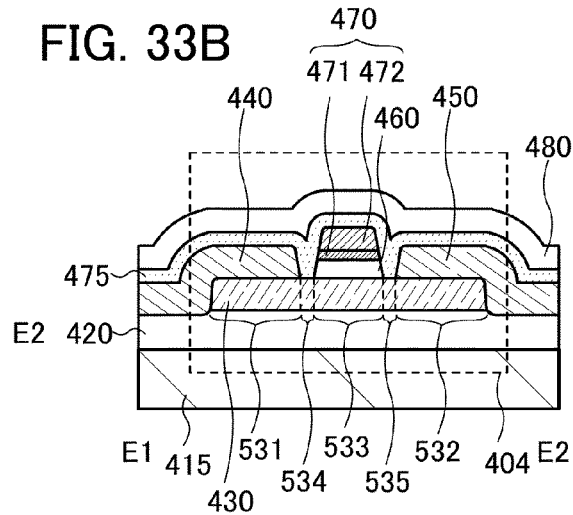

The transistor in one embodiment of the present invention may have a structure illustrated in FIGS. 33A and 33B. FIG. 33A is a top view of a transistor 404. A cross section in the direction of dashed-dotted line E1-E2 in FIG. 33A is illustrated in FIG. 33B. A cross section in the direction of dashed-dotted line E3-E4 in FIG. 33A is illustrated in FIG. 34A. The direction of dashed-dotted line E1-E2 is referred to as a channel length direction, and the direction of dashed-dotted line E3-E4 is referred to as a channel width direction in some cases.

In the transistor 404, the insulating layer 420 is in contact with the substrate 415; the oxide semiconductor layer 430 is in contact with the insulating layer 420; the conductive layers 440 and 450 are in contact with the insulating layer 420 and the oxide semiconductor layer 430; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, the conductive layer 440, the conductive layer 450, and the conductive layer 470; and the insulating layer 480 is in contact with the insulating layer 475.

The transistor 404 is different from the transistor 403 in that the conductive layers 440 and 450 in contact with the oxide semiconductor layer 430 cover end portions of the oxide semiconductor layer 430.

The transistors 403 and 404 each have a self-aligned structure that does not include regions where the conductive layer 470 overlaps with the conductive layers 440 and 450. A transistor with a self-aligned structure, which has extremely low parasitic capacitance between a gate and a source and between the gate and a drain, is suitable for applications that require high-speed operation.

Figure 33C:
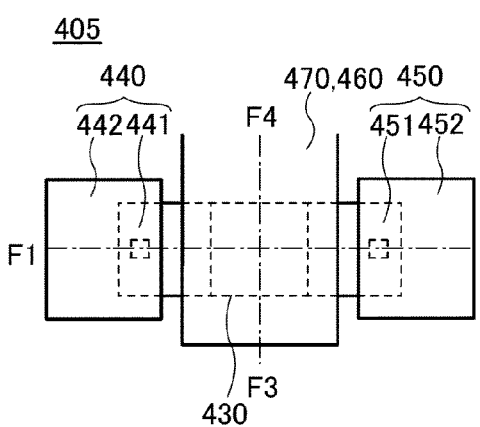
Figure 33D:
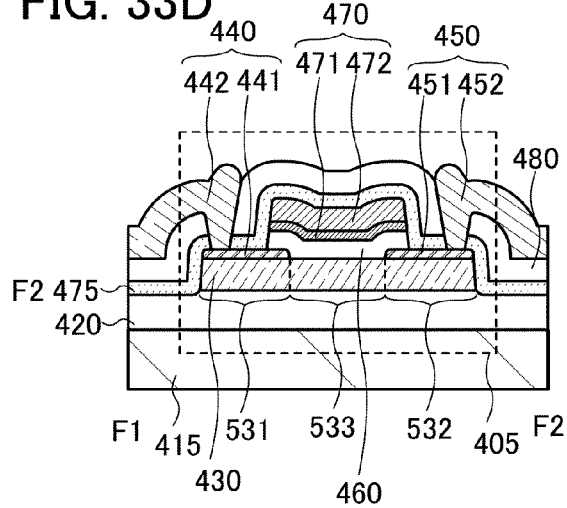

The transistor in one embodiment of the present invention may have a structure illustrated in FIGS. 33C and 33D. FIG. 33C is a top view of a transistor 405. A cross section in the direction of dashed-dotted line F1-F2 in FIG. 33C is illustrated in FIG. 33D. A cross section in the direction of dashed-dotted line F3-F4 in FIG. 33C is illustrated in FIG. 34A. The direction of dashed-dotted line F1-F2 is referred to as a channel length direction, and the direction of dashed-dotted line F3-F4 is referred to as a channel width direction in some cases.

In the transistor 405, the conductive layer 440 includes two layers, a conductive layer 441 and a conductive layer 442, and the conductive layer 450 includes two layers, a conductive layer 451 and a conductive layer 452. The insulating layer 420 is in contact with the substrate 415. The oxide semiconductor layer 430 is in contact with the insulating layer 420. The conductive layer 441 and the conductive layer 451 are in contact with the oxide semiconductor layer 430. The insulating layer 460 is in contact with the insulating layer 420, the oxide semiconductor layer 430, the conductive layer 441, and the conductive layer 451. The conductive layer 470 is in contact with the insulating layer 460. The insulating layer 475 is in contact with the insulating layer 420, the conductive layer 441, the conductive layer 451, and the conductive layer 470. The insulating layer 480 is in contact with the insulating layer 475. The conductive layer 442 is in contact with the conductive layer 441 and the insulating layer 480. The conductive layer 452 is in contact with the conductive layer 451 and the insulating layer 480.

The conductive layers 441 and 451 are in contact with the top surface of the oxide semiconductor layer 430 and are not in contact with a side surface of the oxide semiconductor layer 430.

The transistor 405 may further include, for example, an insulating layer in contact with the conductive layers 442 and 452 and the insulating layer 480 as necessary.

The conductive layer 441 and the conductive layer 451 are electrically connected to the oxide semiconductor layer 430. Furthermore, the conductive layer 442 is electrically connected to the conductive layer 441, and the conductive layer 452 is electrically connected to the conductive layer 451.

In the oxide semiconductor layer 430, a region overlapping with the conductive layer 441 is the region 531 that can function as one of a source region and a drain region, and a region overlapping with the conductive layer 451 is the region 532 that can function as the other of the source region and the drain region.

Figure 33E:
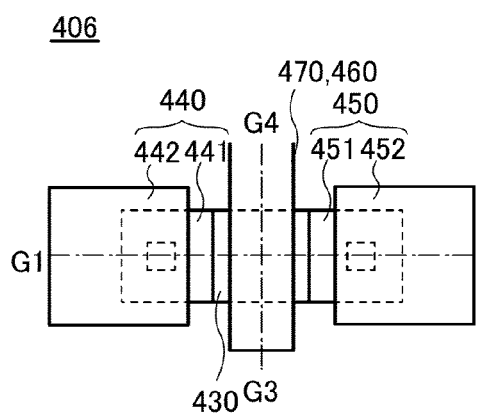
Figure 33F:
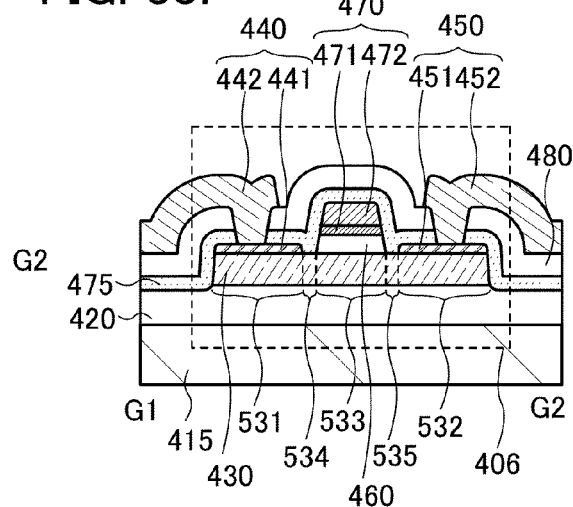

The transistor in one embodiment of the present invention may have a structure illustrated in FIGS. 33E and 33F. FIG. 33E is a top view of a transistor 406. A cross section in the direction of dashed-dotted line G1-G2 in FIG. 33E is illustrated in FIG. 33F. A cross section in the direction of dashed-dotted line G3-G4 in FIG. 33E is illustrated in FIG. 34A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive layer 440 includes two layers, the conductive layers 441 and 442, and the conductive layer 450 includes two layers, the conductive layers 451 and 452.

In the structures of the transistors 405 and 406, the conductive layers 440 and 450 are not in contact with the insulating layer 420. These structures make the insulating layer 420 less likely to be deprived of oxygen by the conductive layers 440 and 450 and facilitate oxygen supply from the insulating layer 420 to the oxide semiconductor layer 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers that functions as a source and a drain; thus, contact resistance between the oxide conductor layer and the conductive layers that functions as a source and a drain can be reduced.

Although the transistors 401 to 406 in FIGS. 32A to 32F, FIGS. 33A to 33F, and FIGS. 34A to 34D are examples in which the oxide semiconductor layer 430 is a single layer, the oxide semiconductor layer 430 may be a stacked layer. FIG. 35A is a top view of the oxide semiconductor layer 430, and FIGS. 35B and 35C are cross-sectional views of the oxide semiconductor layer 430 having a two-layer structure of an oxide semiconductor layer 430a and an oxide semiconductor layer 430b. FIGS. 35D and 35E are cross-sectional views of the oxide semiconductor layer 430 having a three-layer structure of the oxide semiconductor layer 430a, the oxide semiconductor layer 430b, and an oxide semiconductor layer 430c.

The oxide semiconductor layers 430a and 430c can also be referred to as insulating layers because no channel region is formed therein.

Oxide semiconductor layers with different compositions, for example, can be used as the oxide semiconductor layer 430a, the oxide semiconductor layer 430b, and the oxide semiconductor layer 430c.

The oxide semiconductor layer 430 in the transistors 401 to 406 can be replaced by the oxide semiconductor layer 430 in FIGS. 35B and 35C or FIGS. 35D and 35E.

Figure 35A:
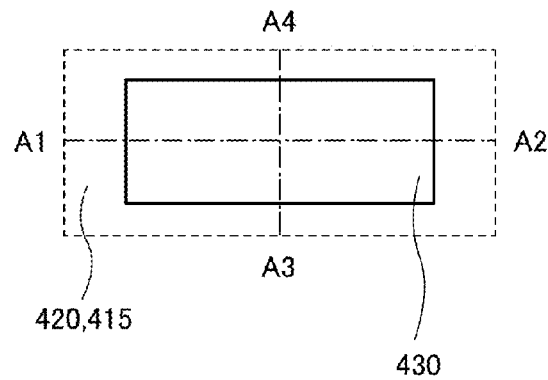
FIGS. 35A to 35E are a top view and cross-sectional views illustrating oxide semiconductor layers.
Figure 35B:
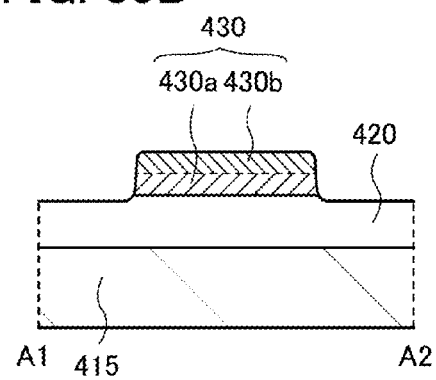
Figure 35D:
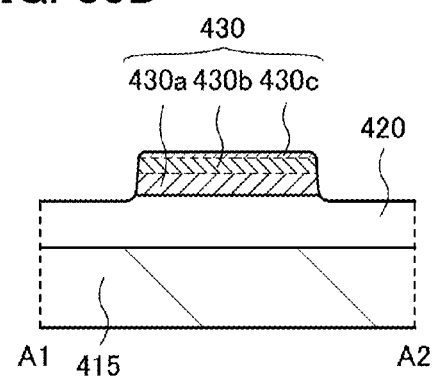
Figure 35C:
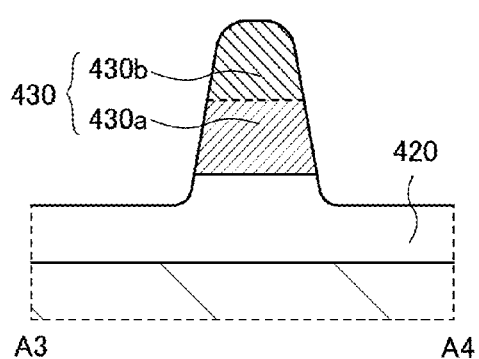
Figure 35E:
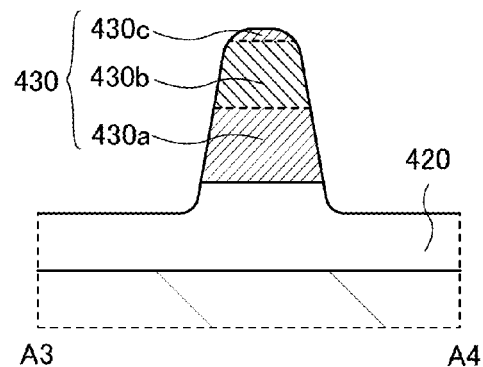
Figure 36A:
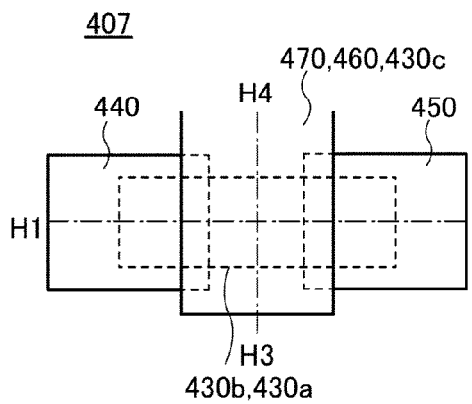
FIGS. 36A to 36F are top views and cross-sectional views illustrating transistors.
Figure 36B:
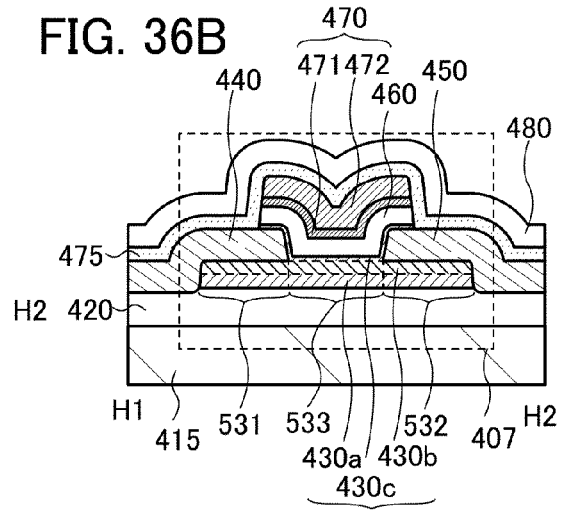
Figure 36C:
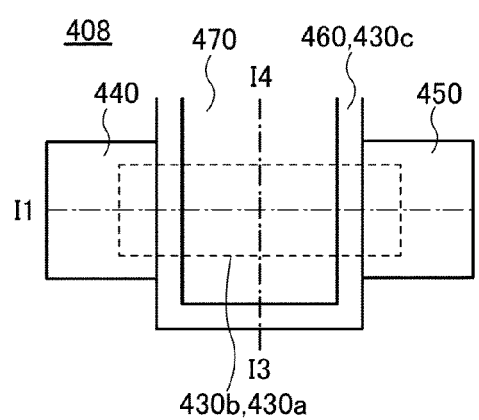
Figure 36D:
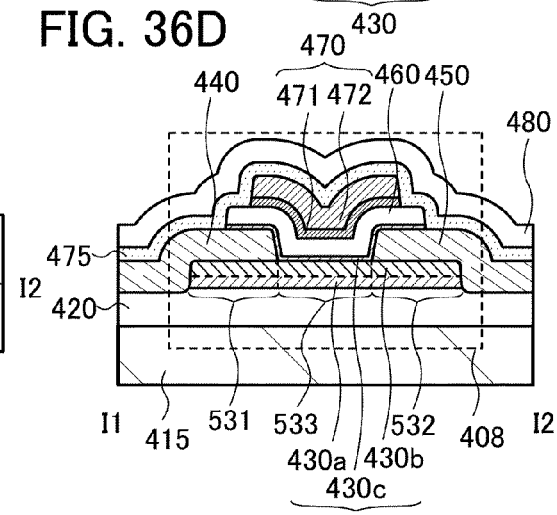
Figure 36E:
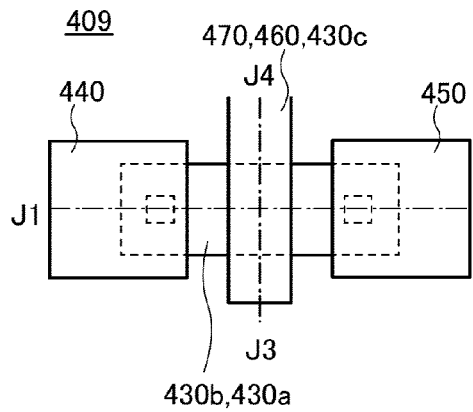
Figure 36F:
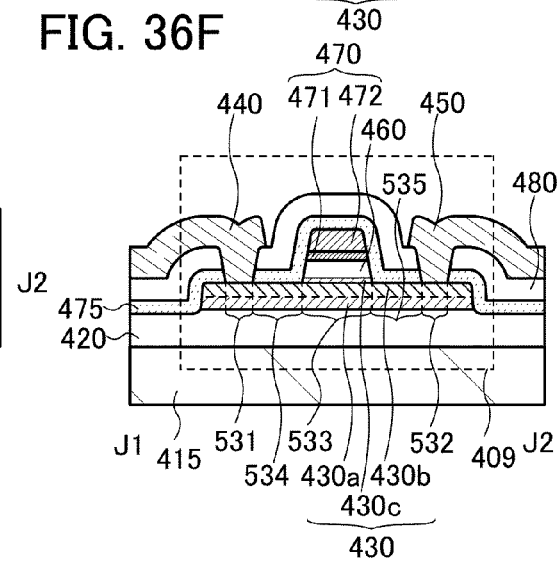

The transistor in one embodiment of the present invention may have a structure illustrated in FIGS. 35A to 35F, FIGS. 36A to 36F, and FIGS. 37A to 37D. FIGS. 35A, 35C, and 35E and FIGS. 36A, 36C, and 36E are top views of transistors 407, 408, 409, 410, 411, and 412, respectively. FIG. 35B is a cross section in the direction of dashed-dotted line H1-H2 in FIG. 35A. FIG. 35D is a cross section in the direction of dashed-dotted line I1-I2 in FIG. 35C. FIG. 35F is a cross section in the direction of dashed-dotted line J1-J2 in FIG. 35E. FIG. 36B is a cross section in the direction of dashed-dotted line K1-K2 in FIG. 36A. FIG. 36D is a cross section in the direction of dashed-dotted line L1-L2 in FIG. 36C. FIG. 36F is a cross section in the direction of dashed-dotted line M1-M2 in FIG. 36E. FIG. 37A illustrates each of cross sections in the directions of dashed-dotted lines H3-H4 in FIG. 35A, J3-J4 in FIG. 35E, K3-K4 in FIG. 36A, L3-L4 in FIG. 36C, and M3-M4 in FIG. 36E. FIG. 37B is a cross section in the direction of dashed-dotted line I3-I4 in FIG. 35C. The directions of dashed-dotted lines H1-H2, I1-I2, J1-J2, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 440 and 450.

The transistors 409, 410, and 412 each have the same structure as the transistors 403, 404, and 406 except that the oxide semiconductor layer 430 includes two layers (the oxide semiconductor layers 430a and 430b) in the regions 531, 532, 534, and 535 and that the oxide semiconductor layer 430 includes three layers (the oxide semiconductor layers 430a to 430c) in the region 533.

The transistor 411 has the same structure as the transistor 405 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 441 and 451.

Figure 34C:
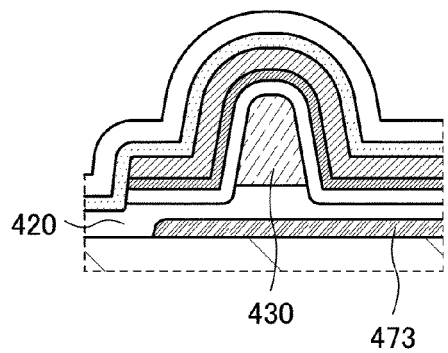

The transistor in one embodiment of the present invention may include a conductive layer 473 between the oxide semiconductor layer 430 and the substrate 415 as illustrated in cross-sectional views in the channel length directions of the transistors 401 to 412 illustrated in FIGS. 38A to 38F and FIGS. 39A to 39F, the cross-sectional view in the channel width direction of each of the transistors 401 to 406 illustrated in FIG. 34C, and the cross-sectional view in the channel width direction of each of the transistors 407 to 412 illustrated in FIG. 37C. The conductive layer 473 is used as a second gate electrode (also referred to as a back gate electrode), whereby the channel formation region in the oxide semiconductor layer 430 is electrically surrounded by the conductive layers 470 and 473. Such a transistor structure is referred to as a surrounded channel (s-channel) structure. Such a structure can increase the on-state current, and can control the threshold voltage. In the cross-sectional views in FIGS. 38A to 38F and FIGS. 39A to 39F, the width of the conductive layer 473 may be smaller than that of the oxide semiconductor layer 430. Moreover, the width of the conductive layer 473 may be shorter than that of the conductive layer 470.

Figure 34D:
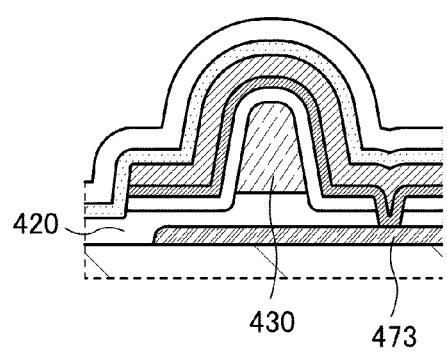
Figure 38A:
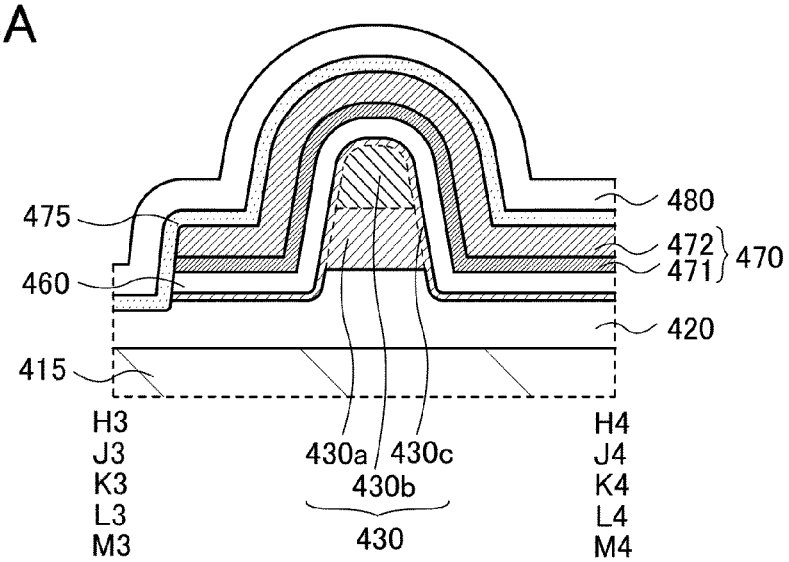
FIGS. 38A to 38D each illustrate a cross section of a transistor in a channel width direction.
Figure 38B:
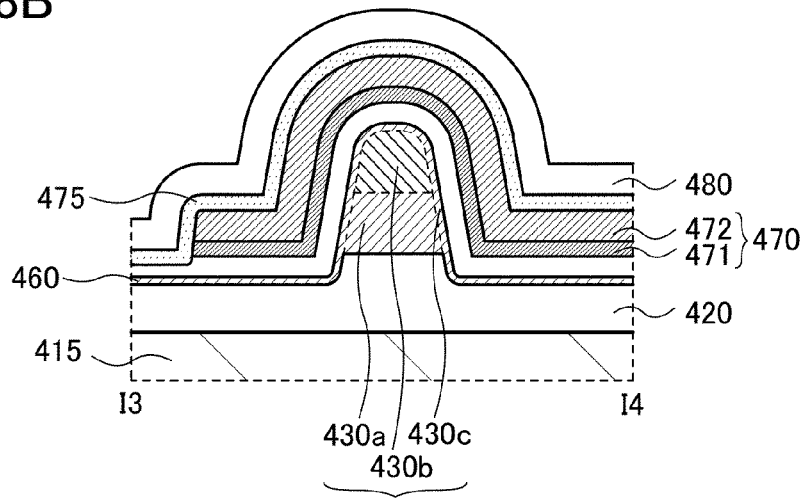
Figure 38C:
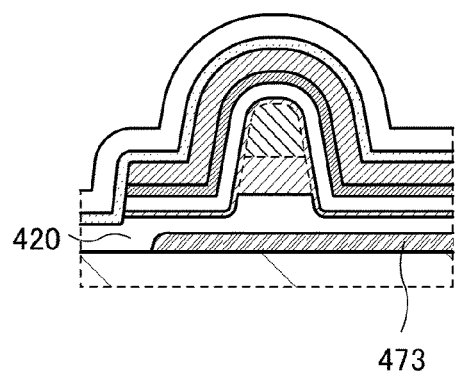
Figure 38D:
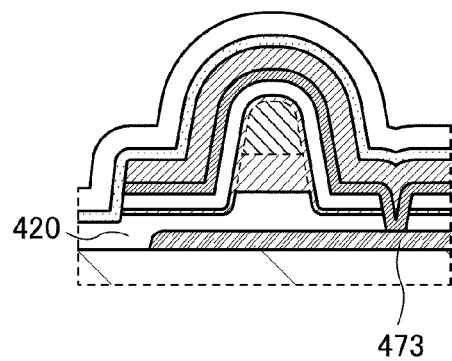
Figure 39A:
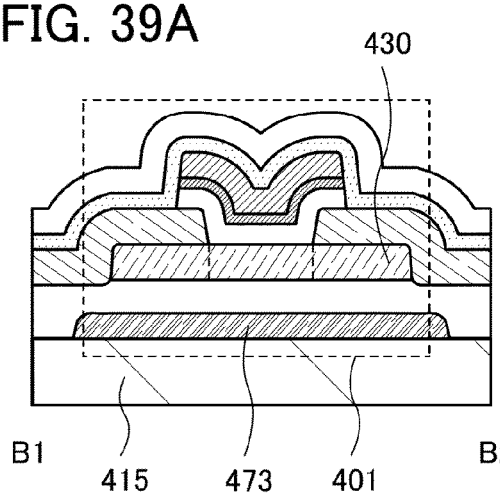
FIGS. 39A to 39F each illustrate a cross section of a transistor in a channel length direction.
Figure 39B:
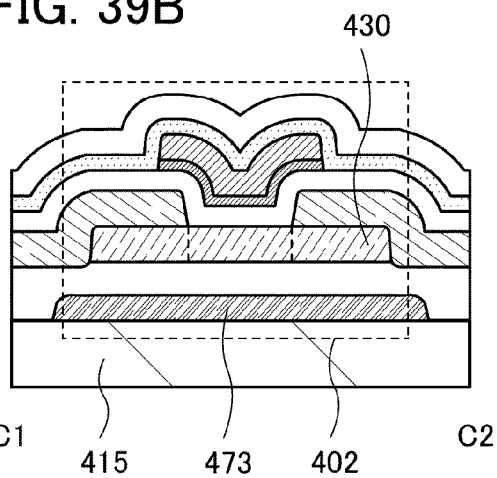
Figure 39C:
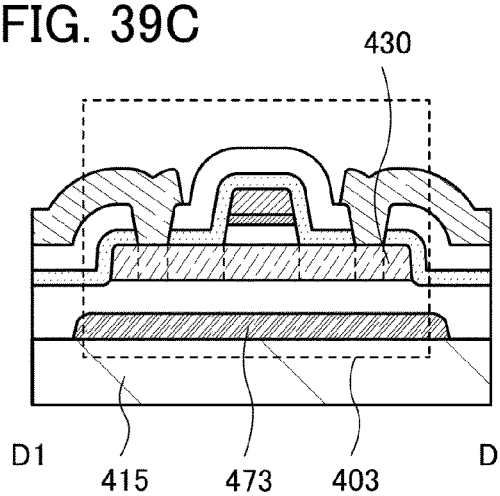
Figure 39D:
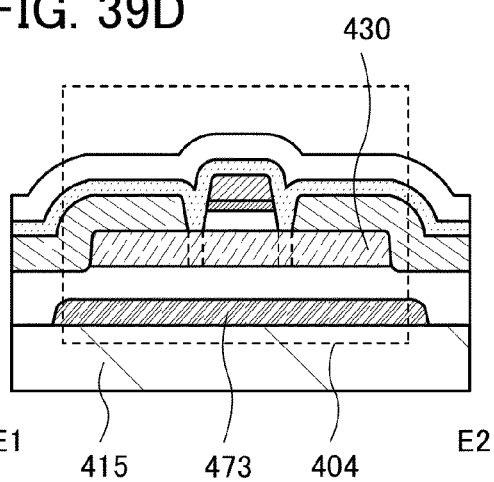
Figure 39E:
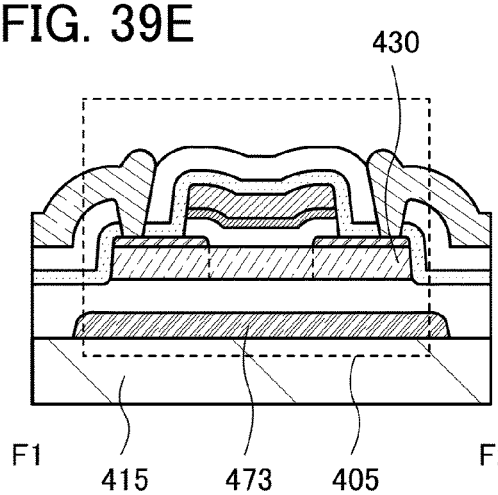
Figure 39F:
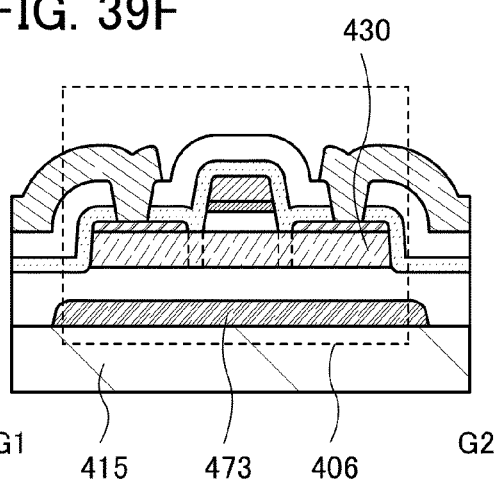
Figure 40A:
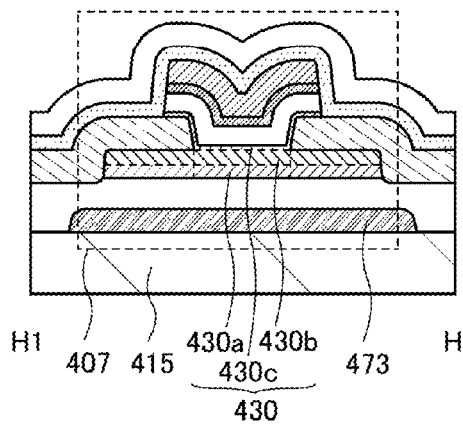
FIGS. 40A to 40F each illustrate a cross section of a transistor in a channel length direction.
Figure 40B:
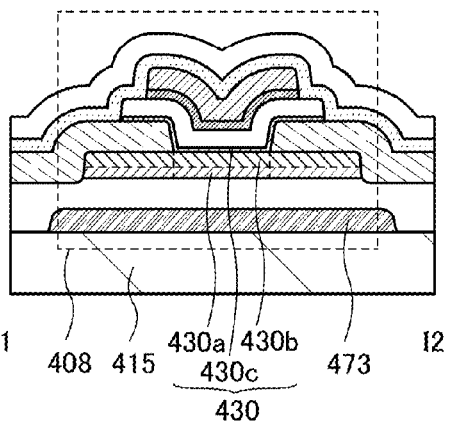
Figure 40C:
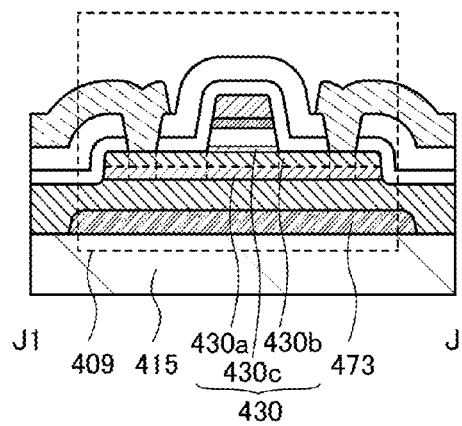
Figure 40D:
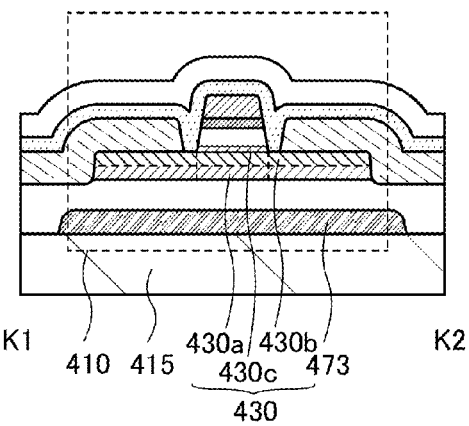
Figure 40E:
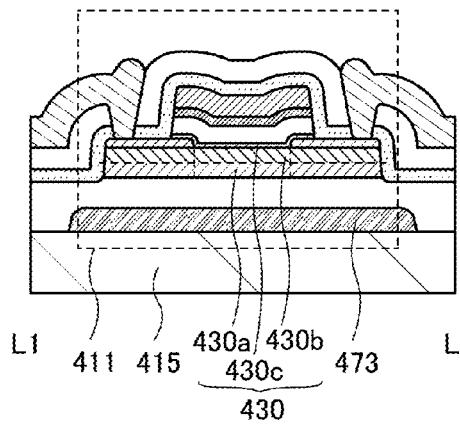
Figure 40F:
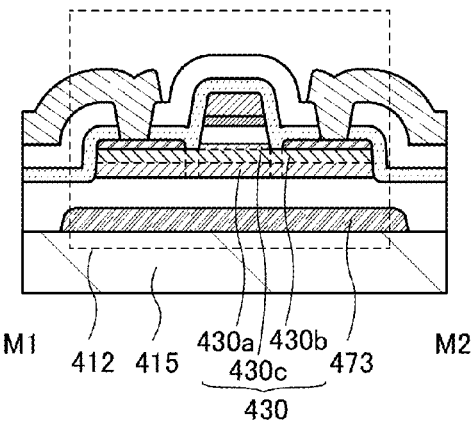

In order to increase the on-state current, for example, the conductive layers 470 and 473 are made to have the same potential, and the transistor is driven as a double-gate transistor. Furthermore, in order to control the threshold voltage, a fixed potential that is different from the potential of the conductive layer 470 is applied to the conductive layer 473. To set the conductive layers 470 and 473 at the same potential, for example, as illustrated in FIG. 34D and FIG. 38D, the conductive layers 470 and 473 may be electrically connected to each other through a contact hole.

The transistor in one embodiment of the present invention may have a structure illustrated in FIGS. 41A to 41C. FIG. 41A is a top view. FIG. 41B illustrates a cross-sectional view taken along dashed-dotted line N1-N2 in FIG. 41A. FIG. 41C illustrates a cross-sectional view taken along dashed-dotted line N3-N4 in FIG. 41A. Note that for simplification of the drawing, some components are not illustrated in the top view in FIG. 41A.

In the transistor 413, the insulating layer 420 is in contact with the substrate 415; the oxide semiconductor layer 430 (the oxide semiconductor layers 430a to 430c) is in contact with the insulating layer 420; the conductive layer 440 and the conductive layer 450 are in contact with the oxide semiconductor layer 430b; the insulating layer 460 is in contact with the oxide semiconductor layer 430c; the conductive layer 470 is in contact with the insulating layer 460; and the insulating layer 480 is in contact with the insulating layer 420, the conductive layer 440, and the conductive layer 450. Note that the oxide semiconductor layer 430c, the insulating layer 460, and the conductive layer 470 are provided in an opening reaching the oxide semiconductor layer 430b in the insulating layer 480.

In the transistor 413, a region where the conductive layer 470 overlaps with the conductive layer 440 or the conductive layer 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 41B and 41C, the transistor 413 is preferably subjected to a chemical mechanical polishing (CMP) method or the like to have a flat top surface, although not necessarily.

Figure 42A:
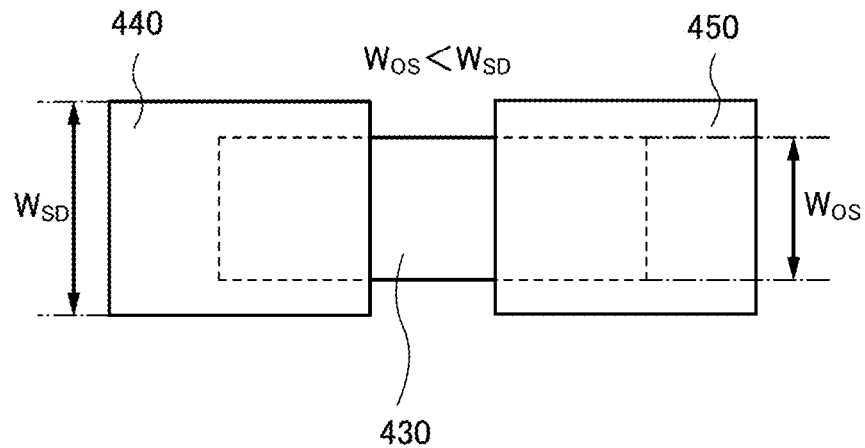
FIGS. 42A to 42C are top views each illustrating a transistor.
Figure 42B:
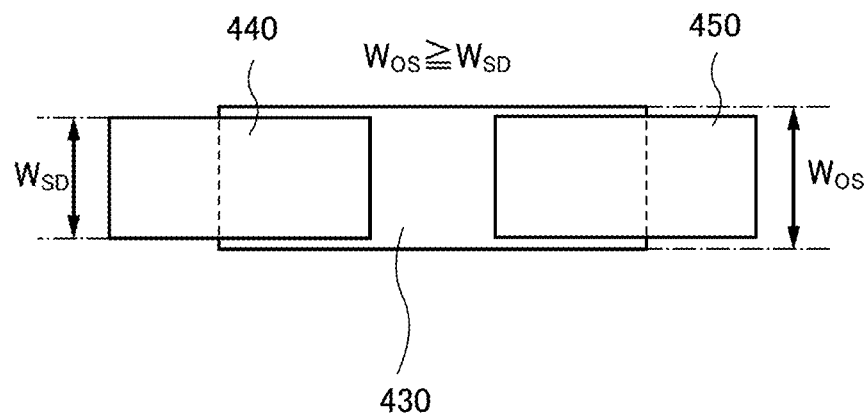
Figure 42C:
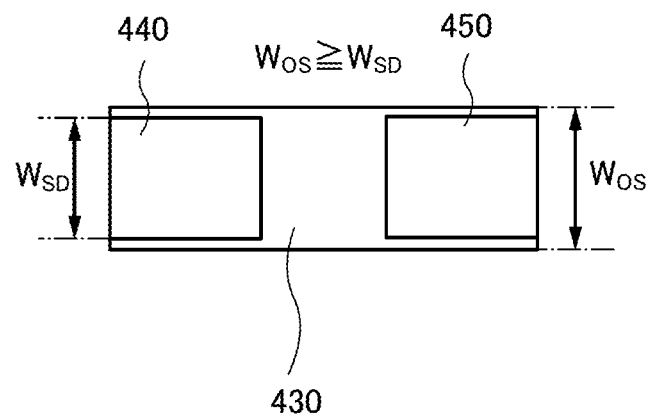

The conductive layer 440 and the conductive layer 450 in the transistor in one embodiment of the present invention may each have a width ($W_{SD}$) longer than the width ($W_{OS}$) of the oxide semiconductor layer as illustrated in the top view in FIG. 42A or shorter as illustrated in the top view in FIG. 42B. When $W_{OS} \geq W_{SD}$ ($W_{SD}$ is less than or equal to $W_{OS}$) is satisfied, a gate electric field is easily applied to the entire oxide semiconductor layer 430, so that electrical characteristics of the transistor can be particularly improved. As illustrated in FIG. 42C, the conductive layers 440 and 450 may be formed only in regions overlapping with the oxide semiconductor layer 430.

Note that FIGS. 42A to 42C only illustrate the oxide semiconductor layer 430, the conductive layer 440, and the conductive layer 450.

In the transistor including the oxide semiconductor layers 430a and 430b and the transistor including the oxide semiconductor layers 430a to 430c, selecting appropriate materials for the two or three layers forming the oxide semiconductor layer 430 makes current flow to the oxide semiconductor layer 430b. Since current flows to the oxide semiconductor layer 430b, the current is hardly influenced by interface scattering, leading to high on-state current. Thus, increasing the thickness of the oxide semiconductor layer 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 5

In this embodiment, components of the transistors described in Embodiment 4 are described in detail.

Note that there is no particular limitation on the type of the substrate 415. As the substrate 415, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Alternatively, a film of polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

As the substrate 415, a silicon substrate provided with a transistor, or the silicon substrate over which an insulating layer, a wiring, a conductor that functions as a contact plug, and the like are provided can be used. Note that when only p-channel transistors are formed using the silicon substrate, a silicon substrate with n$^-$-type conductivity is preferably used. Alternatively, an SOI substrate including an n$^-$-type or i-type silicon layer may be used. A surface of the silicon substrate where the transistor is formed preferably has a (110) plane orientation. Forming a p-channel transistor with the (110) plane can increase mobility.

A flexible substrate may be used as the substrate 415, and the transistor may be formed directly over the flexible substrate. Alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the separation layer, a stack including inorganic films, which are a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating layer 420 can have a function of supplying oxygen to the oxide semiconductor layer 430 as well as a function of preventing diffusion of impurities from a component included in the substrate 415. For this reason, the insulating layer 420 is preferably an insulating layer containing oxygen and further preferably, the insulating layer 420 is an insulating layer containing oxygen in which the oxygen content is higher than that in the stoichiometric composition. The insulating layer 420 is, for example, a film in which the amount of released oxygen when converted into oxygen atoms is greater than or equal to $1.0 \times 10^{19}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 415 is provided with another device, the insulating layer 420 also functions as an interlayer insulating layer. In that case, the insulating layer 420 is preferably subjected to planarization treatment such as chemical mechanical polishing (CMP) treatment so as to have a flat surface.

For example, the insulating layer 420 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. The insulating layer 420 may be a stack of any of the above materials.

In this embodiment, detailed description is given mainly on the case where the oxide semiconductor layer 430 of the transistor has a three-layer structure in which the oxide semiconductor layers 430a, 430b, and 430c are sequentially stacked from the insulating layer 420 side.

Note that in the case where the oxide semiconductor layer 430 is a single layer, a layer corresponding to the oxide semiconductor layer 430b described in this embodiment is used.

In the case where the oxide semiconductor layer 430 has a two-layer structure, a stack in which layers corresponding to the oxide semiconductor layer 430a and the oxide semiconductor layer 430b described in this embodiment are sequentially stacked from the insulating layer 420 side is used. In such a case, the oxide semiconductor layers 430a and 430b can be replaced with each other.

In the case where the oxide semiconductor layer 430 has a layered structure of four or more layers, for example, a structure in which another oxide semiconductor layer is added to the three-layer stack of the oxide semiconductor layer 430 described in this embodiment can be employed.

For the oxide semiconductor layer 430b, for example, an oxide semiconductor whose electron affinity (an energy difference between a vacuum level and the conduction band minimum) is higher than those of the oxide semiconductor layers 430a and 430c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 430a and 430c each contain one or more kinds of metal elements contained in the oxide semiconductor layer 430b. For example, the oxide semiconductor layers 430a and 430c are preferably formed using an oxide semiconductor whose conduction band minimum is closer to a vacuum level than that of the oxide semiconductor layer 430b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 470, a channel is formed in the oxide semiconductor layer 430b whose conduction band minimum is the lowest in the oxide semiconductor layer 430.

Furthermore, since the oxide semiconductor layer 430a contains one or more kinds of metal elements contained in the oxide semiconductor layer 430b, an interface state is unlikely to be formed at the interface between the oxide semiconductor layers 430a and 430b, compared with the interface between the oxide semiconductor layer 430b and the insulating layer 420 on the assumption that the oxide semiconductor layer 430b is in contact with the insulating layer 420. The interface state sometimes forms a channel; therefore, the threshold voltage of the transistor is changed in some cases. Thus, with the oxide semiconductor layer 430a, variations in electrical characteristics of the transistor, such as a threshold voltage, can be reduced. Moreover, the reliability of the transistor can be improved.

Since the oxide semiconductor layer 430c contains one or more kinds of metal elements contained in the oxide semiconductor layer 430b, scattering of carriers is unlikely to occur at the interface between the oxide semiconductor layers 430b and 430c, compared with the interface between the oxide semiconductor layer 430b and the gate insulating layer (the insulating layer 460) on the assumption that the oxide semiconductor layer 430b is in contact with the gate insulating layer. Thus, with the oxide semiconductor layer 430c, the field-effect mobility of the transistor can be increased.

For the oxide semiconductor layers 430a and 430c, for example, a material containing Al, Ti, Ga, Ge, Y, Zr, Sn, La, Ce, or Hf with a higher atomic ratio than that used for the oxide semiconductor layer 430b can be used. Specifically, the atomic ratio of any of the above metal elements in the oxide semiconductor layers 430a and 430c is 1.5 times or more, preferably 2 times or more, and further preferably 3 times or more as large as that in the oxide semiconductor layer 430b. Any of the above metal elements is strongly bonded to oxygen and thus can have a function of suppressing generation of an oxygen vacancy in the oxide semiconductor layers 430a and 430c. That is, an oxygen vacancy is less likely to be generated in the oxide semiconductor layers 430a and 430c than in the oxide semiconductor layer 430b.

An oxide semiconductor that can be used for each of the oxide semiconductor layers 430a, 430b, and 430c preferably contains at least In or Zn. Both In and Zn are preferably contained. In order to reduce variations in electrical characteristics of the OS transistor, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 430a, 430b, and 430c is an In-M-Zn oxide containing at least indium, zinc, and M (M is a metal such as Al, Ti, Ga, Ge, Y, Zr, Sn, La, Ce, or Hf), in the case where the oxide semiconductor layer 430a has an atomic ratio of In to M and Zn which is $x_1:y_1:z_1$, the oxide semiconductor layer 430b has an atomic ratio of In to M and Zn which is $x_2:y_2:z_2$, and the oxide semiconductor layer 430c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, and further preferably 3 times or more as large as $y_2/x_2$. At this time, when $y_2$ is greater than or equal to $x_2$ in the oxide semiconductor layer 430b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 430a and 430c are preferably less than 50 atomic % and greater than 50 atomic %, respectively, and further preferably less than 25 atomic % and greater than 75 atomic %, respectively. Furthermore, in the case where Zn and O are not taken into consideration, the proportion of In and the proportion of M in the oxide semiconductor layer 430b are preferably greater than 25 atomic % and less than 75 atomic %, respectively, and further preferably greater than 34 atomic % and less than 66 atomic %, respectively.

The indium content in the oxide semiconductor layer 430b is preferably higher than those in the oxide semiconductor layers 430a and 430c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 430b, a transistor having high field-effect mobility can be obtained.

The thickness of the oxide semiconductor layer 430a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 430b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 430c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 430b is preferably thicker than the oxide semiconductor layer 430c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1 \times 10^{15}/cm^3$, lower than $1 \times 10^{13}/cm^3$, lower than $8 \times 10^{11}/cm^3$, or lower than $1 \times 10^{8}/cm^3$, and is higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 430a, 430b, and 430c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1 \times 10^{19}$ atoms/cm$^3$, preferably lower than $5 \times 10^{18}$ atoms/cm$^3$, and further preferably lower than $1 \times 10^{18}$ atoms/cm$^3$. The oxide semiconductor layer is arranged to have a region in which the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$. The concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1 \times 10^{19}$ atoms/cm$^3$, preferably lower than $5 \times 10^{18}$ atoms/cm$^3$, and further preferably lower than $1 \times 10^{18}$ atoms/cm$^3$. Furthermore, the oxide semiconductor layer is controlled to have a region in which the concentration of carbon is lower than $1 \times 10^{19}$ atoms/cm$^3$, preferably lower than $5 \times 10^{18}$ atoms/cm$^3$, and further preferably lower than $1 \times 10^{18}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating layer of the transistor, an insulating layer containing silicon is used in many cases; thus, it is preferable that, as in the transistor in one embodiment of the present invention, a region of the oxide semiconductor layer that serves as a channel not be in contact with the gate insulating layer for the above reason. In the case where a channel is formed at the interface between the gate insulating layer and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating layer.

Accordingly, with the oxide semiconductor layer 430 having a layered structure including the oxide semiconductor layers 430a, 430b, and 430c, a channel can be formed in the oxide semiconductor layer 430b; thus, the transistor can have high field-effect mobility and stable electrical characteristics.

In a band structure, the conduction band minimums of the oxide semiconductor layers 430a, 430b, and 430c are continuous. This can be understood also from the fact that the compositions of the oxide semiconductor layers 430a, 430b, and 430c are close to one another and oxygen is easily diffused among the oxide semiconductor layers 430a, 430b, and 430c. Thus, the oxide semiconductor layers 430a, 430b, and 430c have a continuous physical property though they have different compositions and form a stack. In the drawings, interfaces between the oxide semiconductor layers of the stack are indicated by dotted lines.

The oxide semiconductor layer 430 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 430a and 430c, and an In—Ga—Zn oxide whose atomic ratio of In to Ga and Zn is 1:1:1, 2:1:3, 5:5:6, or 3:1:2 can be used for the oxide semiconductor layer 430b. In each of the oxide semiconductor layers 430a to 430c, the proportion of each atom in the atomic ratio varies within a range of ±40% as a margin.

The oxide semiconductor layer 430b of the oxide semiconductor layer 430 serves as a well, so that a channel is formed in the oxide semiconductor layer 430b. Since the conduction band minimums are continuous, the oxide semiconductor layer 430 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 430a and 430c. The oxide semiconductor layer 430b can be distanced away from the trap levels owing to the existence of the oxide semiconductor layers 430a and 430c.

However, when the energy differences between the conduction band minimum of the oxide semiconductor layer 430b and the conduction band minimum of each of the oxide semiconductor layers 430a and 430c are small, an electron in the oxide semiconductor layer 430b might reach the trap level by passing over the energy differences. When the electron is trapped in the trap level, negative charge is generated at the interface with the insulating layer, so that the threshold voltage of the transistor is shifted in the positive direction.

The oxide semiconductor layers 430a, 430b, and 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 440 functioning as one of a source and a drain and the conductive layer 450 functioning as the other of the source and the drain, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 405, 406, 411, and 412, for example, it is possible to use W for the conductive layers 441 and 451 and use a stack of Ti and Al for the conductive layers 442 and 452.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 440 and 450, the conductive layers 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 440 and 450 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 460 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 460 may be a stack including any of the above materials. The insulating layer 460 may contain La, N, Zr, or the like as an impurity.

An example of a layered structure of the insulating layer 460 is described. The insulating layer 460 includes, for example, oxygen, nitrogen, silicon, or hafnium. Specifically, the insulating layer 460 preferably includes hafnium oxide and silicon oxide or silicon oxynitride.

Hafnium oxide and aluminum oxide have higher dielectric constants than silicon oxide and silicon oxynitride. Therefore, the insulating layer 460 using hafnium oxide or aluminum oxide can have larger thickness than the insulating layer 460 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 420 and 460 in contact with the oxide semiconductor layer 430, a film that releases less nitrogen oxide is preferably used. In the case where the oxide semiconductor is in contact with an insulating layer that releases a large amount of nitrogen oxide, the density of states due to nitrogen oxide increases in some cases. The density of states due to nitrogen oxide can be formed in the energy gap of the oxide semiconductor. For the insulating layers 420 and 460, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 420 and 460, a shift in the threshold voltage of the transistor can be reduced, which leads to reduced fluctuations in the electrical characteristics of the transistor.

For the conductive layer 470 functioning as a gate, for example, a conductive layer formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 471 and tungsten is used for the conductive layer 472 to form the conductive layer 470.

As the insulating layer 475, a silicon nitride film, an aluminum nitride film, or the like containing hydrogen can be used. In the transistors 403, 404, 406, 409, 410, and 412, the use of an insulating layer containing hydrogen is used as the insulating layer 475 allows the oxide semiconductor layer 430 to be partly changed to n-type because the oxide semiconductor layer 430 is partly in contact with the insulating layer 475. In addition, a nitride insulating layer functions as a blocking film against moisture and the like and can improve the reliability of the transistor.

An aluminum oxide film can also be used as the insulating layer 475. It is particularly preferable to use an aluminum oxide film as the insulating layer 475 in the transistors 401, 402, 405, 407, 408, and 411. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 430, preventing release of oxygen from the oxide semiconductor layer, and preventing unnecessary release of oxygen from the insulating layer 420. Furthermore, oxygen contained in the aluminum oxide film can be diffused into the oxide semiconductor layer.

Furthermore, the insulating layer 480 is preferably formed over the insulating layer 475. The insulating layer 480 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 480 may be a stack of any of the above materials.

Here, like the insulating layer 420, the insulating layer 480 preferably contains oxygen more than that in the stoichiometric composition. Oxygen released from the insulating layer 480 can be diffused into the channel formation region in the oxide semiconductor layer 430 through the insulating layer 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor layer 430c is formed to cover the oxide semiconductor layer 430b where a channel is formed; thus, a channel formation layer is not in contact with the gate insulating layer. Accordingly, scattering of carriers at the interface between the channel formation layer and the gate insulating layer can be reduced and the on-state current of the transistor can be increased.

In the transistor in one embodiment of the present invention, as described above, the gate (the conductive layer 470) is formed to electrically surround the oxide semiconductor layer 430 in the channel width direction; accordingly, a gate electric field is applied to the oxide semiconductor layer 430 in the side surface direction in addition to the perpendicular direction. In other words, a gate electric field is applied to the entire channel formation layer and an effective channel width is increased, leading to a further increase in on-state current.

Furthermore, in the transistor in one embodiment of the present invention in which the oxide semiconductor layer 430 has a two-layer structure or a three-layer structure, since the oxide semiconductor layer 430b where a channel is formed is provided over the oxide semiconductor layer 430a, an interface state is less likely to be formed. In the transistor in one embodiment of the present invention in which the oxide semiconductor layer 430 has a three-layer structure, since the oxide semiconductor layer 430b is positioned at the middle of the three-layer structure, the influence of an impurity that enters from upper and lower layers on the oxide semiconductor layer 430b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include MOCVD and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed with a deposition apparatus using ALD, an $In(CH_3)_3$ gas and an $O_3$ gas are sequentially introduced plural times to form an In—O layer, a $Ga(CH_3)_3$ gas and an $O_3$ gas are sequentially introduced plural times to form a Ga—O layer, and then a $Zn(CH_3)_2$ gas and an $O_3$ gas are sequentially introduced plural times to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 6

A structure of an oxide semiconductor layer that can be used in one embodiment of the present invention will be described below.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly includes the case where the angle is greater than or equal to $85°$ and less than or equal to $95°$. The term "substantially perpendicular" indicates that the angle formed between two straight lines is greater than or equal to $60°$ and less than or equal to $120°$.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Figure 43A:
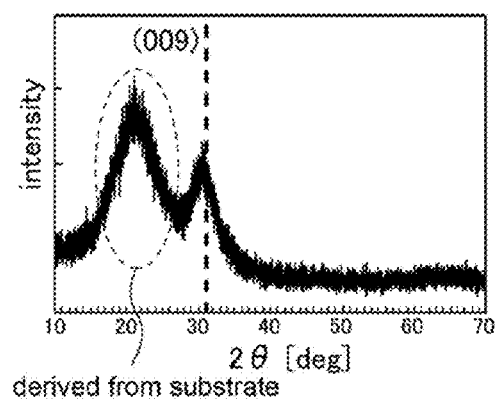
FIGS. 43A to 43E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around $31°$ as shown in FIG. 43A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 43B:
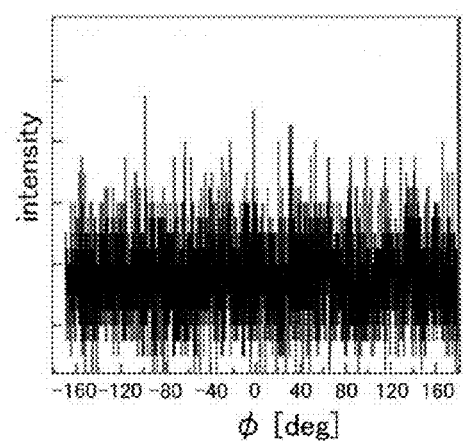
Figure 43C:
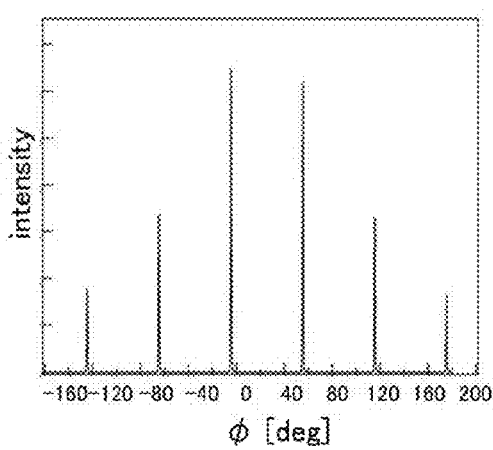

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 43B, a peak is not clearly observed. In contrast, in the case where single crystal InGaZnO$_4$ is subjected to φ scan with 2θ fixed at around 56°, as shown in FIG. 43C, six peaks which are derived from crystal planes equivalent to the (110) plane are observed. Accordingly, the structural analysis using XRD shows that the directions of a-axes and b-axes are irregularly oriented in the CAAC-OS.

Figure 43D:
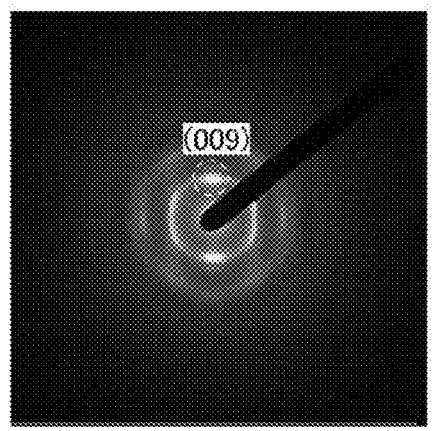
Figure 43E:
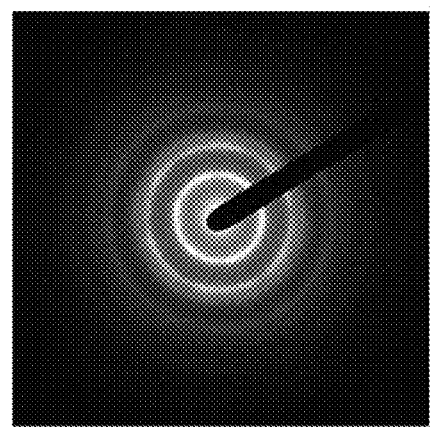

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 43D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 43E shows a diffraction pattern obtained in such a manner that an electron beam with a probe diameter of 300 nm is incident on the same sample in a direction perpendicular to the sample surface. As shown in FIG. 43E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 43E is considered to be derived from the (010) plane, the (100) plane, and the like of the InGaZnO$_4$ crystal. The second ring in FIG. 43E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 44A:
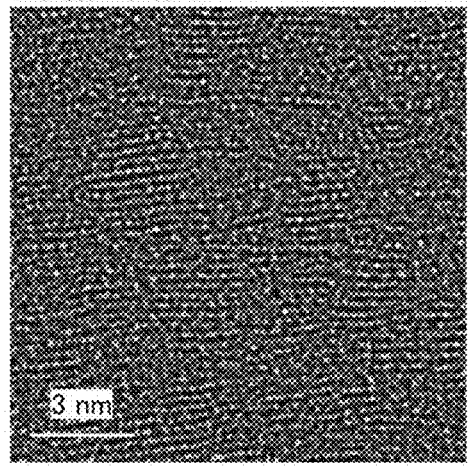
FIGS. 44A to 44E show a cross-sectional TEM image and plan-view TEM images of a CAAC-OS and images obtained through analysis thereof.

FIG. 44A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 44A shows pellets in which metal atoms are arranged in a layered manner. FIG. 44A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 44B:
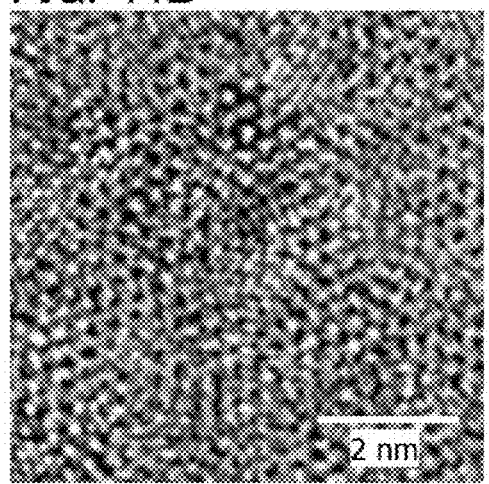
Figure 44C:
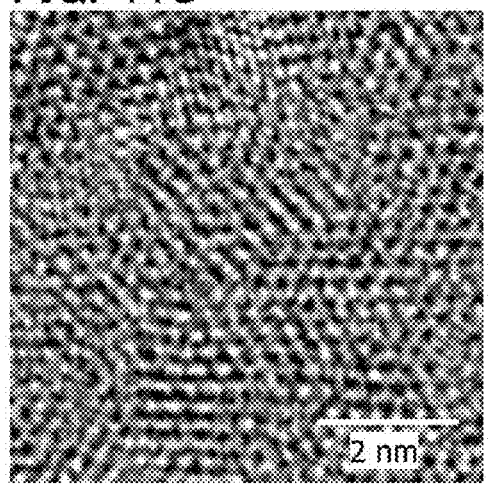
Figure 44D:
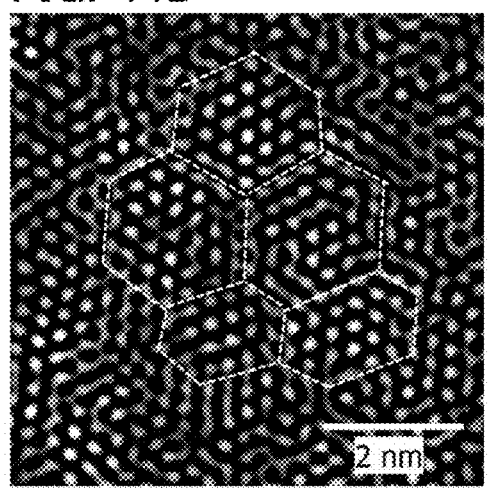
Figure 44E:
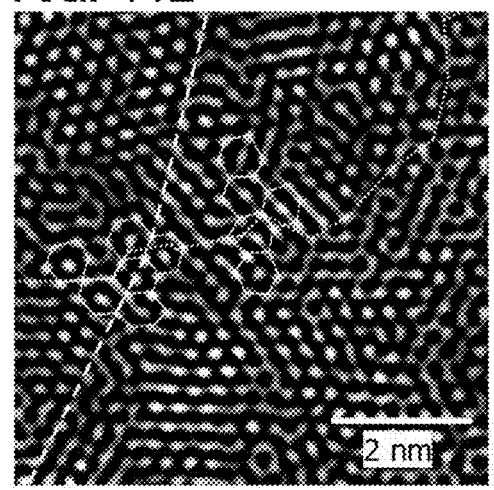

FIGS. 44B and 44C show Cs-corrected high-resolution TEM images of a plane of the CAAC-OS observed from a direction substantially perpendicular to the sample surface. FIGS. 44D and 44E are images obtained through image processing of FIGS. 44B and 44C. The method of image processing is as follows. The image in FIG. 44B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 44D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 44E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 45A:
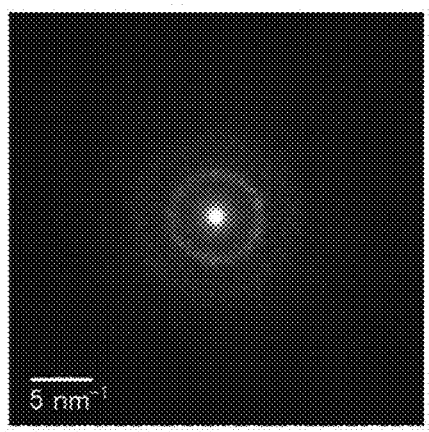
FIGS. 45A to 45D show electron diffraction patterns and a cross-sectional TEM image of an nc-OS.
Figure 45B:
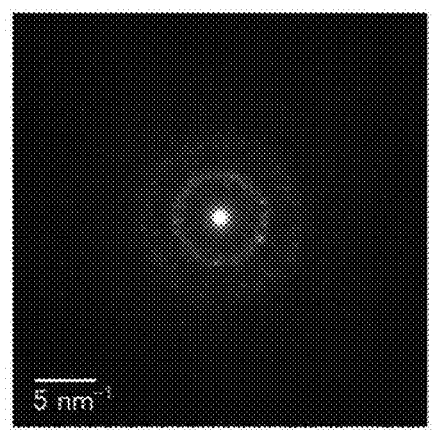

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 45A is observed. FIG. 45B shows a diffraction pattern obtained when an electron beam with a probe diameter of 1 nm is incident on the same sample. As shown in FIG. 45B, a plurality of spots are observed in a ring-like region. In other words, ordering in an nc-OS is not observed with an electron beam with a probe diameter of 50 nm but is observed with an electron beam with a probe diameter of 1 nm.

Figure 45C:
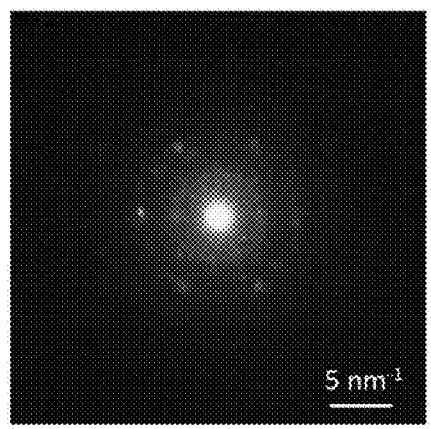

Furthermore, an electron diffraction pattern in which spots are arranged in an approximately hexagonal shape is observed in some cases as shown in FIG. 45C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 45D:
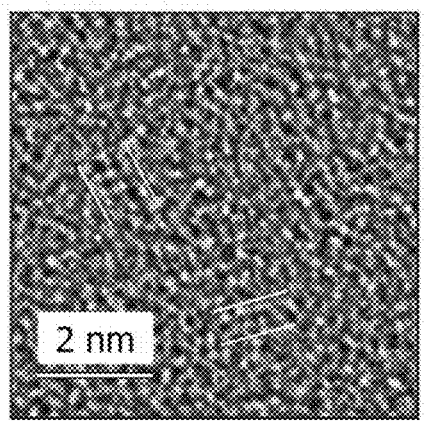

FIG. 45D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 45D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

Figure 46A:
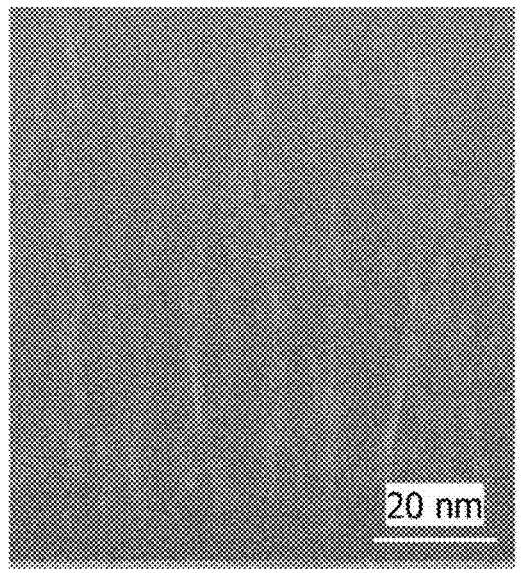
FIGS. 46A and 46B show cross-sectional TEM images of an a-like OS.
Figure 46B:
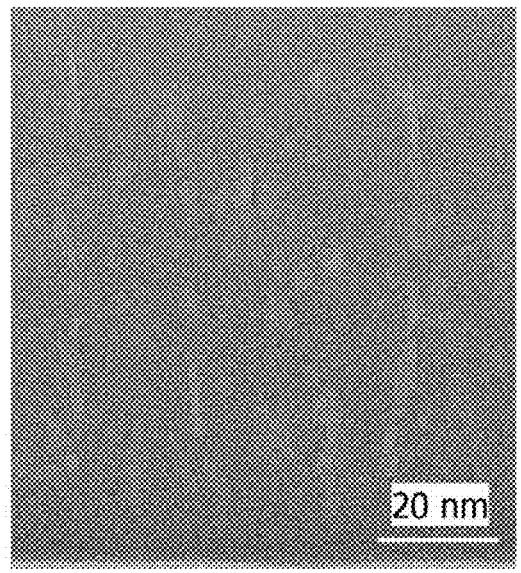

FIGS. 46A and 46B are high-resolution cross-sectional TEM images of an a-like OS. FIG. 46A is the high-resolution cross-sectional TEM image of the a-like OS at the start of the electron irradiation. FIG. 46B is the high-resolution cross-sectional TEM image of a-like OS after the electron (e) irradiation at $4.3 \times 10^8$ $e^-/nm^2$. FIGS. 46A and 46B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 47:
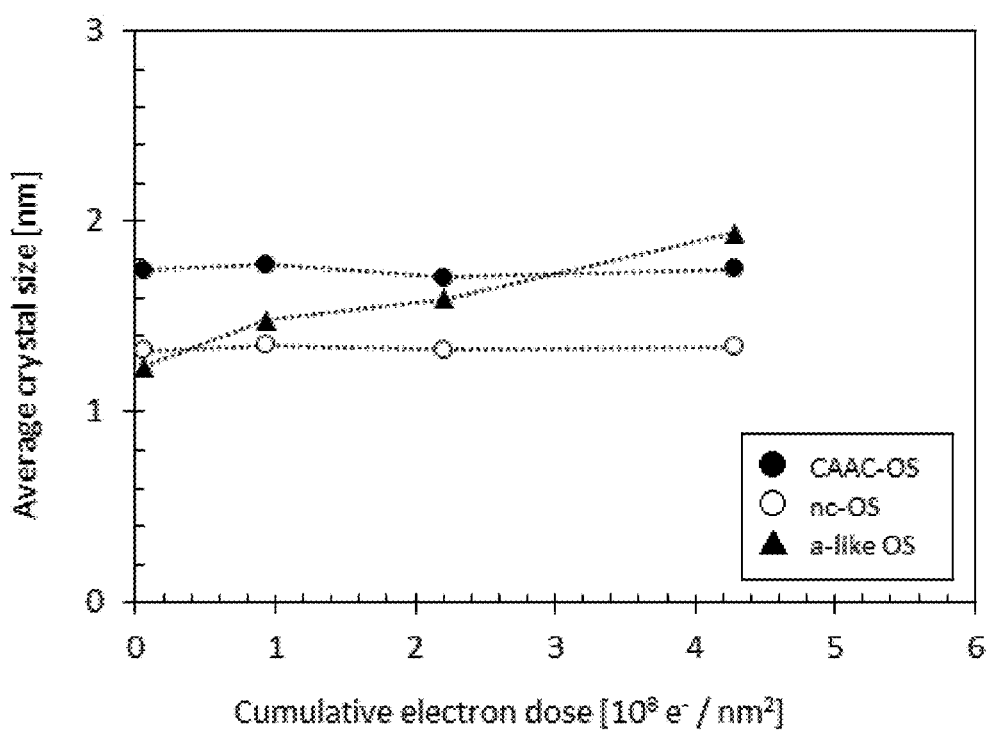
FIG. 47 shows a change of crystal parts of an In—Ga—Zn oxide due to electron irradiation.

FIG. 47 shows change in the average size of crystal parts (at 22 points to 30 points) in each sample. Note that the crystal part size corresponds to the length of a lattice fringe. FIG. 47 indicates that the crystal part size in the a-like OS increases with an increase in the cumulative electron dose in obtaining TEM images, for example. As shown in FIG. 47, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 47, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structure described in this embodiment can be used in appropriate combination with the structure described in any of the other embodiments.

Embodiment 7

In this embodiment, examples of a package and a module each including an image sensor chip will be described. The image sensor chip can employ the configuration of the imaging device of one embodiment of the present invention.

Figure 48A:
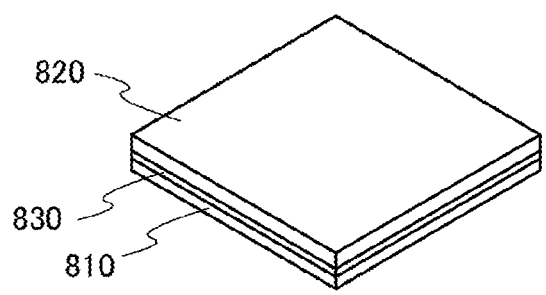
FIGS. 48A to 48D are perspective views and a cross-sectional view illustrating a package including an imaging device.

FIG. 48A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 48B:
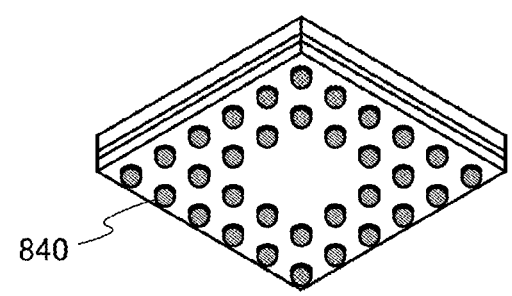

FIG. 48B is an external perspective view showing the bottom surface side of the package. The package has a ball grid array (BGA) structure including solder balls as bumps 840 on the bottom surface. Instead of the BGA, a land grid array (LGA), a pin grid array (PGA), or the like may be employed.

Figure 48C:
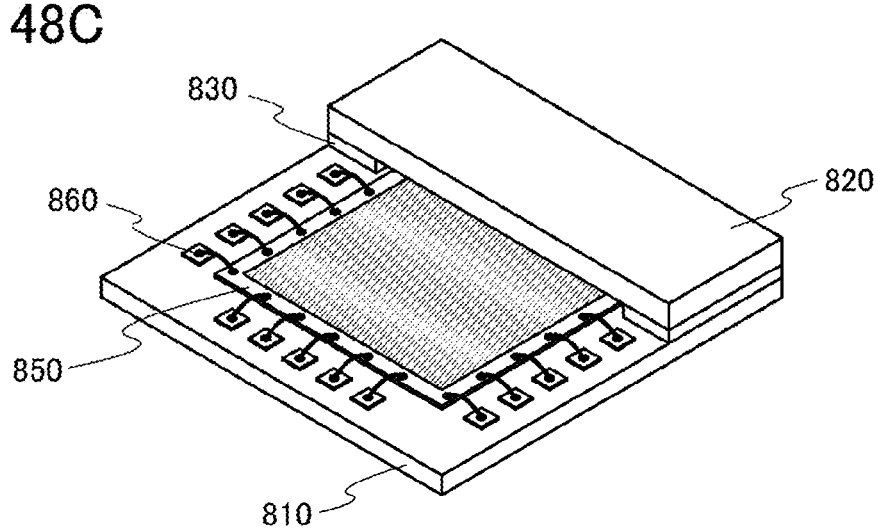
Figure 48D:
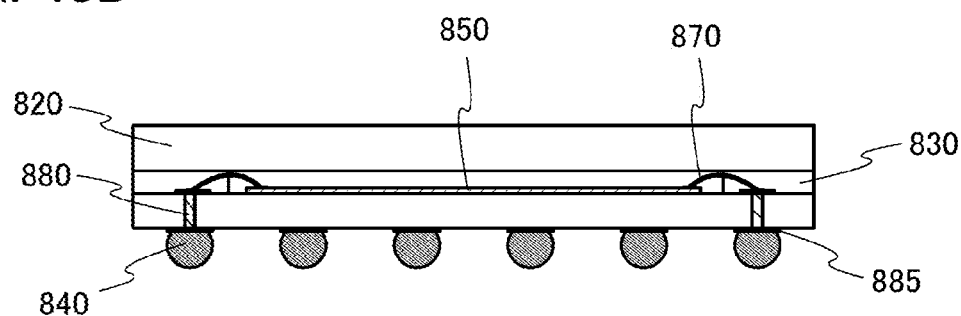

FIG. 48C is a perspective view of the package in which the cover glass 820 and the adhesive 830 are partly illustrated. FIG. 48D is a cross sectional view of the package. Electrode pads 860 are formed over the package substrate 810, and the electrode pads 860 and the bumps 840 are electrically connected via through holes 880 and lands 885.

The electrode pads 860 are electrically connected to electrodes of the image sensor chip 850 through wires 870.

Figure 49A:
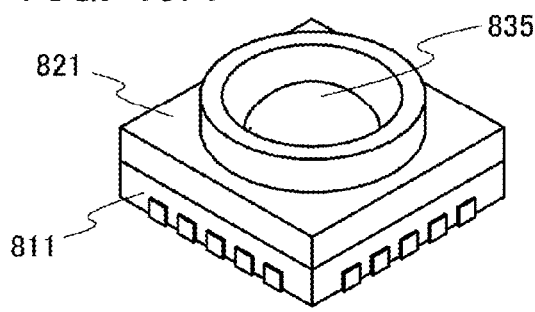
FIGS. 49A to 49D are perspective views and a cross-sectional view illustrating a package including an imaging device.

FIG. 49A is an external perspective view showing the top surface side of a camera module in which an image sensor chip and a lens integrated with each other in a package. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 49B:
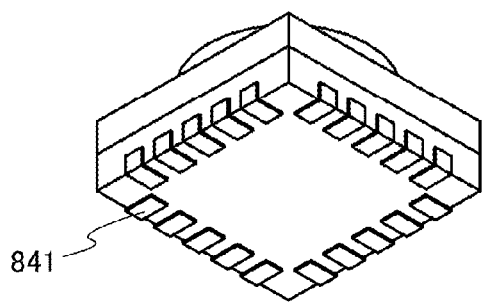

FIG. 49B is an external perspective view showing the bottom surface side of the camera module. Here, a quad flat no-lead package (QFN) is employed in which mounting lands 841 are provided on the bottom surface and four side surfaces of the package substrate 811. This structure is only an example; a quad flat package (QFP), the above-described BGA, or the like may be alternatively employed.

Figure 49C:
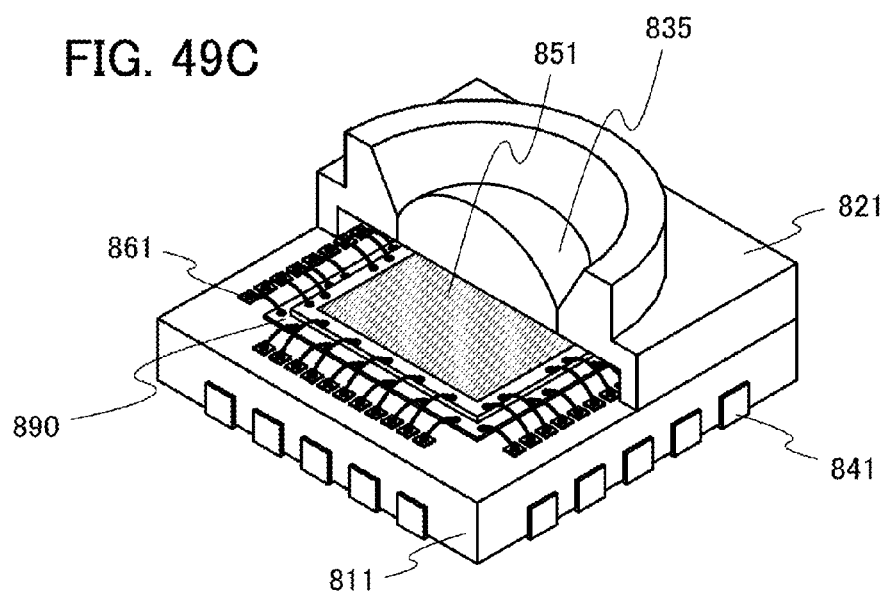
Figure 49D:
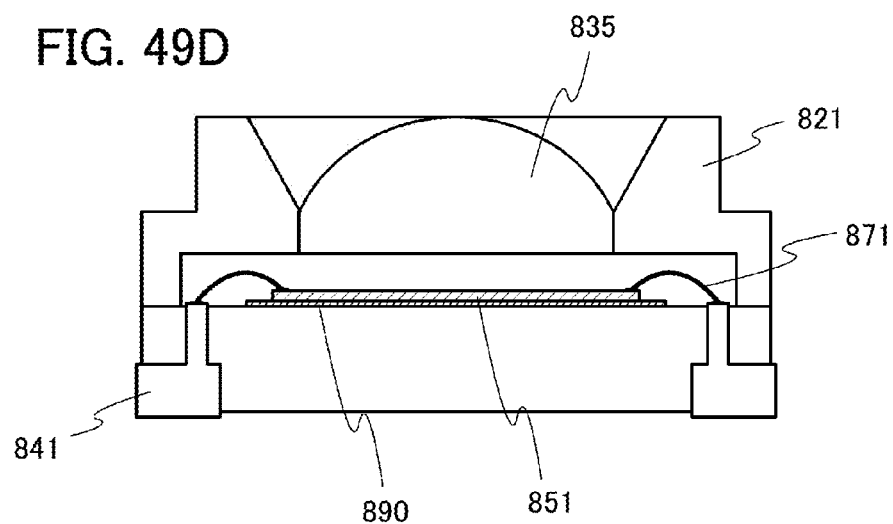

FIG. 49C is a perspective view of the module in which the lens cover 821 and the lens 835 are partly illustrated. FIG. 49D is a cross-sectional view of the camera module. Some of the lands 841 are used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 8

In this embodiment, an example of an electronic device in which an imaging device of one embodiment of the present invention can be used will be described.

An example of an electronic device in which the imaging device of one embodiment of the present invention can be used is as follows: display devices such as televisions and monitors, lighting devices, desktop personal computers and notebook personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by electric motors using power are also included in the category of electronic appliances. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 50A:
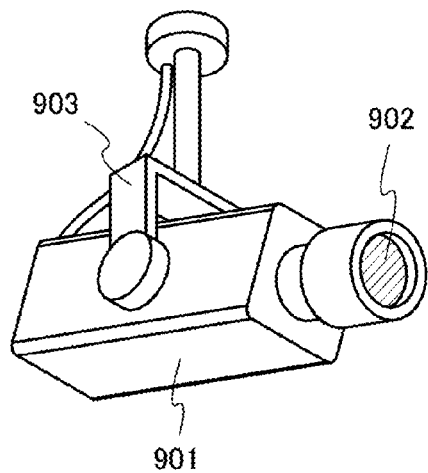
FIGS. 50A to 50E each illustrate an electronic device.

FIG. 50A illustrates a monitoring device including a housing 901, a lens 902, a support 903, and the like. The imaging device of one embodiment of the present invention can be included in the focus of the lens 902.

Figure 50B:
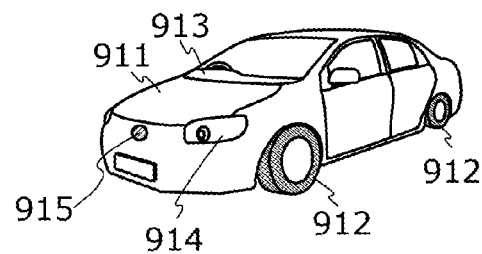

FIG. 50B illustrates a car including a car body 911, wheels 912, a dashboard 913, lights 914, a sensor 915, and the like. The sensor 915 serves as, for example, a sensor for avoiding collision that is configured to brake the car automatically when another car approaches the car from ahead. The imaging device of one embodiment of the present invention can be used for the sensor 915.

Figure 50C:
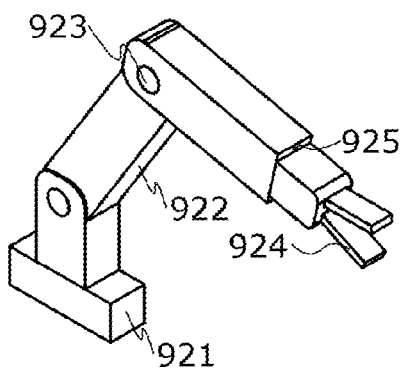

FIG. 50C illustrates a robot arm including a base 921, an arm 922, a joint 923, an arm end 924, a sensor 925, and the like. The sensor 925 senses the position or shape of an object, and the arm end 924 grasps and carries the object. The imaging device of one embodiment of the present invention can be used for the sensor 925.

Figure 50D:
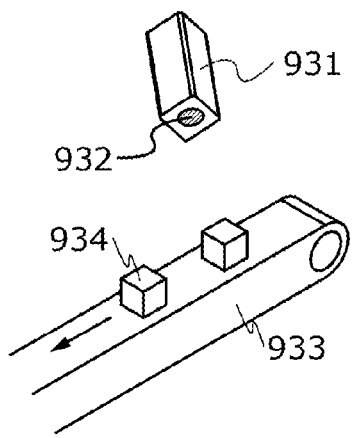

FIG. 50D illustrates an inspection apparatus including a housing 931, a sensor 932, and the like. The inspection apparatus is configured to detect a fault in a product 934 on a conveyor belt 933, for example. The imaging device of one embodiment of the present invention can be used for the sensor 932.

Figure 50E:
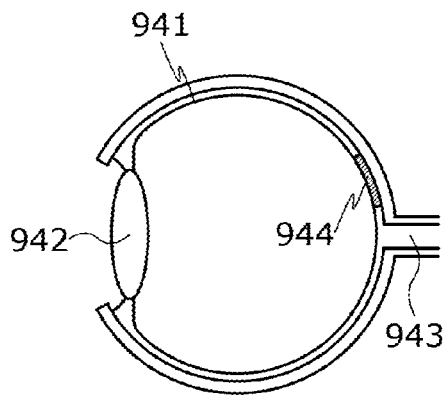

FIG. 50E illustrates an eyeball including a retina 941, a lens 942, an optic nerve 943, and the like. A sensor 944 is embedded in the retina 941 and can serve as the retina 941 when the retina 941 loses a function of converting visual information into an electrical signal, which leads to recovery in vision. The imaging device of one embodiment of the present invention can be used for the sensor 944.

Note that the examples are not limited to the above-described electronic devices as long as the imaging device of one embodiment of the present invention is included.

This embodiment can be combined with any of the other embodiments in this specification as appropriate.

Embodiment 9

Described below is the composition of a cloud aligned complementary oxide semiconductor (CAC-OS) applicable to one embodiment of the present invention.

The CAC refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

For example, of an In—Ga—Zn oxide (hereinafter also referred to as IGZO), CAC-IGZO has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-IGZO is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC relates to the material composition. In a CAC material including In, Ga, Zn, and O, regions where nanoparticles including Ga as a main component are partly observed and regions where nanoparticles including In as a main component are partly observed are randomly dispersed to form a mosaic pattern. Therefore, the crystal structure is a secondary element for the CAC composition.

Note that in the CAC composition, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

Next, measurement results of an oxide semiconductor over a substrate by a variety of methods are described.

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 51:
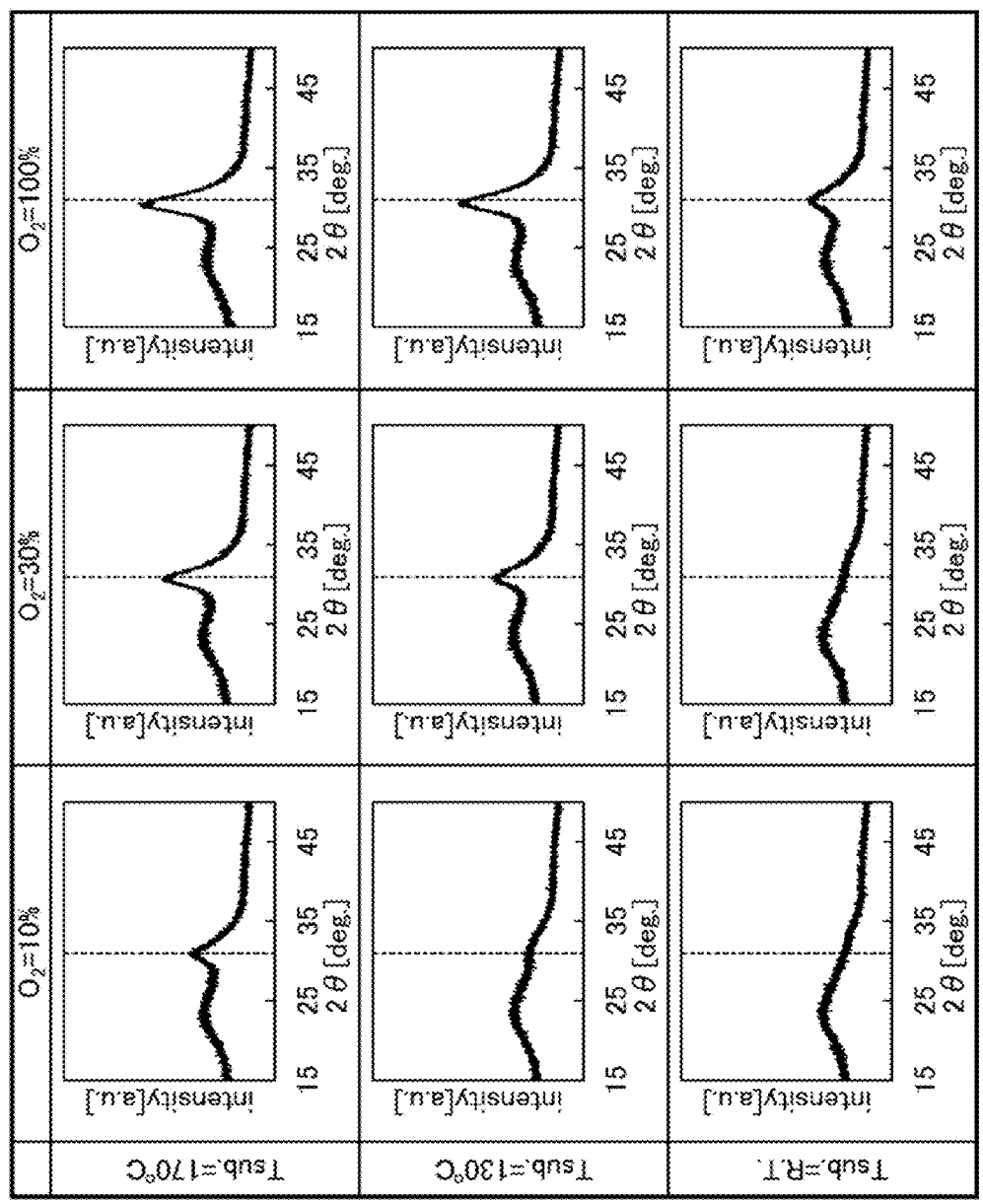
FIG. 51 shows measured XRD spectra of samples.

FIG. 51 shows XRD spectra measured by an out-of-plane method. In FIG. 51, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 51, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 51, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

Figure 52A:
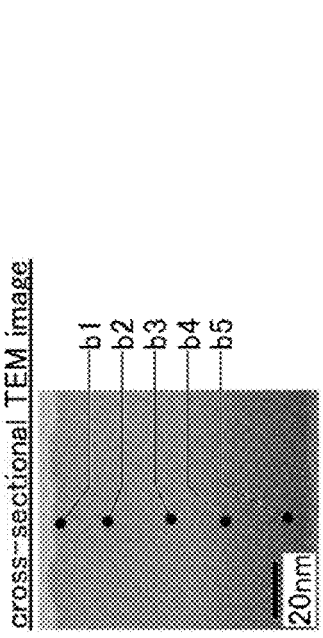
FIGS. 52A and 52B are TEM images of samples and FIGS. 52C to 52L are electron diffraction patterns thereof.
Figure 52B:
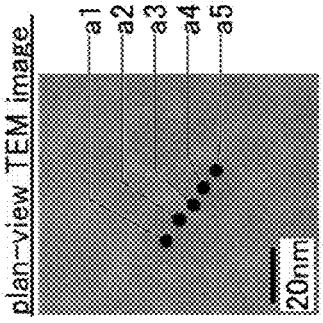
Figure 52C:
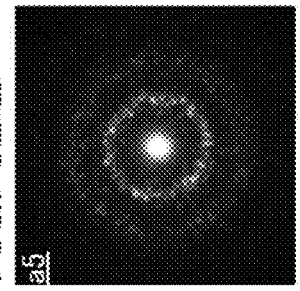
Figure 52D:
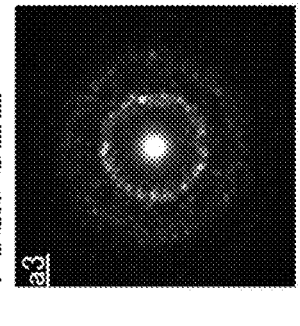
Figure 52E:
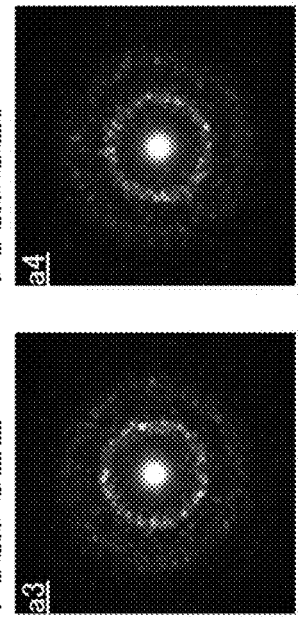
Figure 52F:
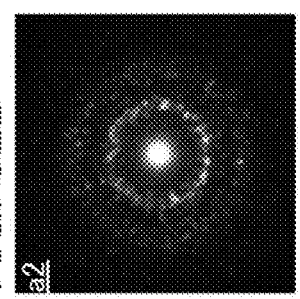
Figure 52G:
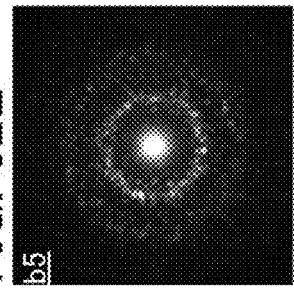
Figure 52H:
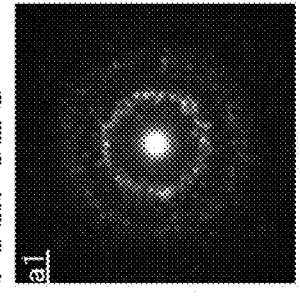
Figure 52I:
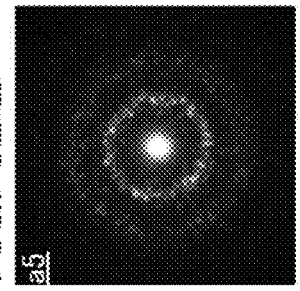
Figure 52J:
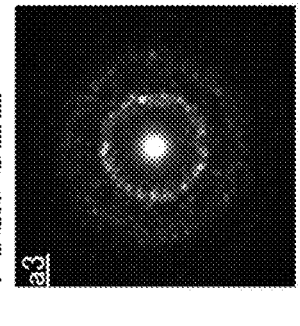
Figure 52K:
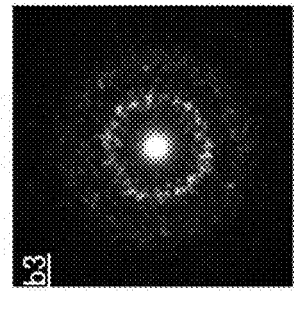
Figure 52L:
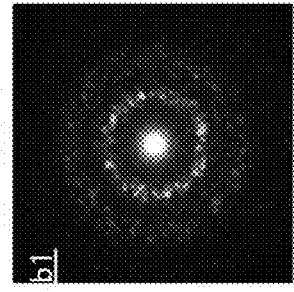

FIG. 52A is a plan-view TEM image of the sample formed at a substrate temperature of R.T. and with an oxygen gas flow rate ratio of 10%. FIG. 52B is a cross-sectional TEM image of the sample formed at a substrate temperature of R.T. and with an oxygen gas flow rate ratio of 10%.

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 52A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 52C, 52D, 52E, 52F, and 52G show the results of the points indicated by the black dots a1, a2, a3, a4, and a5, respectively.

In FIGS. 52C, 52D, 52E, 52F, and 52G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 52B of the sample formed at a substrate temperature of R.T. and an oxygen gas flow rate ratio of 10% are observed. FIGS. 52H, 52I, 52J, 52K, and 52L show the results of the points indicated by the black dots b1, b2, b3, b4, and b5, respectively.

In FIGS. 52H, 52I, 52J, 52K, and 52L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 53A:
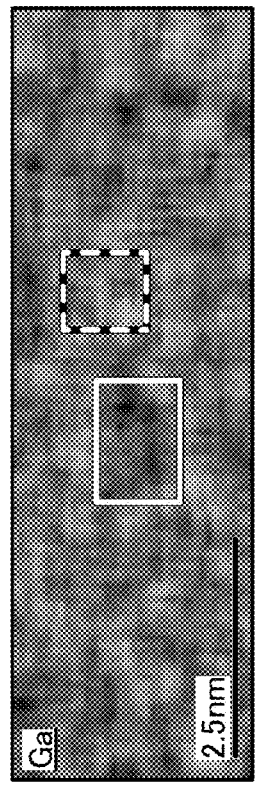
FIGS. 53A to 53C show EDX mapping images of a sample.
Figure 53B:
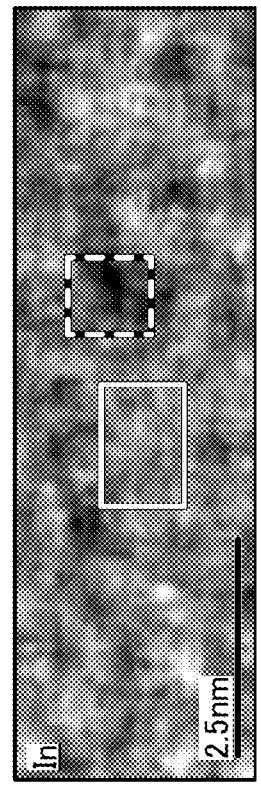
Figure 53C:
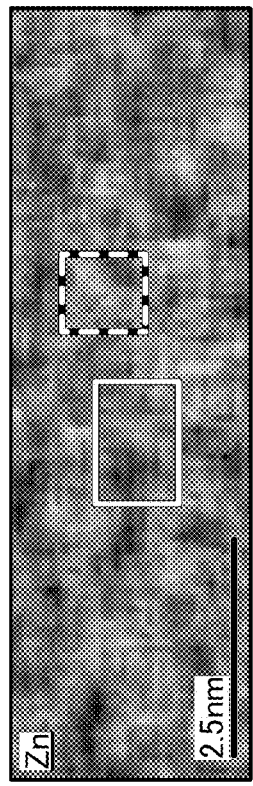

FIGS. 53A to 53C show EDX mapping images in a cross section of the sample formed at a substrate temperature of R.T. and with an oxygen gas flow rate ratio of 10%. FIG. 53A shows an EDX mapping image of Ga atoms. The proportion of the Ga atoms in all the atoms is 1.18 atomic % to 18.64 atomic %. FIG. 53B shows an EDX mapping image of In atoms. The proportion of the In atoms in all the atoms is 9.28 atomic % to 33.74 atomic %. FIG. 53C shows an EDX mapping image of Zn atoms. The proportion of the Zn atoms in all the atoms is 6.69 atomic % to 24.99 atomic %. FIGS. 53A to 53C show the same region in the cross section of the sample formed at a substrate temperature of R.T. and with an oxygen flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 53A to 53C is 7200000 times.

The EDX mapping images in FIGS. 53A to 53C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 53A to 53C are examined.

In FIG. 53A, a relatively dark region occupies a large area in the area surrounded by the solid line, while a relatively bright region occupies a large area in the area surrounded by the dashed line. In FIG. 53B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 53C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 53C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 53A to 53C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ as a main component and the regions including $In_{X2}Zn_{Y2}O_{Z2}$ or $InO_{X1}$ as a main component are unevenly distributed and mixed can be referred to as CAC-IGZO.

The crystal structure of CAC-IGZO includes an nc structure. In an electron diffraction pattern of the CAC-IGZO with the nc structure, several or more bright spots appear in addition to bright sports derived from IGZO including a single crystal, a polycrystal, or a CAAC. Alternatively, in addition to the several or more bright spots, the crystal structure is defined as having high luminance regions appearing in a ring pattern.

As shown in FIGS. 53A to 53C, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, CAC-IGZO has a structure different from that of an IGZO compound in which metal elements are evenly distributed, and has characteristics different from those of the IGZO compound. That is, in CAC-IGZO, regions including $GaO_{X3}$ or the like as a main component and regions including $In_{X2}Zn_{Y2}O_{Z2}$ or $InO_{X1}$ as a main component are separated to form a mosaic pattern. Accordingly, when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including CAC-IGZO has high reliability. Thus, CAC-IGZO is suitably used in a variety of semiconductor devices typified by a display.

At least part of this embodiment can be implemented in combination with any of the other embodiments and the other examples described in this specification as appropriate.

This application is based on Japanese Patent Application serial no. 2015-125807 filed with Japan Patent Office on Jun. 23, 2015, and Japanese Patent Application serial no. 2016-101319 filed with Japan Patent Office on May 20, 2016, the entire contents of which are hereby incorporated by reference.

What is claimed is:

1. An imaging device comprising:
   a pixel; and
   a first circuit,
   the pixel comprising:
      a first photoelectric conversion element;
      a second photoelectric conversion element;
      a first transistor;
      a second transistor;
      a third transistor;
      a fourth transistor;
      a fifth transistor;
      a sixth transistor; and
      a first capacitor,
   wherein one terminal of the first photoelectric conversion element is electrically connected to one of a source and a drain of the first transistor,
   wherein one terminal of the second photoelectric conversion element is electrically connected to one of a source and a drain of the second transistor,
   wherein the other of the source and the drain of the first transistor is electrically connected to the other of the source and the drain of the second transistor,
   wherein the other of the source and the drain of the second transistor is electrically connected to one of a source and a drain of the third transistor,
   wherein the one of the source and the drain of the third transistor is electrically connected to one terminal of the first capacitor,
   wherein the other terminal of the first capacitor is electrically connected to one of a source and a drain of the fourth transistor,
   wherein the one of the source and the drain of the fourth transistor is electrically connected to a gate of the fifth transistor,
   wherein one of a source and a drain of the fifth transistor is electrically connected to one of a source and a drain of the sixth transistor, and
   wherein the first circuit is configured to compare a first signal which is output from the pixel on the basis of imaging data obtained by the first photoelectric conversion element to a second signal which is output from the pixel on the basis of imaging data obtained by the second photoelectric conversion element for determining whether there is a difference between the first signal and the second signal.

2. The imaging device according to claim 1,
   wherein the pixel includes a second capacitor, and
   wherein one terminal of the second capacitor is electrically connected to the one of the source and the drain of the fourth transistor.

3. The imaging device according to claim 1,
   wherein each of the first to fourth transistors comprises an active layer including an oxide semiconductor, and
   wherein the oxide semiconductor includes In, Zn, and M where M is Al, Ti, Ga, Sn, Y, Zr, La, Ce, Nd, or Hf.

4. The imaging device according to claim 1, wherein each of the first photoelectric conversion element and the second photoelectric conversion element includes a material containing selenium.

5. The imaging device according to claim 1,
   wherein the first circuit includes a first comparator and a second comparator,
   wherein a first potential corresponding to the difference is configured to be applied to one input terminal of the first comparator, wherein a second potential which is a reference potential is configured to be applied to the other input terminal of the first comparator, wherein if the first potential is higher than the second potential, a high potential is configured to be output from an output terminal of the first comparator, wherein the first potential is configured to be applied to one input terminal of the second comparator, wherein a third potential which is a reference potential is configured to be applied to the other input terminal of the second comparator, wherein if the first potential is lower than the third potential, a high potential is configured to be output from an output terminal of the second comparator, and wherein the first circuit is configured to determine that there is a difference when at least one of the first comparator and the second comparator outputs a high potential.

6. The imaging device according to claim 5, wherein the one input terminal of the first comparator and the one input terminal of the second comparator are electrically connected to the other of the source and the drain of the fifth transistor through a wiring.

7. An electronic device comprising the imaging device according to claim 1.

8. An imaging device comprising:
a pixel; and
a first circuit,
the pixel comprising:
  a first photoelectric conversion element;
  a second photoelectric conversion element;
  a first transistor;
  a second transistor;
  a third transistor;
  a fourth transistor;
  a fifth transistor;
  a sixth transistor; and
  a first capacitor,
wherein one terminal of the first photoelectric conversion element is electrically connected to one of a source and a drain of the first transistor, wherein one terminal of the second photoelectric conversion element is electrically connected to one of a source and a drain of the second transistor, wherein the other of the source and the drain of the first transistor is electrically connected to the other of the source and the drain of the second transistor, wherein the other of the source and the drain of the second transistor is electrically connected to one of a source and a drain of the third transistor, wherein the one of the source and the drain of the third transistor is electrically connected to one terminal of the first capacitor, wherein the other terminal of the first capacitor is electrically connected to one of a source and a drain of the fourth transistor, wherein the one of the source and the drain of the fourth transistor is electrically connected to a gate of the fifth transistor, wherein one of a source and a drain of the fifth transistor is electrically connected to one of a source and a drain of the sixth transistor, wherein the first circuit includes a first comparator and a second comparator, wherein the other of the source and the drain of the fifth transistor is electrically connected to one input terminal of the first comparator, and wherein the other of the source and the drain of the fifth transistor is electrically connected to one input terminal of the second comparator.

9. The imaging device according to claim 8,
wherein the pixel includes a second capacitor, and
wherein one terminal of the second capacitor is electrically connected to the one of the source and the drain of the fourth transistor.

10. The imaging device according to claim 8,
wherein each of the first to fourth transistors comprises an active layer including an oxide semiconductor, and
wherein the oxide semiconductor includes In, Zn, and M where M is Al, Ti, Ga, Sn, Y, Zr, La, Ce, Nd, or Hf.

11. The imaging device according to claim 8, wherein each of the first photoelectric conversion element and the second photoelectric conversion element includes a material containing selenium.

12. The imaging device according to claim 8,
wherein a potential which is a reference potential is configured to be applied to the other input terminal of the first comparator, and
wherein a potential which is a reference potential is configured to be applied to the other input terminal of the second comparator.

13. The imaging device according to claim 8,
wherein the first circuit is configured to determine that there is a difference when at least one of the first comparator and the second comparator outputs a high potential.

14. An electronic device comprising the imaging device according to claim 8.

* * * * *